US012684782B2

(12) United States Patent
Lee et al.

(10) Patent No.: US 12,684,782 B2
(45) Date of Patent: Jul. 14, 2026

(54) SEMICONDUCTOR MEMORY DEVICE

(71) Applicant: SAMSUNG ELECTRONICS CO., LTD., Suwon-si (KR)

(72) Inventors: Kiseok Lee, Suwon-si (KR); Keunnam Kim, Suwon-si (KR); Yongseok Kim, Suwon-si (KR); Hyuncheol Kim, Suwon-si (KR); Kyunghwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 462 days.

(21) Appl. No.: 18/303,854

(22) Filed: Apr. 20, 2023

(65) Prior Publication Data

US 2023/0397430 A1 Dec. 7, 2023

(30) Foreign Application Priority Data

Jun. 3, 2022 (KR) ........................ 10-2022-0068422

(51) Int. Cl.
*H10B 51/30* (2023.01)
*H10B 51/20* (2023.01)

(52) U.S. Cl.
CPC ............. *H10B 51/30* (2023.02); *H10B 51/20* (2023.02)

(58) Field of Classification Search
None
See application file for complete search history.

(56) References Cited

U.S. PATENT DOCUMENTS

| 10,535,659 | B2 | 1/2020 | Kim et al. | |
| 11,805,652 | B2 | 10/2023 | Wang et al. | |
| 2013/0163304 | A1 | 6/2013 | Kim | |
| 2017/0062470 | A1* | 3/2017 | Han | H10B 43/10 |
| 2019/0363098 | A1* | 11/2019 | Lung | G11C 13/0026 |
| 2021/0126013 | A1* | 4/2021 | Lai | H10D 30/025 |
| 2021/0159229 | A1 | 5/2021 | Gomes et al. | |
| 2022/0085070 | A1 | 3/2022 | Yin et al. | |
| 2022/0123003 | A1 | 4/2022 | Young et al. | |
| 2023/0371267 | A1 | 11/2023 | Lu et al. | |

FOREIGN PATENT DOCUMENTS

| CN | 110047844 | 7/2019 |
| TW | 202145454 | 12/2021 |
| TW | 202145505 | 12/2021 |
| TW | 202145623 | 12/2021 |

* cited by examiner

*Primary Examiner* — Alexander G Ghyka
(74) *Attorney, Agent, or Firm* — Morgan, Lewis & Bockius LLP

(57) ABSTRACT

A semiconductor memory device includes a first channel pattern and a second channel pattern stacked on a substrate, a word line disposed between the first and second channel patterns and that extends in a first direction parallel to a top surface of the substrate, a data storage pattern disposed between a top surface of the word line and the first channel pattern and between a bottom surface of the word line and the second channel pattern, a bit line that extends in a second direction perpendicular to the top surface of the substrate and that is connected to first end portions of the first and second channel patterns, and a source line that extends in the second direction and is connected to second end portions of the first and second channel patterns.

20 Claims, 102 Drawing Sheets

FIG. 7B

SEMICONDUCTOR MEMORY DEVICE

CROSS-REFERENCE TO RELATED APPLICATIONS

This U.S. non-provisional patent application claims priority under 35 U.S.C. § 119 from Korean Patent Application No. 10-2022-0068422, filed on Jun. 3, 2022 in the Korean Intellectual Property Office, the contents of which are herein incorporated by reference in their entirety.

TECHNICAL FIELD

Embodiments of the present disclosure are directed to a semiconductor memory device, and in particular, to a semiconductor memory device with an increased integration density.

DISCUSSION OF THE RELATED ART

Higher integration of semiconductor devices helps satisfy consumer demands for superior performance and inexpensive prices. In the case of semiconductor devices, since their integration helps determine product prices, increased integration is needed. In the case of two-dimensional or planar semiconductor devices, since their integration is mainly determined by the area occupied by a unit memory cell, integration is influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices that include three-dimensionally arranged memory cells have recently been proposed.

SUMMARY

An embodiment of the inventive concept provides a semiconductor memory device with an increased integration density.

According to an embodiment of the inventive concept, a semiconductor memory device includes a first channel pattern and a second channel pattern stacked on a substrate, a word line disposed between the first and second channel patterns and that extends in a first direction parallel to a top surface of the substrate, a data storage pattern disposed between a top surface of the word line and the first channel pattern and between a bottom surface of the word line and the second channel pattern, a bit line that extends in a second direction perpendicular to the top surface of the substrate and that is connected to first end portions of the first and second channel patterns, and a source line that extends in the second direction and is connected to second end portions of the first and second channel patterns.

According to an embodiment of the inventive concept, a semiconductor memory device includes electrode structures that extend in a first direction parallel to a top surface of a substrate and that are spaced apart from each other in a second direction that crosses the first direction, where each of the electrode structures includes word lines that are vertically stacked on the substrate, interlayer insulating patterns that are spaced apart from each other in the first direction and that are disposed in regions between vertically-adjacent word lines, first channel patterns that are respectively disposed between the interlayer insulating patterns and top surfaces of the word lines, second channel patterns that are respectively disposed between the interlayer insulating patterns and bottom surfaces of the word lines, data storage patterns disposed between the first and second channel patterns and the word lines, bit lines disposed at a first side of each of the electrode structures and that are spaced apart from each other in the first direction, where each bit line is connected to first end portions of the first and second channel patterns, and source lines disposed at a second side of each of the electrode structures and that are spaced apart from each other in the first direction, where each source line is connected to second end portions of the first and second channel patterns.

According to an embodiment of the inventive concept, a semiconductor memory device includes a substrate that includes a first region and a second region, first and second channel patterns that are vertically and alternately stacked on the first region of the substrate, where the first channel patterns are spaced apart from each other in a first direction parallel to a top surface of the substrate and the second channel patterns are spaced apart from each other in the first direction, word lines that are respectively disposed between adjacent first and second channel patterns and that extend in the first direction, data storage patterns disposed between the word lines and bottom surfaces of the first channel patterns and between the word lines and top surfaces of the second channel patterns, first vertical insulating pillars that are spaced apart from the first and second channel patterns in the first direction and that penetrate each of the word lines, bit lines that are spaced apart from each other in the first direction and that are connected to first end portions of the first and second channel patterns, source lines that are spaced apart from each other in the first direction and that are connected to second end portions of the first and second channel patterns, and second vertical insulating pillars disposed at each side of the word lines, where the second vertical insulating pillars are spaced apart from each other in the first direction and extend in the second direction. Each of the word lines includes a pad portion in the second region, and the pad portions of the word lines are stacked and form a staircase structure in the second region.

BRIEF DESCRIPTION OF THE DRAWINGS

FIGS. 7B, 7C, 7D, 7E, and 7F are sectional views taken along lines A-A', B-B', C-C', D-D', E-E', and F-F' of FIG. 7A, respectively, of a semiconductor memory device according to an embodiment of the inventive concept.

FIGS. 13A to 27A are plan views that illustrate a method of fabricating a semiconductor memory device, according to an embodiment of the inventive concept.

FIGS. 13B to 27B are sectional views taken along lines A-A' of FIGS. 13A to 27A, respectively.

FIGS. 13C to 27C are sectional views taken along lines B-B' of FIGS. 13A to 27A, respectively.

FIGS. 13D to 24D are sectional views taken along lines C-C' of FIGS. 13A to 27A, respectively.

FIGS. 13E to 24E are sectional views taken along lines D-D' of FIGS. 13A to 27A, respectively.

DETAILED DESCRIPTION

Embodiments of the inventive concepts will now be described more fully with reference to the accompanying drawings, in which exemplary embodiments are shown.

Figure 1:
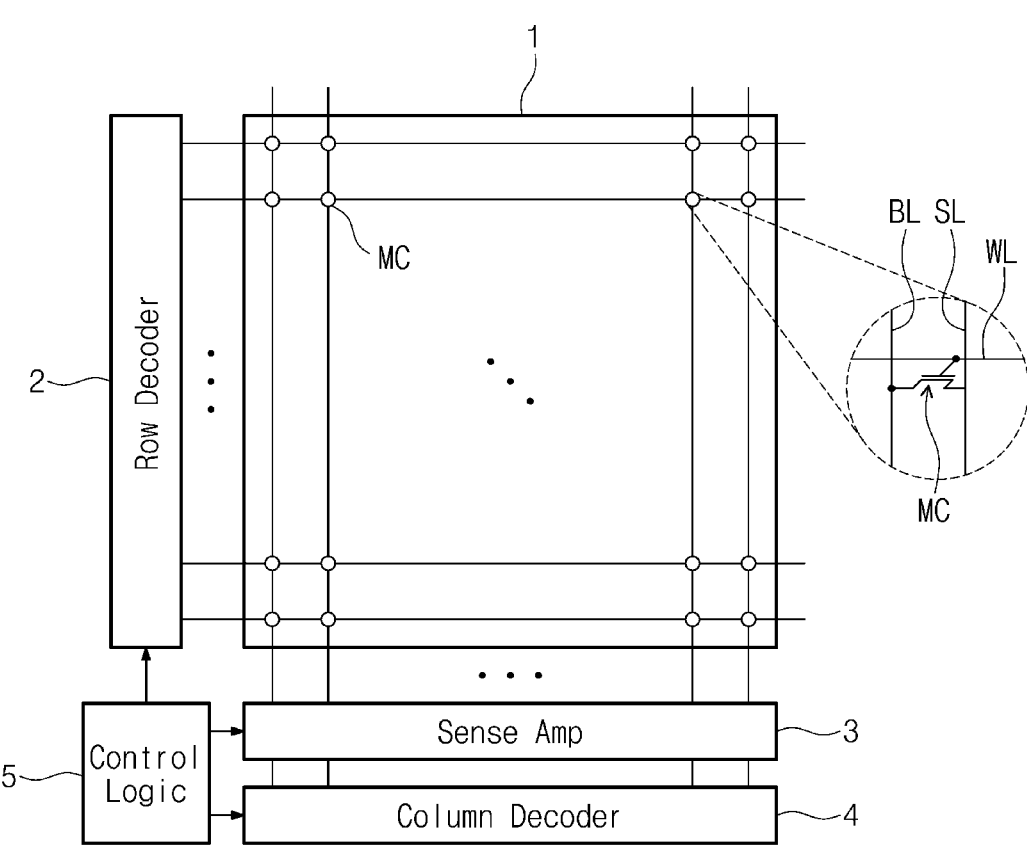
FIG. 1 is a block diagram of a semiconductor memory device according to an embodiment of the inventive concept.

FIG. 1 is a block diagram od a semiconductor memory device according to an embodiment of the inventive concept.

Referring to FIG. 1, in an embodiment, a semiconductor memory device includes a memory cell array 1, a row decoder 2, a sensing amplifier 3, a column decoder 4, and a control logic 5.

The memory cell array 1 includes word lines WL, bit lines BL, source lines SL, and memory cells MC. The memory cells MC are three-dimensionally arranged, and each memory cell MC is connected to one of the word lines WL, one of the bit lines BL, and one of the source lines SL. In an embodiment, each of the memory cells MC includes one transistor that includes a memory layer or a data storing layer.

The row decoder 2 decodes address information that is received from the outside, and selects one of the word lines WL of the memory cell array 1 based on the decoded address information. The address information decoded by the row decoder 2 is provided to a row driver, and the row driver provides respective voltages to the selected word line WL and the unselected word lines WL, in response to a control circuit.

The sensing amplifier 3 senses, amplifies, and outputs a difference in voltage between the bit lines BL that has been selected based on address information decoded by the column decoder 4 and a reference bit line.

The column decoder 4 provides a data transmission path between the sensing amplifier 3 and an external device, such as a memory controller. The column decoder 4 decodes address information that is received from the outside, and selects one of the bit lines BL based on the decoded address information.

The control logic 5 generates control signals that control data-writing or data-reading operations on the memory cell array 1.

Figure 2A:
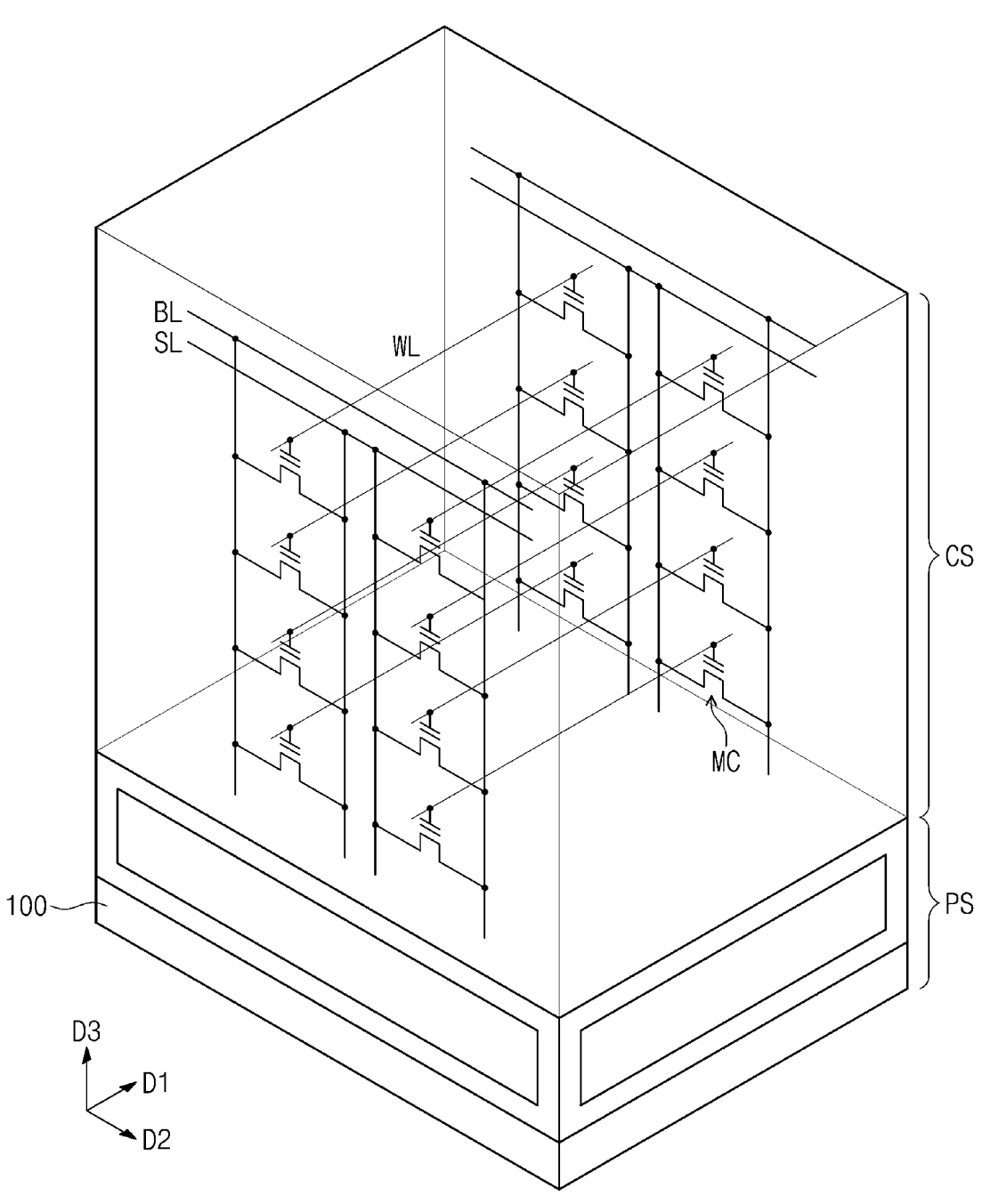
FIGS. 2A, 2B, and 2C are perspective views of a semiconductor memory device according to an embodiment of the inventive concept.
Figure 2B:
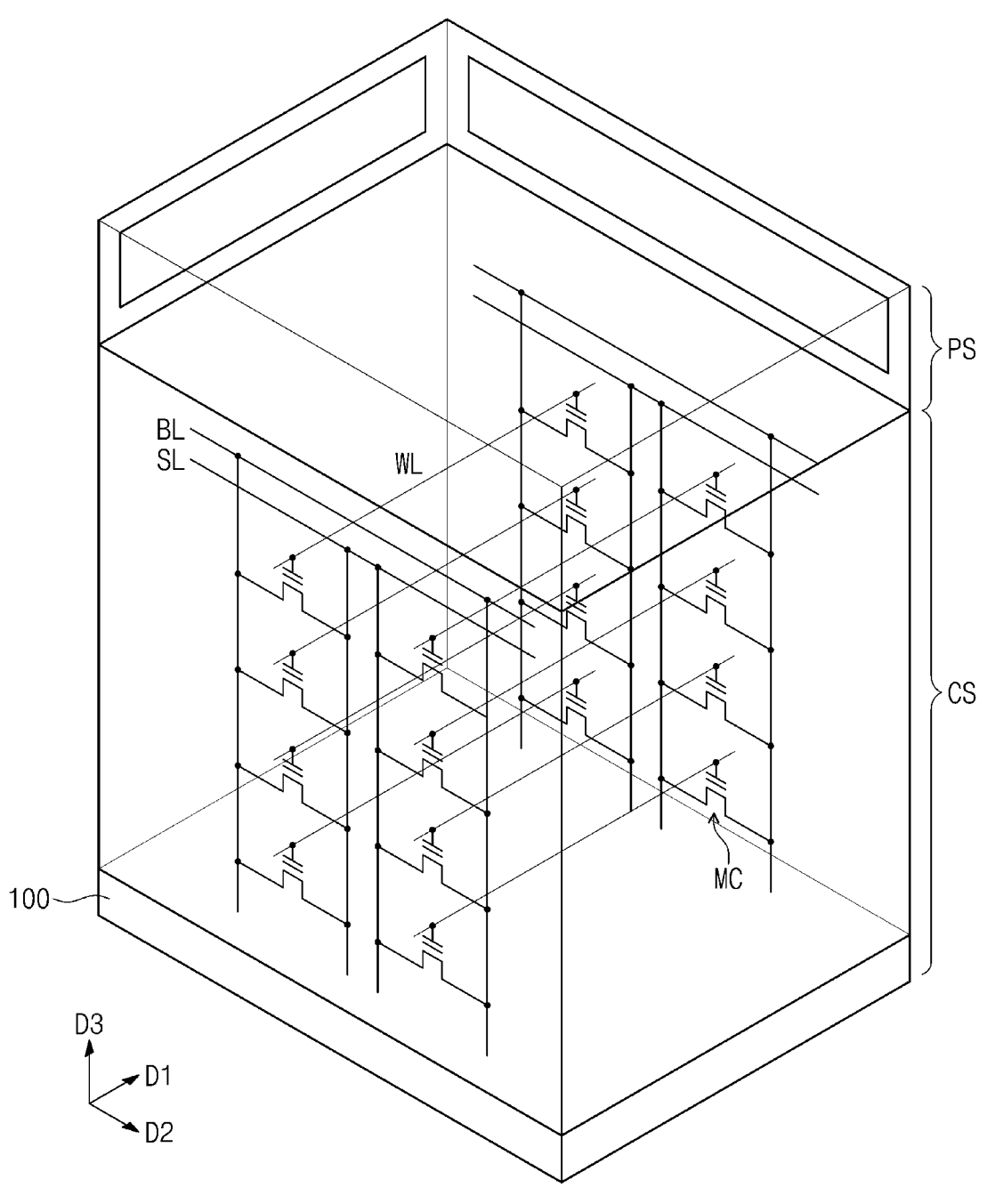
Figure 2C:
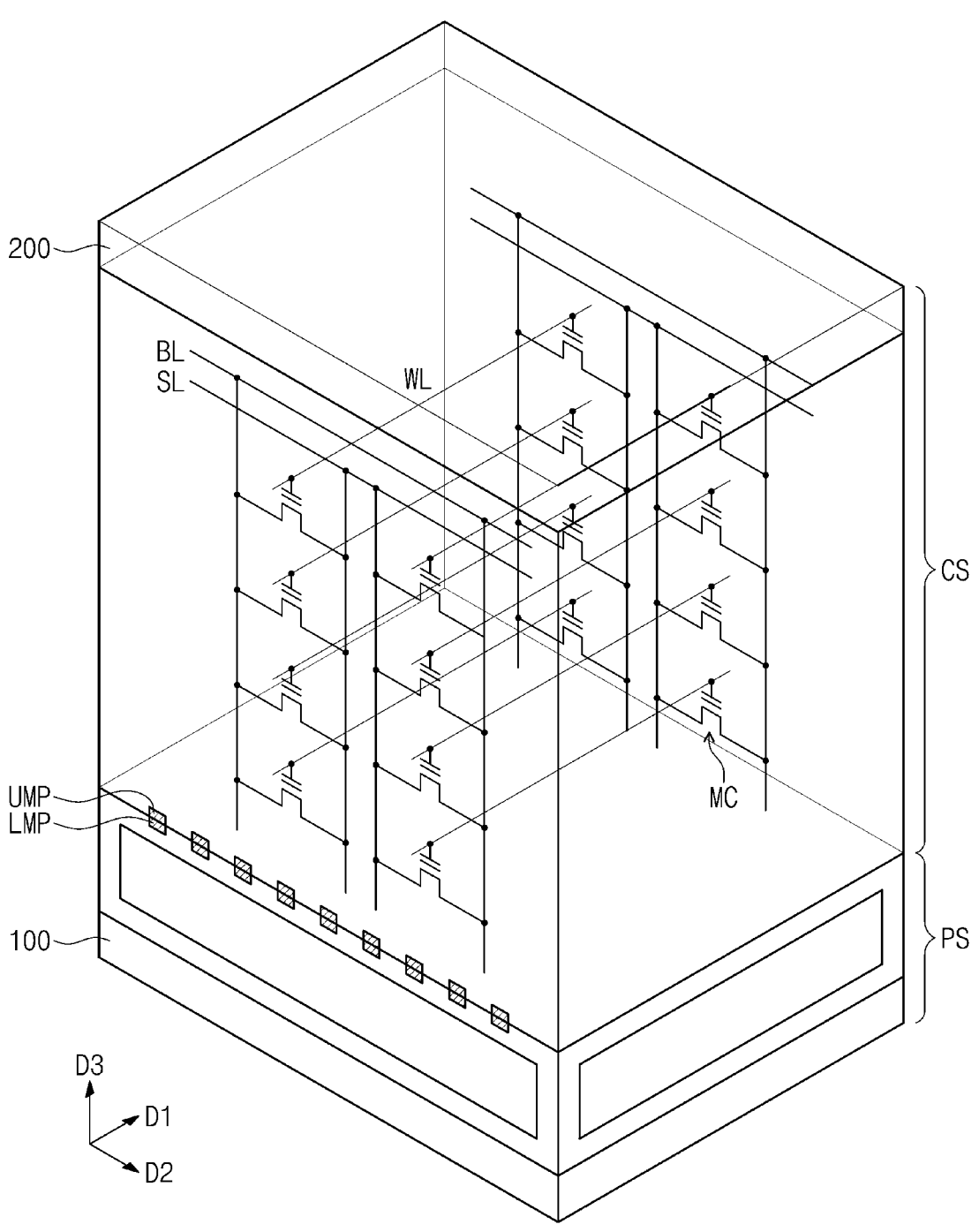

FIGS. 2A, 2B, and 2C are perspective views of a semiconductor memory device according to an embodiment of the inventive concept.

Referring to FIG. 2A, in an embodiment, a semiconductor memory device includes a semiconductor substrate 100, a peripheral circuit structure PS on the semiconductor substrate 100, and a cell array structure CS on the peripheral circuit structure PS.

The peripheral circuit structure PS includes core and peripheral circuits that are formed on the semiconductor substrate 100. The core and peripheral circuits include the row and column decoders 2 and 4, the sense amplifier 3, and the control logics 5 described with reference to FIG. 1. The peripheral circuit structure PS is interposed between the semiconductor substrate 100 and the cell array structure CS, when viewed in a first direction D1 or a second directions D2 that cross each other and are parallel to a top surface of the semiconductor substrate 100.

The cell array structure CS includes the bit lines BL, the source lines SL, the word lines WL, and the memory cells MC therebetween. The memory cells MC are arranged in first and second directions D1 and D2 and in a third direction D3 that is perpendicular to the top surface of the semiconductor substrate 100.

Each of the memory cells MC is connected to one word line WL, one bit line BL, and one source line SL. Each of the memory cells MC includes a ferroelectric field effect transistor (FeFET). For example, each of the memory cells MC includes a ferroelectric layer that is used as the memory layer. In each memory cell MC, the ferroelectric layer has a non-centrosymmetric charge distribution and therefore has a spontaneous dipole, such as a spontaneous polarization. Even when there is no external electric field, the ferroelectric layer has a remnant polarization caused by the dipole. In addition, a polarization direction of the ferroelectric layer can be switched by an external electric field.

For example, the ferroelectric layer may have a positive or negative polarization state, and the polarization direction of the ferroelectric layer can be changed by an electric field that is applied to the ferroelectric layer during a programming operation. Even when power is interrupted, the polarization state of the ferroelectric layer is maintained, and thus, the semiconductor memory device can be operated as a nonvolatile memory device.

Referring to FIG. 2B, in an embodiment, a semiconductor memory device includes the cell array structure CS on the semiconductor substrate 100 and the peripheral circuit structure PS on the cell array structure CS. For example, the cell array structure CS is disposed between the semiconductor substrate 100 and the peripheral circuit structure PS, in the third direction D3.

As described above, the cell array structure CS includes the bit lines BL, the source lines SL, the word lines WL, and the memory cells MC therebetween. As described above, each of the memory cells MC includes one transistor that includes a memory layer, and in an embodiment, a ferroelectric layer is the memory layer.

The peripheral circuit structure PS includes core and peripheral circuits formed on a semiconductor layer.

Referring to FIG. 2C, in an embodiment, a semiconductor memory device has a chip-to-chip (C2C) structure. In a C2C structure, an upper chip that includes the cell array structure CS is fabricated on a first semiconductor substrate 100, such as a first wafer, a lower chip that includes the peripheral circuit structure PS is fabricated on a second semiconductor substrate 200, such as a second wafer, that differs from the first semiconductor substrate 100, and then, the upper and lower chips are connected to each other through a bonding process. For example, the bonding process electrically connects a bonding metal pad that is formed in the lowermost metal layer of the upper chip to a bonding metal pad that is formed in the uppermost metal layer of the lower chip. For example, when the bonding metal pad is formed of copper (Cu), the bonding process is a Cu-to-Cu bonding process, but in an embodiment, the bonding metal pad is formed of or includes aluminum (Al) or tungsten (W).

The peripheral circuit structure PS is disposed on the first semiconductor substrate 100, and lower metal pads LMP are formed in the uppermost layer of the peripheral circuit structure PS. The lower metal pads LMP are electrically connected to the core and peripheral circuits shown in FIG. 1. The lower metal pads LMP are in direct contact with or bonded to upper metal pads UMP of the cell array structure CS.

The cell array structure CS is disposed on the second semiconductor substrate 200, and the upper metal pads UMP are formed in the lowermost layer of the cell array structure CS. The upper metal pads UMP are connected to the bit lines BL, the source lines SL, and the word lines WL. For example, the upper metal pads UMP are electrically connected to the memory cells MC.

Figure 3A:
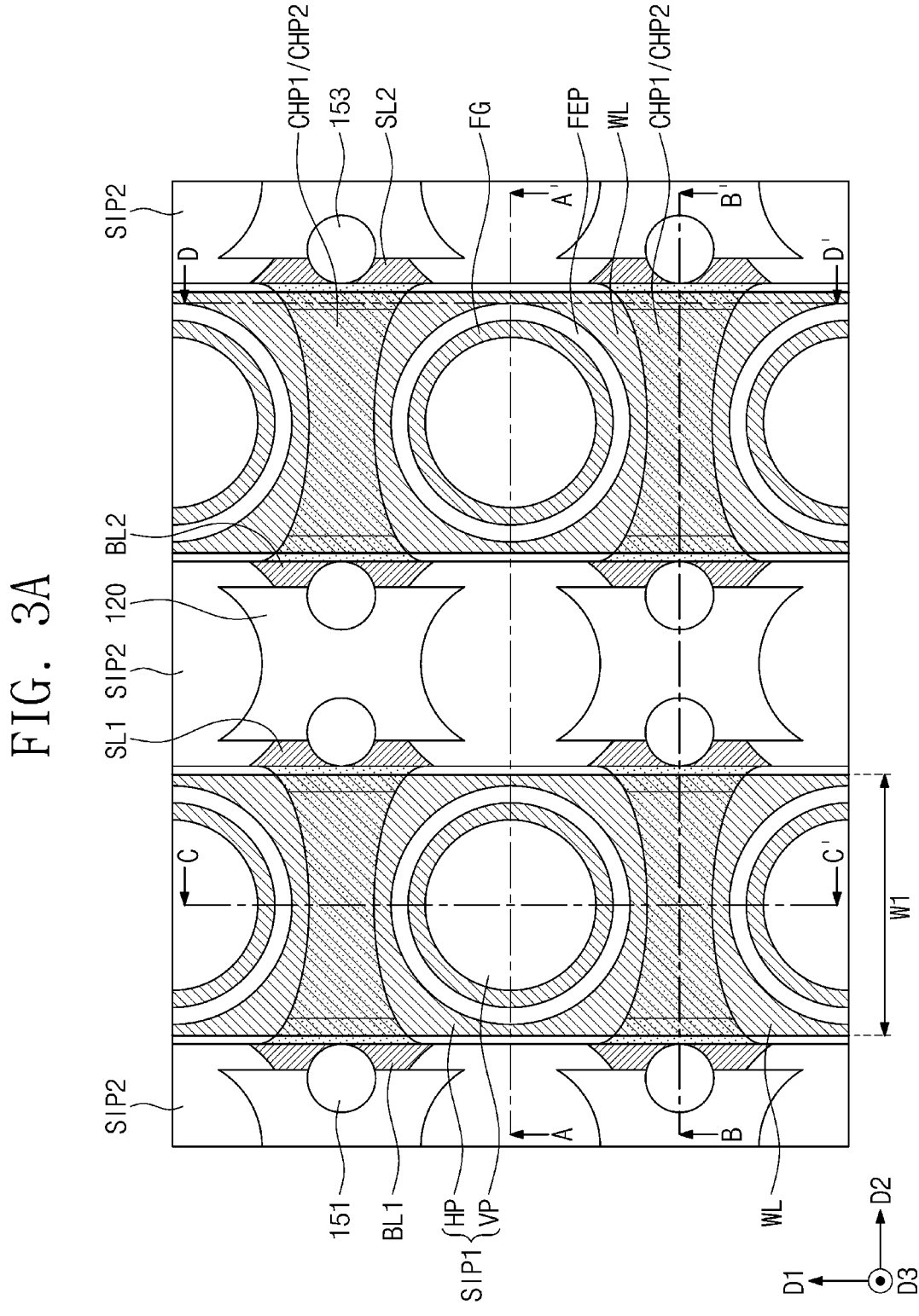
FIG. 3A is a plan view of a semiconductor memory device according to an embodiment of the inventive concept.
Figure 3B:
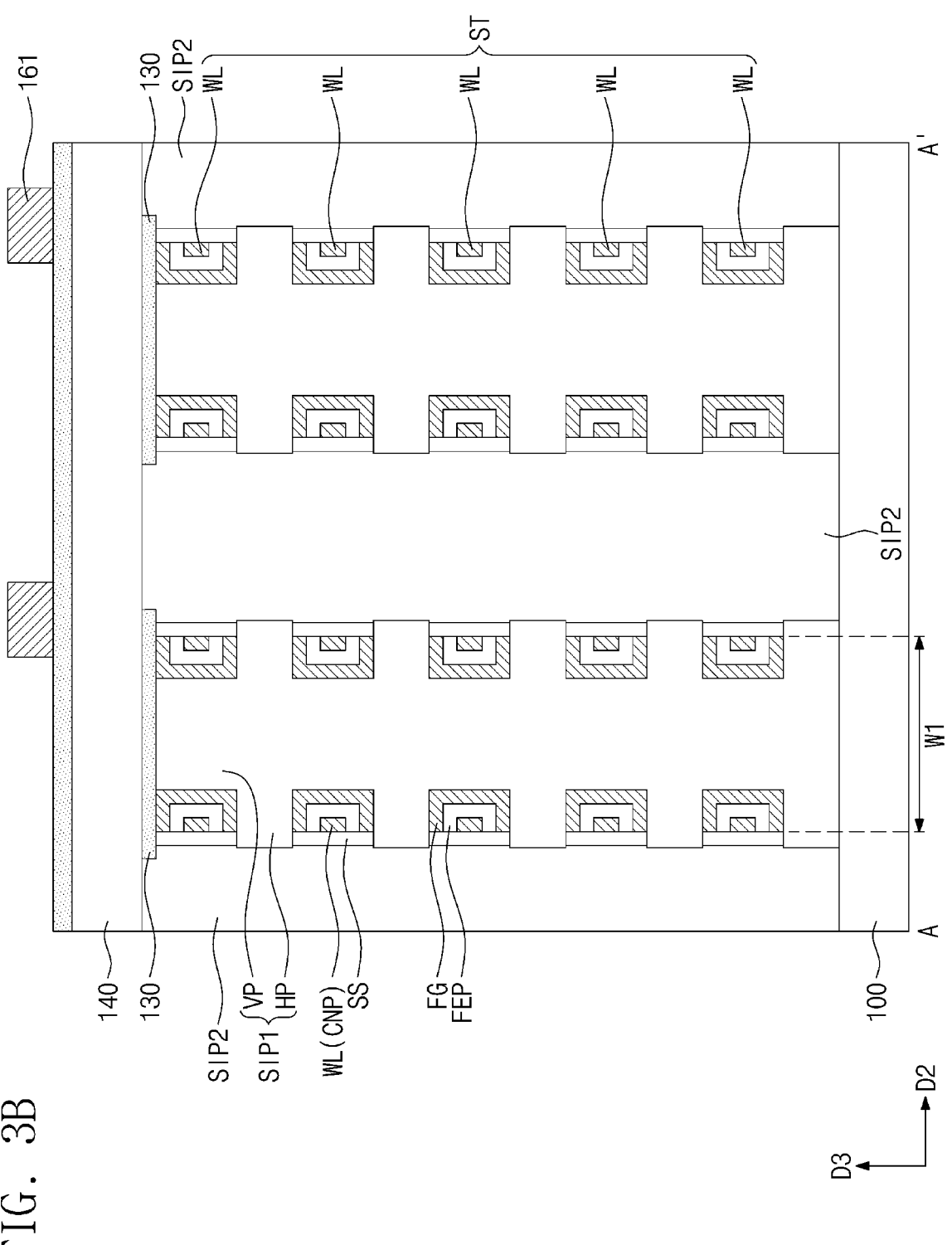
FIGS. 3B, 3C, 3D, and 3E are sectional views taken along lines A-A', B-B', C-C', and D-D', respectively, of FIG. 3A, of a semiconductor memory device according to an embodiment of the inventive concept.
Figure 3C:
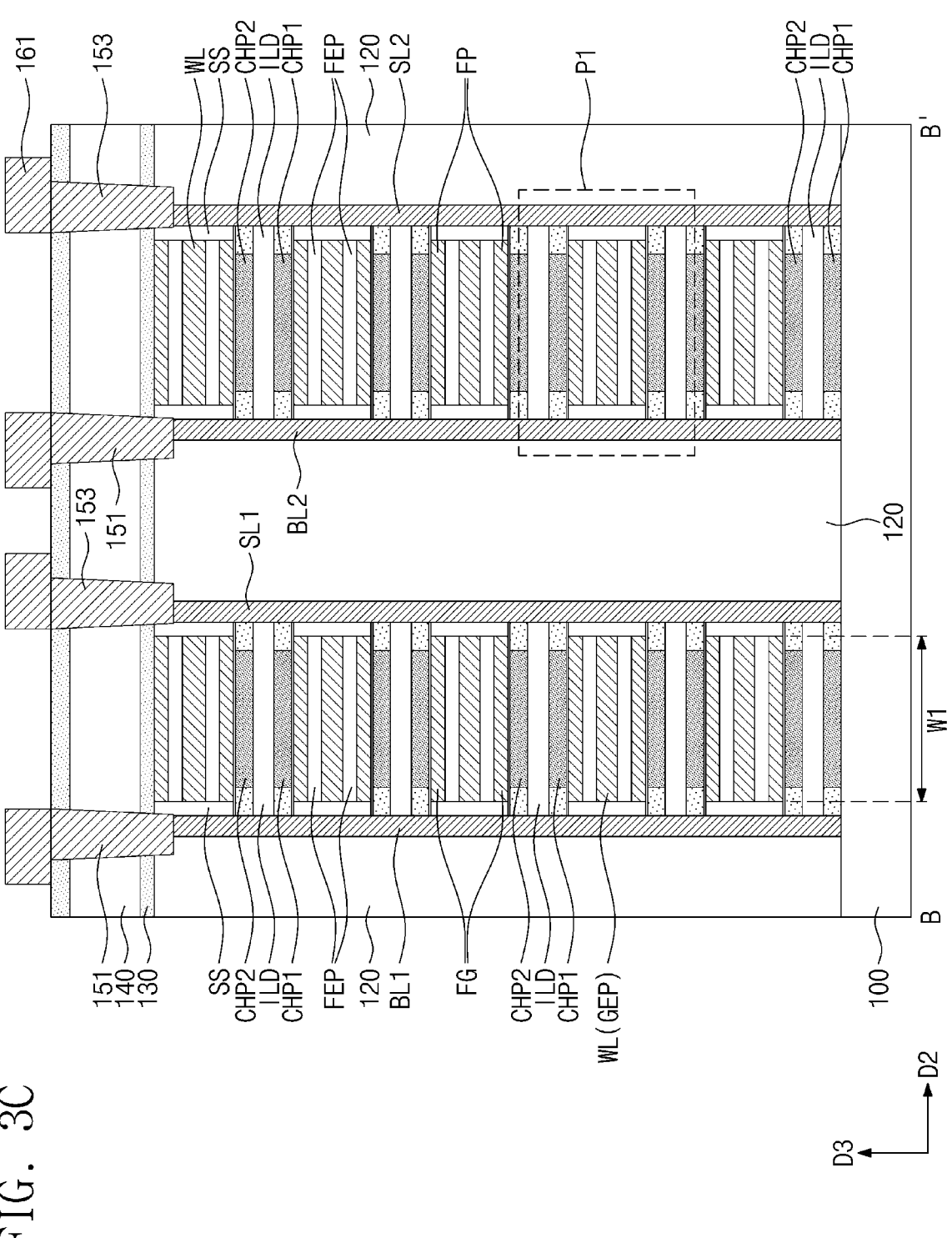
Figure 3D:
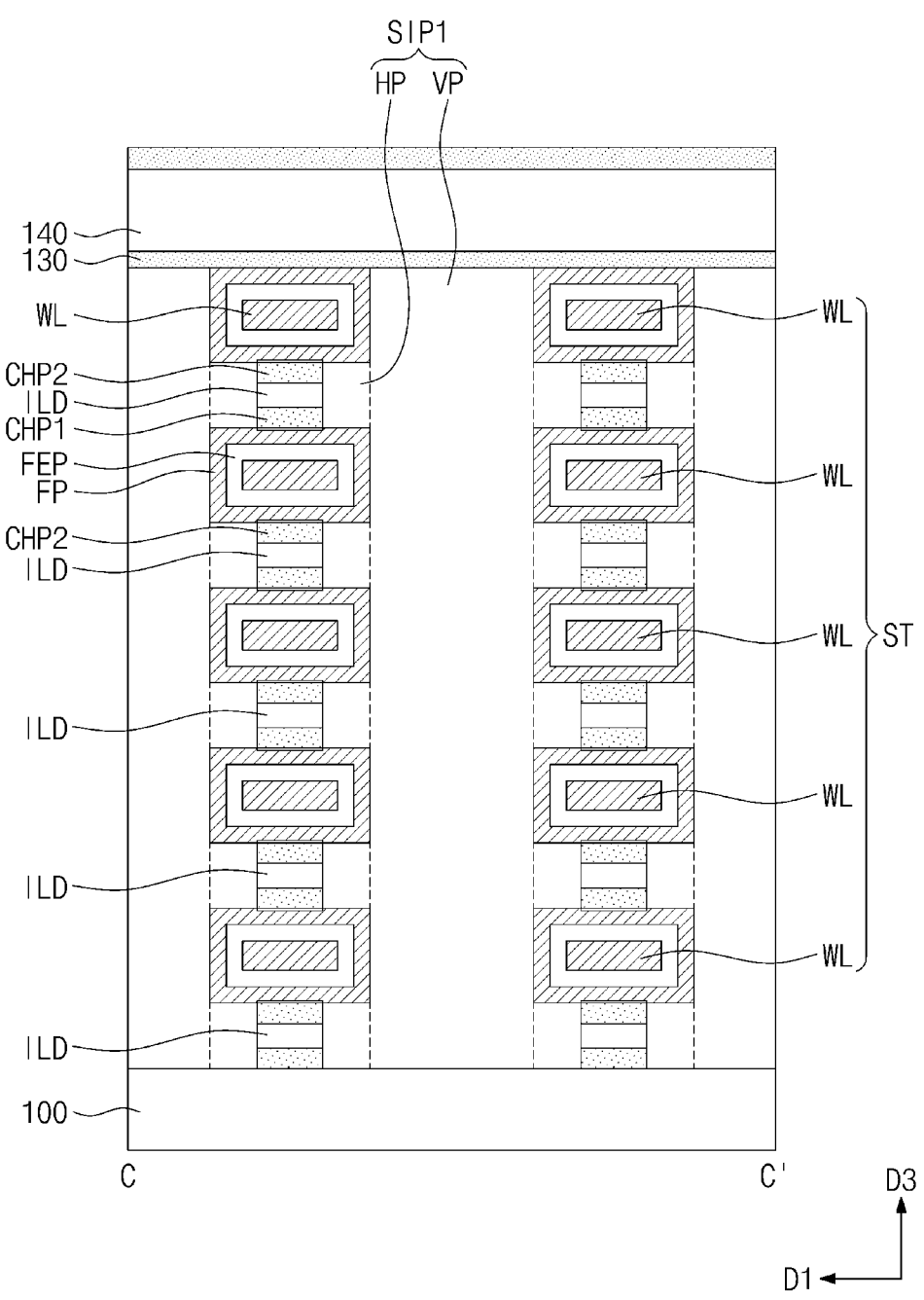
Figure 3E:
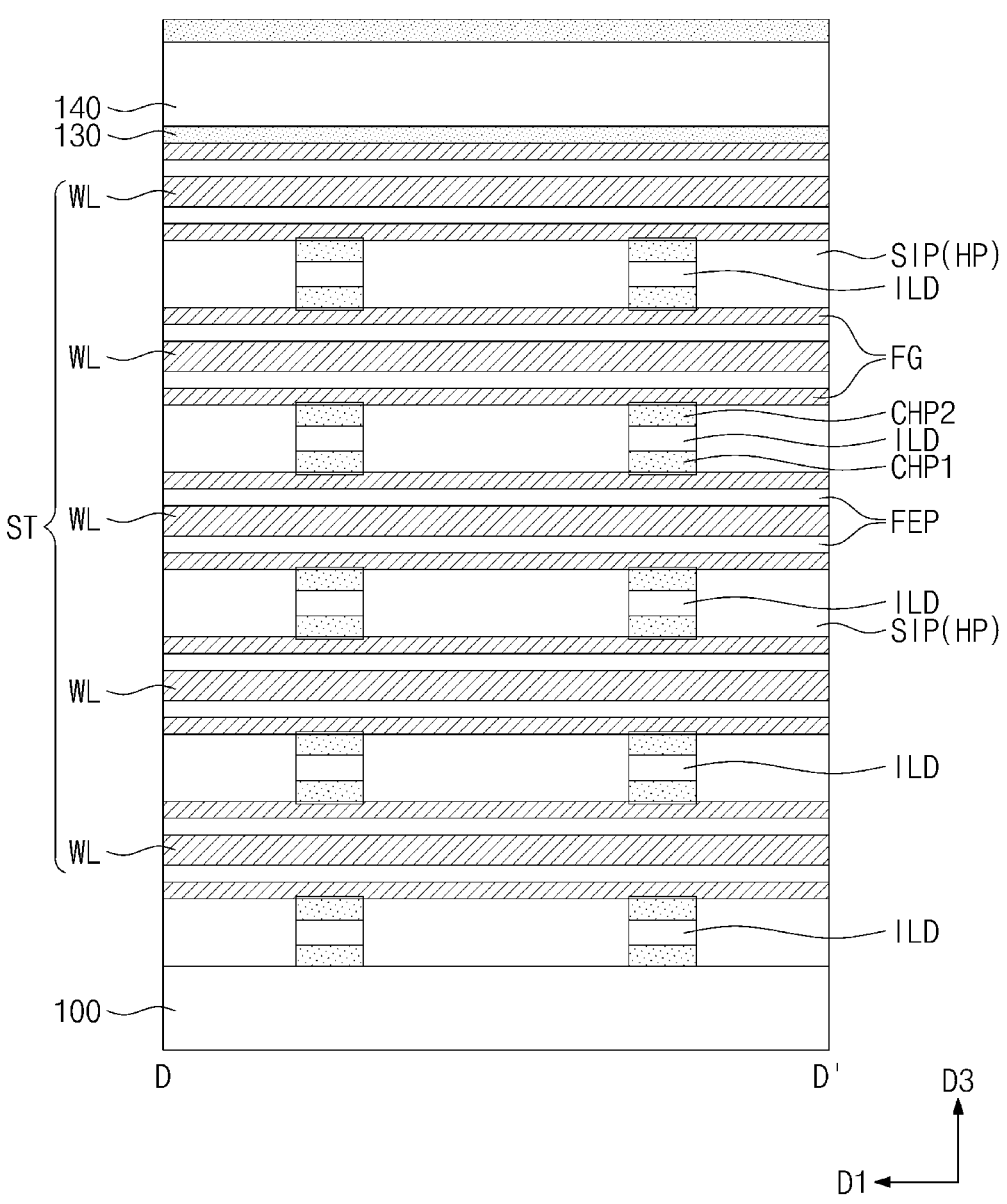
Figure 4:
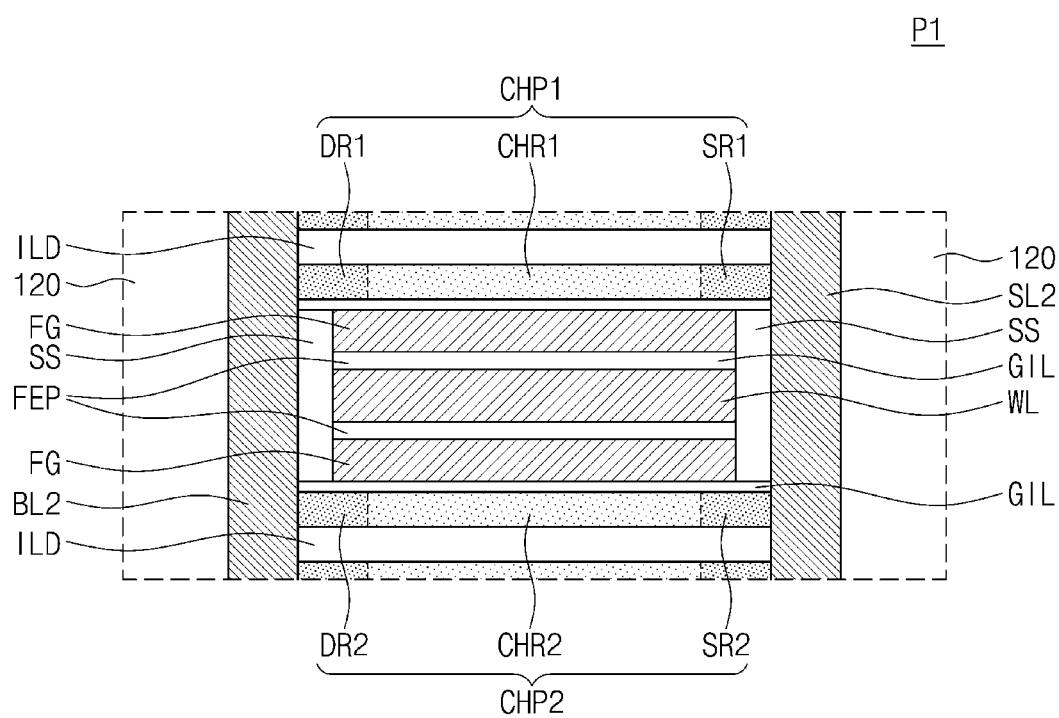
FIG. 4 is an enlarged sectional view of a portion 'P1' of FIG. 3C.

FIG. 3A is a plan view of a semiconductor memory device according to an embodiment of the inventive concept. FIGS. 3B, 3C, 3D, and 3E are sectional views taken along lines A-A', B-B', C-C', and D-D' of FIG. 3A, respectively, of a semiconductor memory device according to an embodiment of the inventive concept. FIG. 4 is an enlarged sectional view of a portion 'P1' of FIG. 3C.

Referring to FIGS. 3A, 3B, 3C, 3D, and 3E, in an embodiment, a semiconductor memory device includes electrode structures ST disposed on a substrate 100.

The substrate 100 is formed of or includes at least one of a semiconductor material, such as silicon, an insulating material, such as glass, or a semiconductor or conductor material covered with an insulating material.

The electrode structures ST extend in the first direction D1 and are spaced apart from each other in the second direction D2.

Each electrode structure ST includes word lines WL that are stacked in the third direction D3.

The word lines WL are formed of or include at least one of a doped semiconductor, such as doped silicon or doped germanium, a conductive metal nitride. such as titanium nitride or tantalum nitride, a metal, such as tungsten, titanium, or tantalum, or a metal-semiconductor compound, such as tungsten silicide, cobalt silicide, or titanium silicide.

Each of the word lines WL includes a gate electrode portion GEP that covers first and second channel patterns CHP1 and CHP2, and a connecting portion CNP that encloses first vertical insulating pillars.

First vertical insulating pillars SIP1 penetrate each electrode structure ST and are spaced apart from each other in the first direction D1. The first vertical insulating pillars SIP1 are formed of or include silicon oxide or silicon oxynitride.

Each of the first vertical insulating pillars SIP1 includes a vertical portion VP that extends in the third direction D3, and horizontal portions HP that laterally protrude from the vertical portion VP. In each of the first vertical insulating pillars SIP1, each of the horizontal portions HP is disposed between the word lines WL that are vertically adjacent to each other. The lowermost horizontal portion HP of each of the first vertical insulating pillars SIP1 is in contact with the substrate 100. A diameter of each horizontal portion HP is greater than a width W1 of the word line WL, and a diameter of the vertical portion VP is less than the width W1 of the word line WL.

Interlayer insulating patterns ILD are respectively disposed between the gate electrode portions GEP of the word lines WL that are vertically adjacent to each other. Those interlayer insulating patterns ILD that are located at the same level are spaced apart from each other in the first direction D1 with the horizontal portions HP of the first vertical insulating pillars SIP1 interposed therebetween. The interlayer insulating patterns ILD are formed of or include silicon oxide or silicon oxynitride.

The first channel patterns CHP1 are respectively disposed between the interlayer insulating patterns ILD and top surfaces of the word lines WL, and the second channel patterns CHP2 are respectively disposed between the interlayer insulating patterns ILD and bottom surfaces of the word lines WL. In an embodiment, the top and bottom surfaces of each word line WL are opposite to each other in the third direction D3. For example, the first and second channel patterns CHP1 and CHP2 are alternately stacked in the third direction D3, and each word line WL is disposed between a pair of the first and second channel patterns CHP1 and CHP2.

The interlayer insulating patterns ILD are respectively disposed between the first and second channel patterns CHP1 and CHP2. The first and second channel patterns CHP1 and CHP2 overlap each other in the third direction.

The first and second channel patterns CHP1 and CHP2 have a long axis parallel to the second direction D2, and a length of the first and second channel patterns CHP1 and CHP2 in the second direction D2 is greater than the width W1 of the word lines WL.

The first and second channel patterns CHP1 and CHP2 are formed of or include at least one polycrystalline semiconductor material. For example, the first and second channel patterns CHP1 and CHP2 are formed of or include at least one of silicon (Si), germanium (Ge), or silicon-germanium (SiGe). For example, the first and second channel patterns CHP1 and CHP2 are formed of polysilicon.

In an embodiment, the first and second channel patterns CHP1 and CHP2 are formed at least one oxide semiconductor materials, such as $Zn_xSn_yO$ (ZTO), $In_xZn_yO$ (IZO), $Zn_xO$, $In_xGa_yZn_zO$ (IGZO), $In_xGa_ySi_zO$ (IGSO), $In_xW_yO$ (IWO), $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZnaO$, $Si_xIn_yZn_zO$, $Al_xZn_ySn_zO$, $Ga_xZn_ySn_zO$, or $Zr_xZn_ySn_zO$, or combinations thereof.

The first and second channel patterns CHP1 and CHP2 may include a single layer or multiple layers made of at least one of the oxide semiconductor materials. The first and second channel patterns CHP1 and CHP2 are formed of or include at least one of an amorphous, a crystalline, or a polycrystalline oxide semiconductor material. In some embodiments, the first and second channel patterns CHP1 and CHP2 have a band gap energy that is greater than that of silicon. For example, the first and second channel patterns CHP1 and CHP2 have a band gap energy of about 1.5 eV to 5.6 eV. For example, when the first and second channel patterns CHP1 and CHP2 have a band gap energy of about 2.0 eV to 4.0 eV, the first and second channel patterns CHP1 and CHP2 exhibit an optimal channel performance.

In an embodiment, the first and second channel patterns CHP1 and CHP2 are formed of or include at least one two-dimensional material, such as $MoS_2$ and $WSe_2$.

Referring to FIG. 4, in an embodiment, each first channel pattern CHP1 includes first source and drain regions SR1 and DR1 that are spaced apart from each other in the second direction D2, and a first channel region CHR1 that is located between the first source and drain regions SR1 and DR1. Similarly, each second channel pattern CHP2 includes second source and drain regions SR2 and DR2 that are spaced apart from each other in the second direction D2, and a first channel region CHR2 that is located between the second source and drain regions SR2 and DR2.

The first and second source and drain regions SR1, SR2, DR1, and DR2 of the first and second channel patterns CHP1 and CHP2 are doped with impurities. In an embodiment, impurity concentrations of the first and second source and drain regions SR1, SR2, DR1, and DR2 are greater than impurity concentrations of the first and second channel regions CHR1 and CHR2.

In an embodiment, during an operation of the semiconductor memory device, the first and second channel regions CHR1 and CHR2 of the first and second channel patterns CHP1 and CHP2 in a unit memory cell receive the same voltage.

Data storage patterns FEP are respectively disposed between the first and second channel patterns CHP1 and CHP2 and the word lines WL.

The data storage patterns FEP are formed of or include a ferroelectric material that is polarized when an electric field is applied thereto. The ferroelectric material includes a hafnium-containing dielectric material. For example, the ferroelectric material includes at least one of $HfO_2$, Si-doped $HfO_2$ (HfSiO$_2$), Al-doped $HfO_2$ (HfAlO$_2$), HfSiON, HfZnO, $HfZrO_2$, $ZrO_2$, $ZrSiO_2$, $HfZrSiO_2$, ZrSiON, LaAlO, $HfDyO_2$, or $HfScO_2$.

Each of the data storage patterns FEP includes line portions that extend in the first direction D1, and sidewall portions that connect the line portions to each other. The line portions of each data storage pattern FEP cover top and bottom surfaces of the corresponding word line WL. The sidewall portions of each data storage pattern FEP cover opposite side surfaces of the corresponding word line WL between the vertical portions VP of the first vertical insulating pillars SIP1. Opposite side surfaces of the data storage patterns FEP are aligned with the opposite side surfaces of the word lines WL.

In an embodiment, floating gates FG are disposed between the data storage patterns FEP and the first and second channel patterns CHP1 and CHP2.

Similar to the data storage patterns FEP, each of the floating gates FG includes line portions that extend in the first direction D1, and sidewall portions that connect the line portions to each other. The line portions of each floating gate FG are disposed between a bottom surface of the first channel pattern CHP1 and the corresponding data storage pattern FEP and between a top surface of the second channel pattern CHP2 and the corresponding data storage pattern FEP. The sidewall portions of each floating gate FG are disposed between the vertical portions VP of the first vertical insulating pillars SIP1 and the sidewall portions of the corresponding data storage pattern FEP. Opposite side surfaces of the floating gates FG are aligned with the opposite side surfaces of the word lines WL.

The floating gates FG are formed of or include at least one a doped semiconductor, such as doped silicon or doped germanium, a conductive metal nitride, such as titanium nitride or tantalum nitride, a metal, such as tungsten, titanium, or tantalum, or a metal-semiconductor compound such as tungsten silicide, cobalt silicide, or titanium silicide.

Furthermore, referring to FIG. 4, in an embodiment, gate insulating layers GIL are disposed between the first and second channel patterns CHP1 and CHP2 and the floating gates FG. The gate insulating layers GIL cover bottom surfaces of the first channel patterns CHP1 and top surfaces of the second channel patterns CHP2 and extend in the first direction D1.

The gate insulating layers GIL are formed of or include at least one of a high-k dielectric material, silicon oxide, silicon nitride, or silicon oxynitride, and may have a single- or multi-layered structure. In an embodiment, the high-k dielectric material includes at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Spacer insulating patterns SS are respectively disposed between first and second channel patterns CHP1 and CHP2 that are vertically adjacent to each other. The spacer insulating patterns SS are separated from each other in the third direction D3 by the first and second channel patterns CHP1 and CHP2 and the interlayer insulating patterns ILD.

The spacer insulating patterns SS are disposed on opposite side surfaces of each word line WL. Furthermore, the spacer insulating patterns SS are disposed on opposite side surfaces of each data storage pattern FEP and opposite side surfaces of each floating gate FG. The spacer insulating patterns SS are formed of or include at least one of silicon nitride or silicon oxynitride.

Bit lines BL1 and BL2 are disposed on a first side surface of each electrode structure ST, and source lines SL1 and SL2 are disposed on a second side surface opposite to the first side surface of each electrode structure ST.

The bit lines BL1 and BL2 are disposed on the substrate 100 and extend in the third direction D3. Each of the bit lines BL1 and BL2 is connected to first end portions of the first and second channel patterns CHP1 and CHP2, such as the first and second drain regions DR1 and DR2. The bit lines BL1 and BL2 on the first side surface of each electrode structure ST are spaced apart from each other in the first direction D1. Bit lines BL1 and BL2 that are adjacent to each other in the first direction D1 are separated from each other by second vertical insulating pillars SIP2.

The source lines SL1 and SL2 are disposed on the substrate 100 and extend in the third direction D3. Each of the source lines SL1 and SL2 is connected to second end portions of the first and second channel patterns CHP1 and CHP2, such as the first and second source regions SR1 and SR2. The source lines SL1 and SL2 on the second side surface of each electrode structure ST are spaced apart from each other in the first direction D1. Source lines SL1 and SL2 that are adjacent to each other in the first direction D1 are separated from each other by the second vertical insulating pillars SIP2.

A separation insulating pattern 120 is disposed between source lines SL1 and SL2 and bit lines BL1 and BL2 that are adjacent to each other in the second direction D2. The separation insulating pattern 120 covers side surfaces of the bit and source lines BL1, BL2, SL1, and SL2.

The second vertical insulating pillars SIP2 is disposed on the substrate 100, extends in the third direction D3 and penetrates the separation insulating pattern 120. The second vertical insulating pillars SIP2 are spaced apart from each other in the first direction D1. The second vertical insulating pillars SIP2 have a circular pillar shape that extends in the third direction D3 on the substrate 100. The second vertical insulating pillars SIP2 are in contact with the horizontal portions HP of the first vertical insulating pillars SIP1. The second vertical insulating pillars SIP2 have top surfaces that are substantially coplanar with a top surface of a hard mask layer 130 that covers the top surfaces of a first vertical insulating pillars SIP1.

An upper insulating layer 140 is formed on the hard mask layer 130. First conductive vias 151 are formed that penetrate the upper insulating layer 140 and are coupled to the bit lines BL1 and BL2, respectively, and second conductive vias 153 are formed that penetrate the upper insulating layer 140 and are coupled to the source lines SL1 and SL2, respectively. Conductive pads 161 are disposed on and coupled to the first and second conductive vias 151 and 153, respectively.

Hereinafter, semiconductor memory devices according to various embodiments of the inventive concept will be described. However, for concise description, a previously described element may be identified by the same reference number without repeating an overlapping description thereof.

Figure 5A:
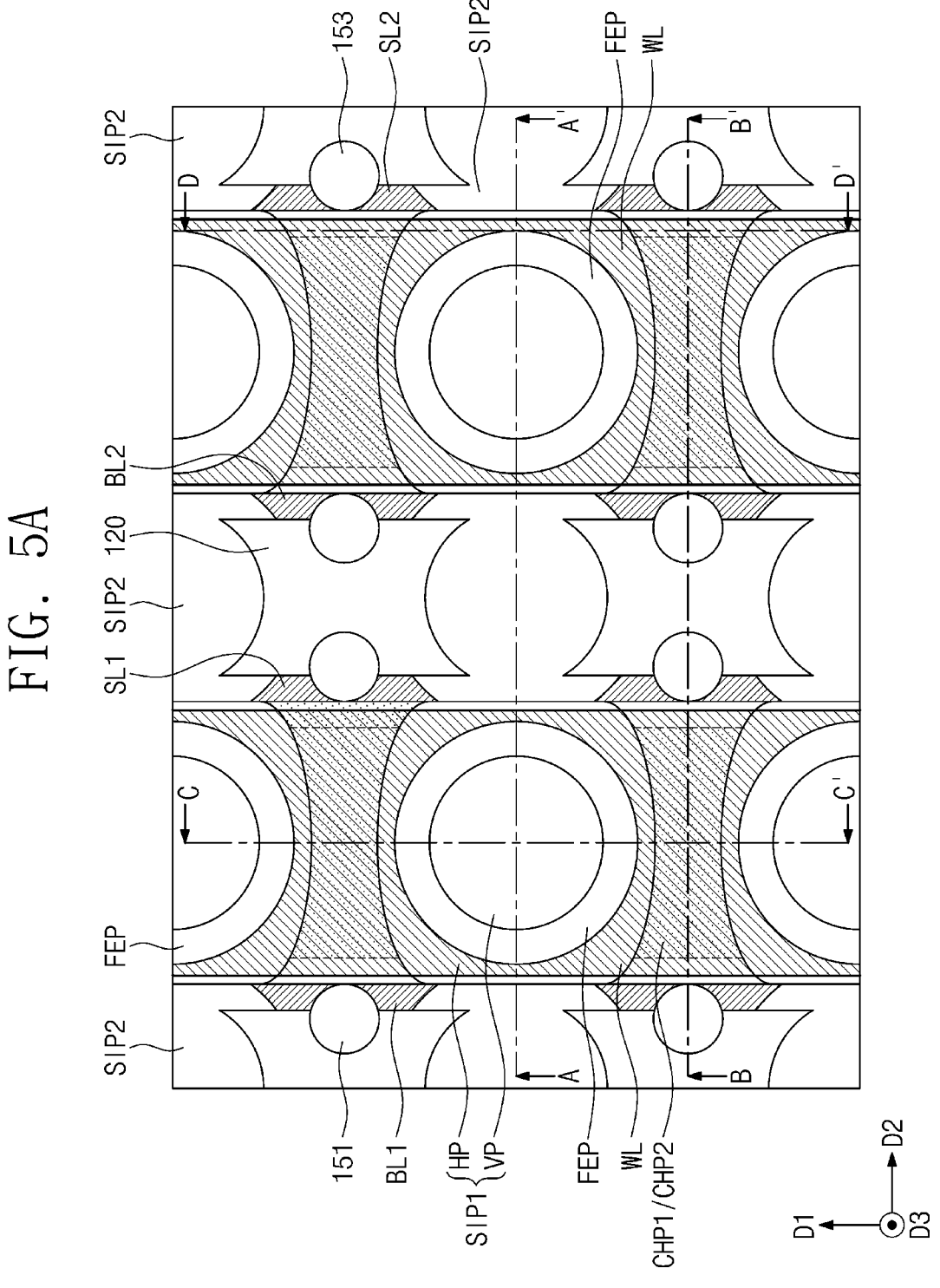
FIG. 5A is a plan view of a semiconductor memory device according to an embodiment of the inventive concept.
Figure 5B:
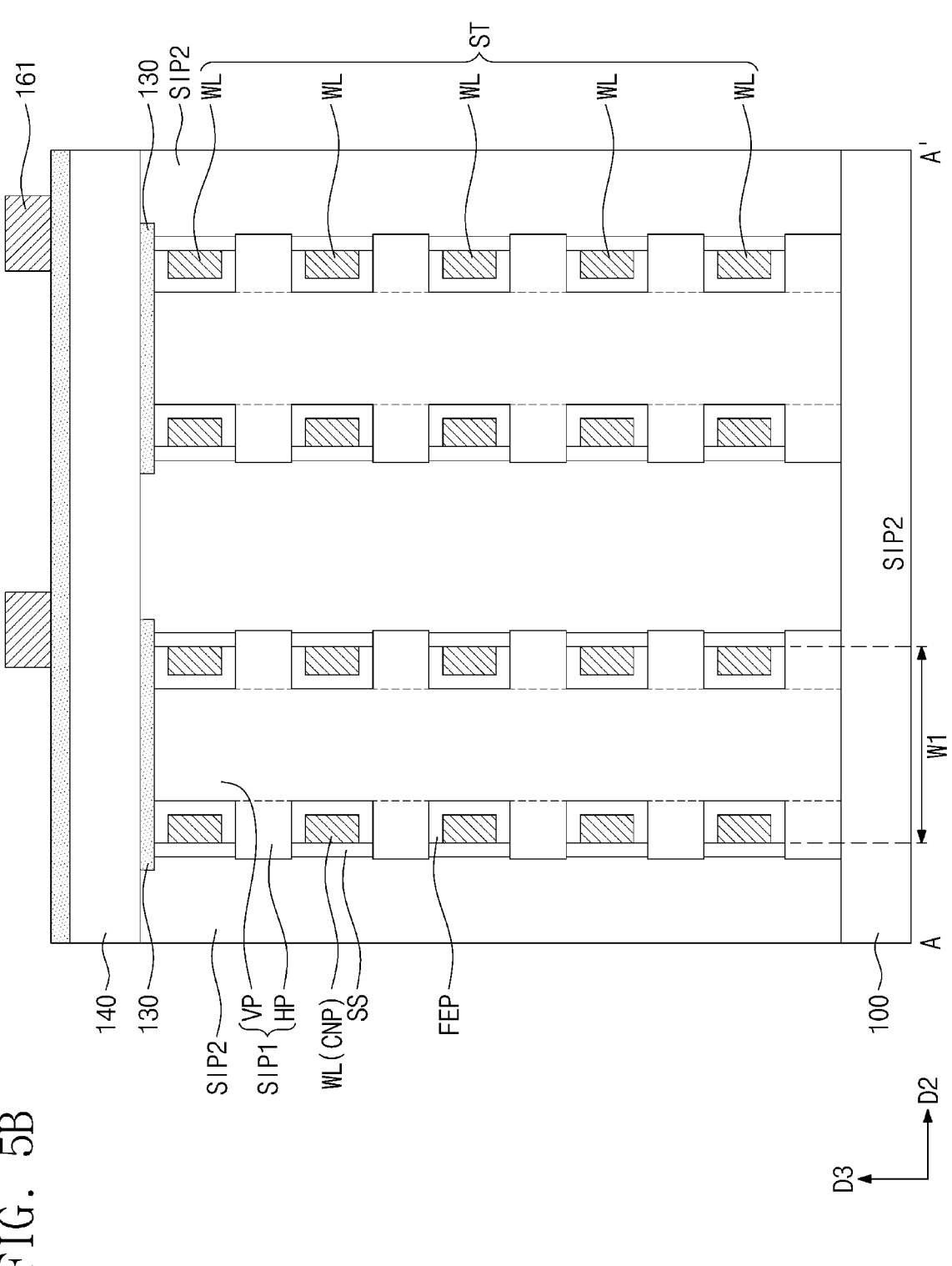
FIGS. 5B, 5C, 5D, and 5E are sectional views taken along lines A-A', B-B', C-C', and D-D' of FIG. 5A, respectively, of a semiconductor memory device according to an embodiment of the inventive concept.
Figure 5C:
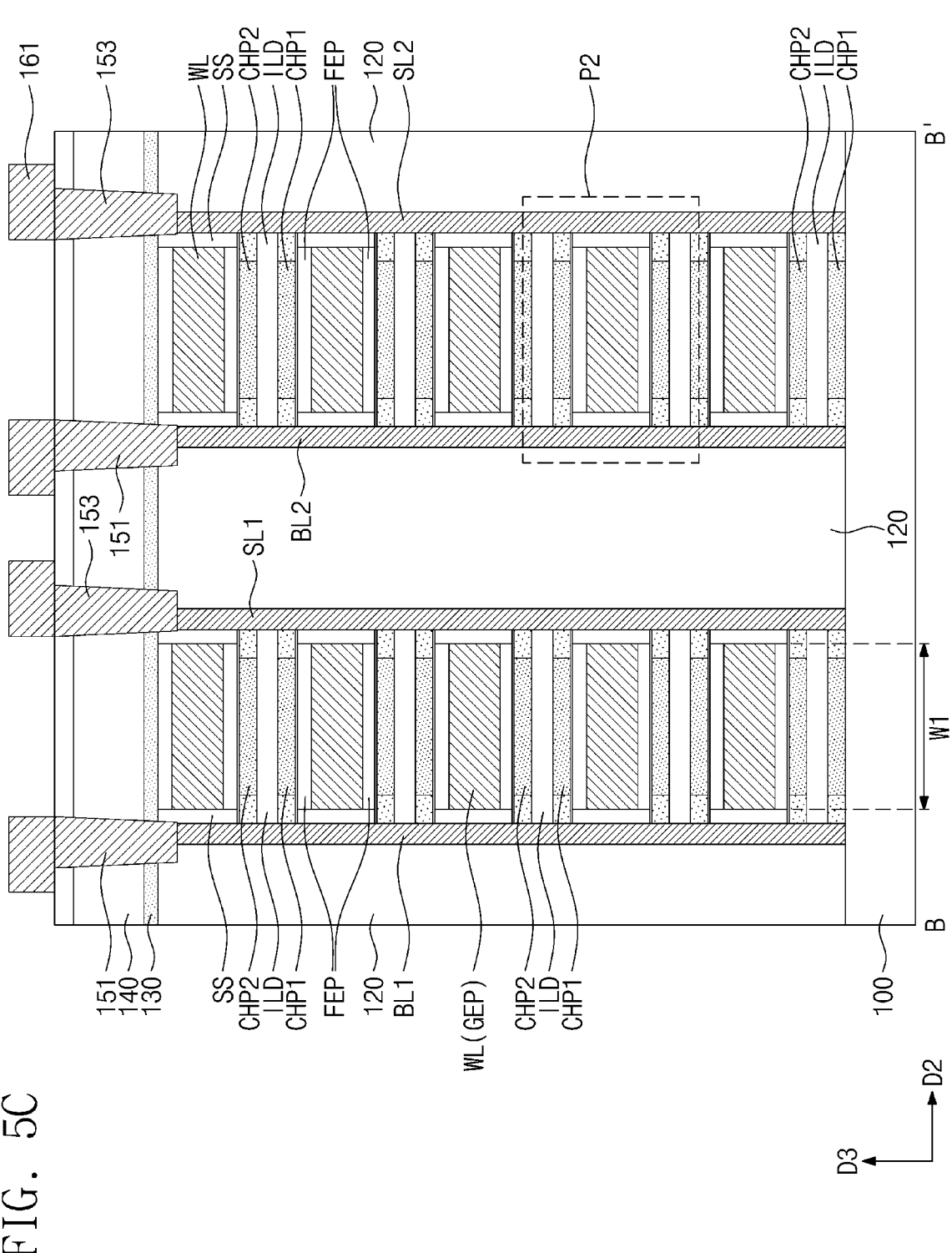
Figure 5D:
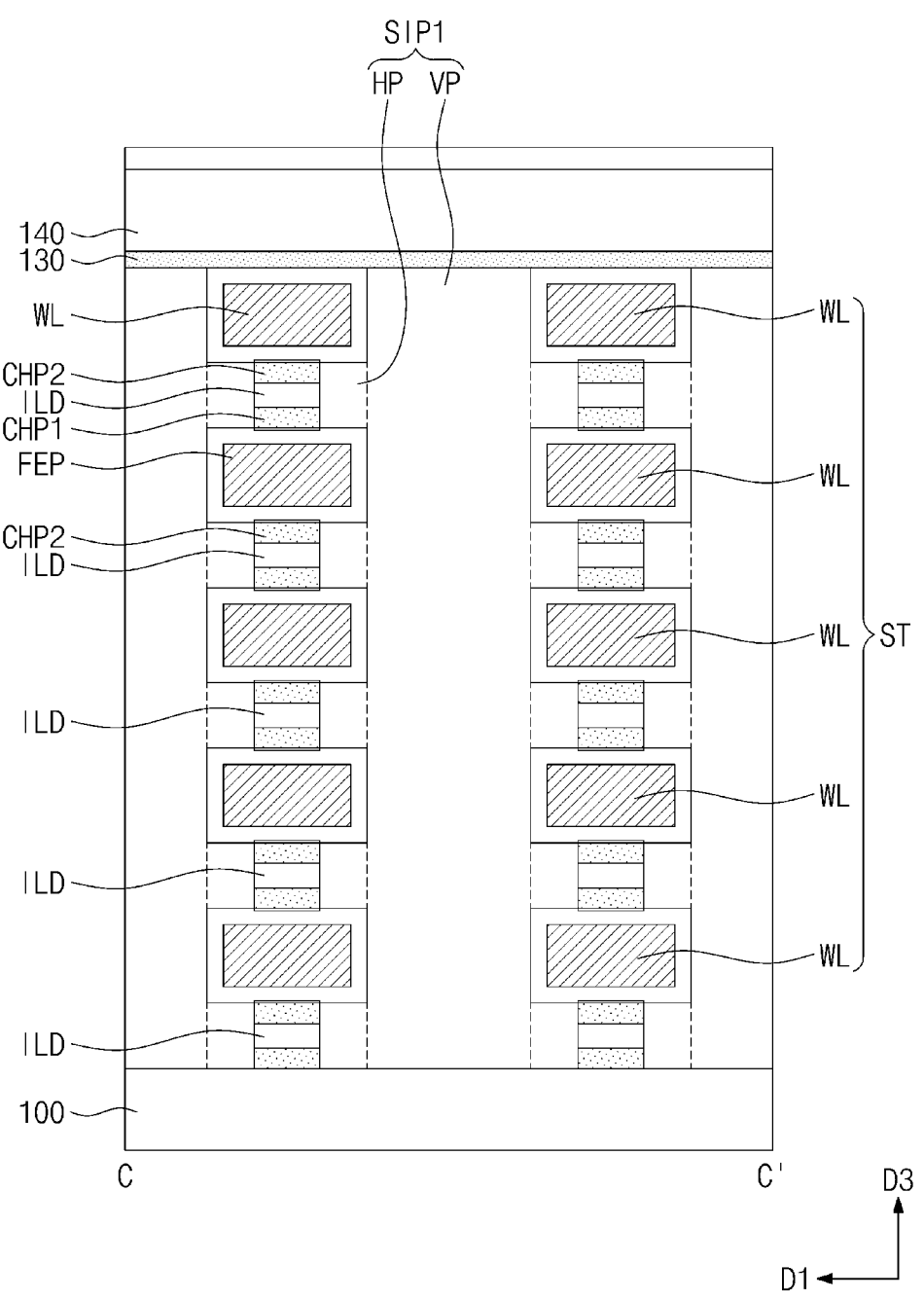
Figure 5E:
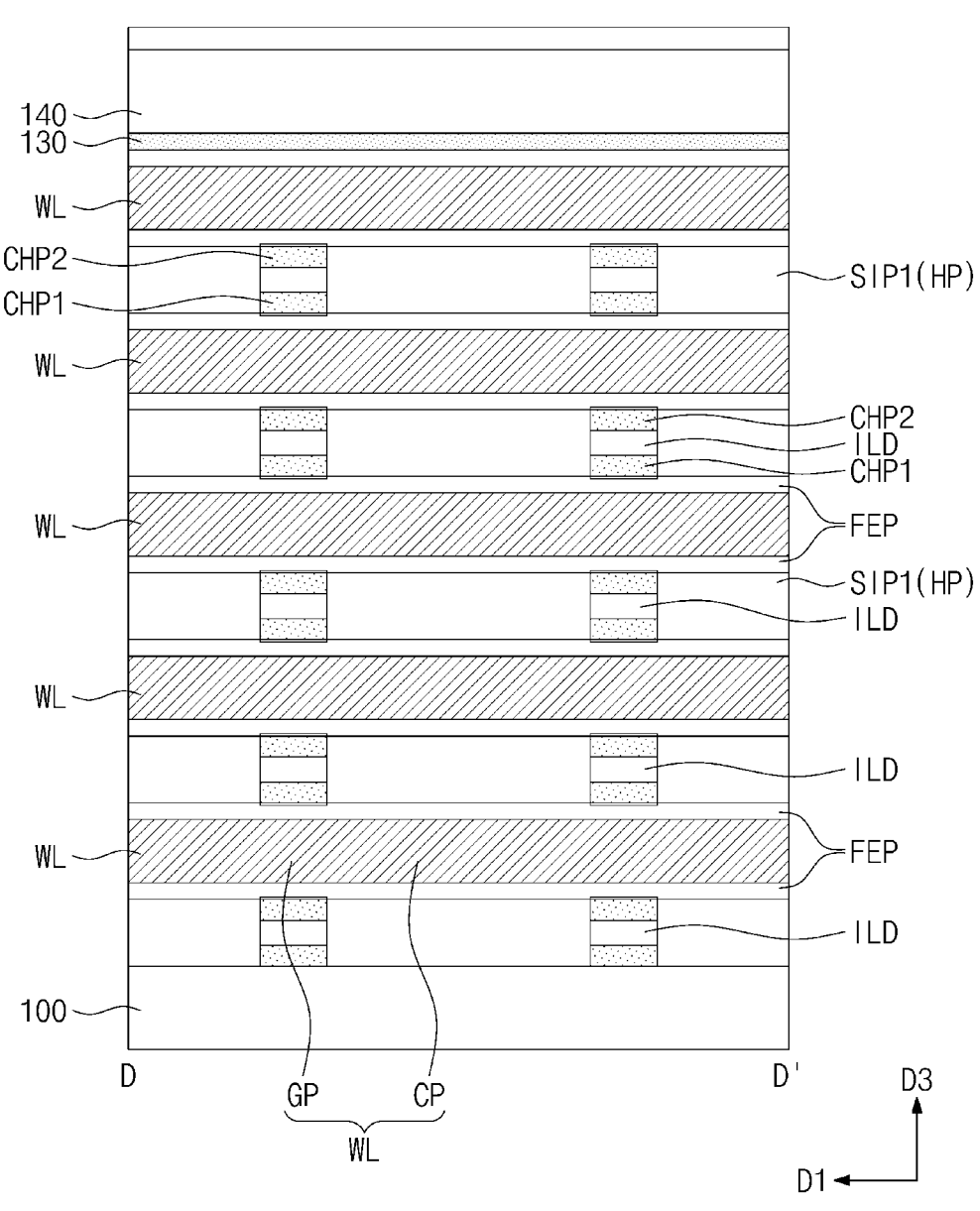
Figure 6:
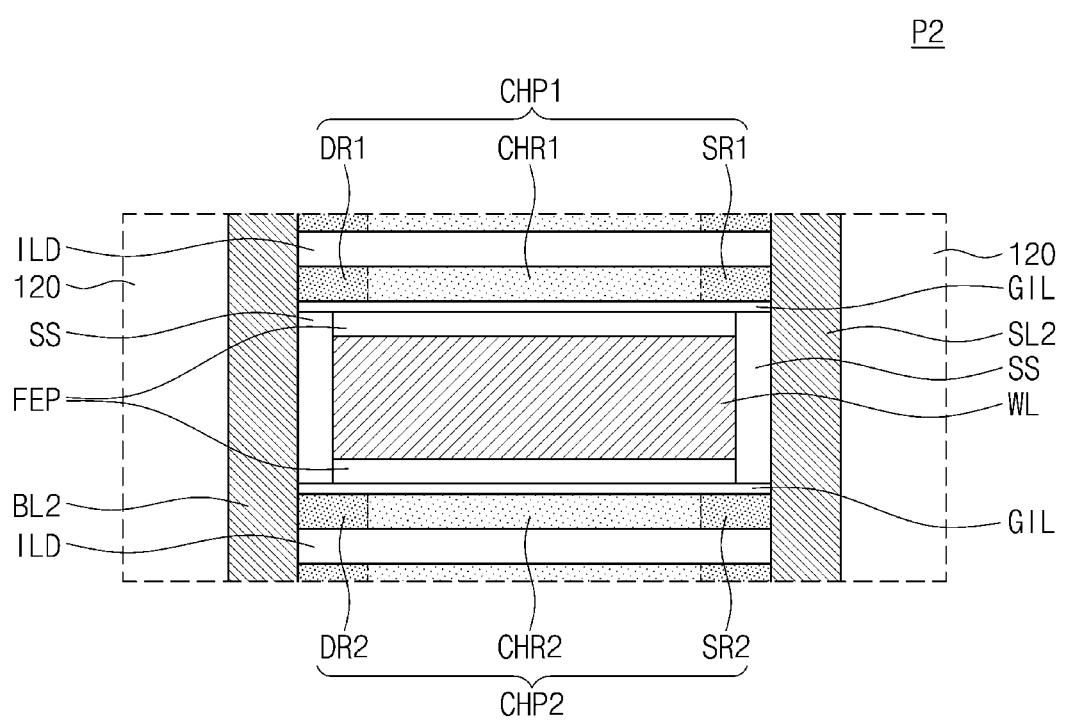
FIG. 6 is an enlarged sectional view of a portion 'P2' of FIG. 5C.

FIG. 5A is a plan view of a semiconductor memory device according to an embodiment of the inventive concept. FIGS. 5B, 5C, 5D, and 5E are sectional views taken along lines A-A', B-B', C-C', and D-D' of FIG. 5A, respectively, of a semiconductor memory device according to an embodiment of the inventive concept. FIG. 6 is an enlarged sectional view of a portion 'P2' of FIG. 5C.

Referring to FIGS. 5A, 5B, 5C, 5D, and 5E, in an embodiment, the floating gates in an embodiment illustrated in FIGS. 3A, 3B, 3C, 3D, 3E and 4 are omitted. For example, the data storage patterns FEP are in direct contact with the first vertical insulating pillars SIP1. For example, the data storage patterns FEP directly enclose the vertical portions VP of the first vertical insulating pillars SIP1. In addition, the data storage patterns FEP are in direct contact with the gate insulating layer GIL, as shown in FIG. 6.

Figure 7A:
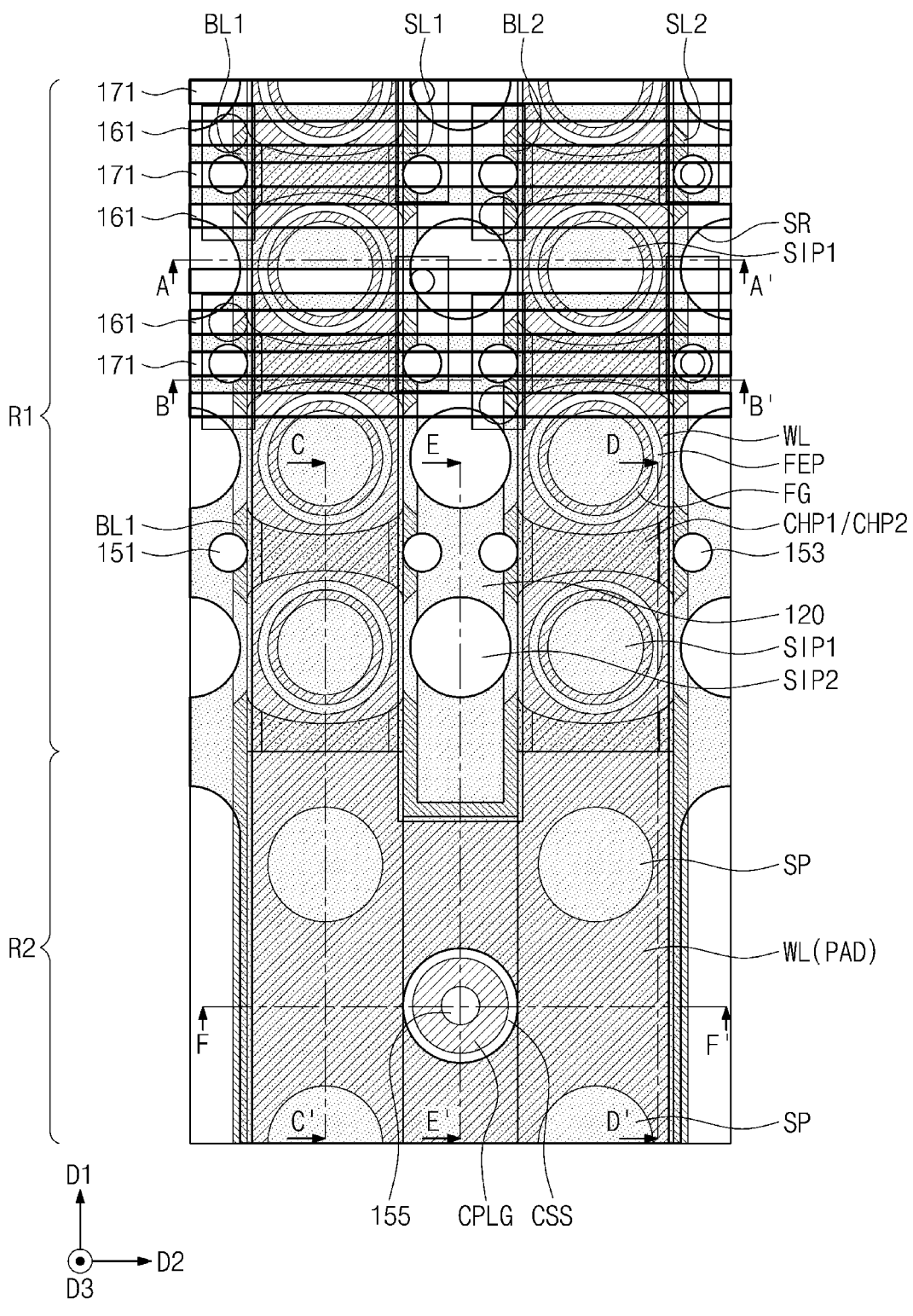
FIG. 7A is a plan view of a semiconductor memory device according to an embodiment of the inventive concept.
Figure 7B:
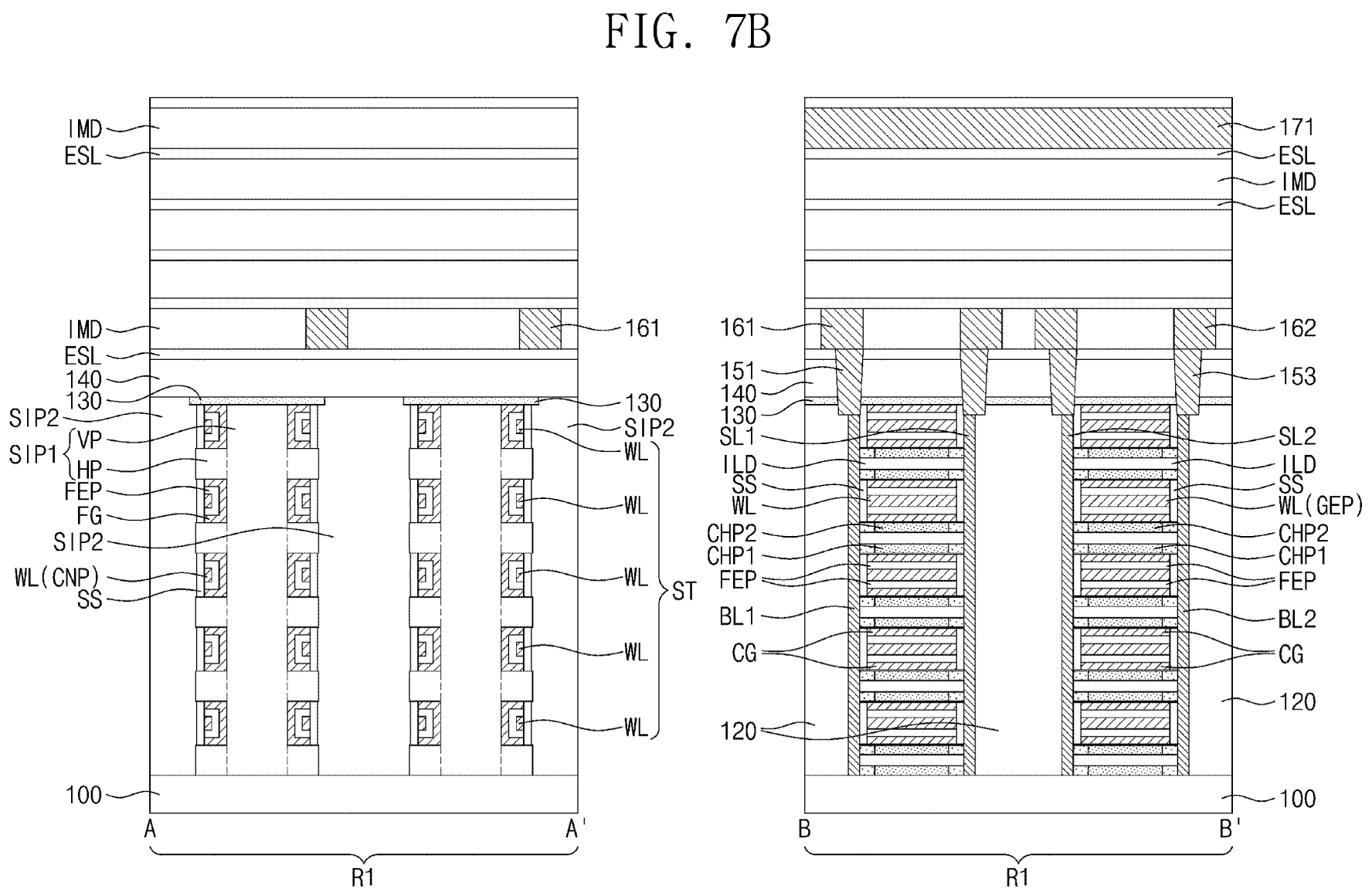
Figure 7C:
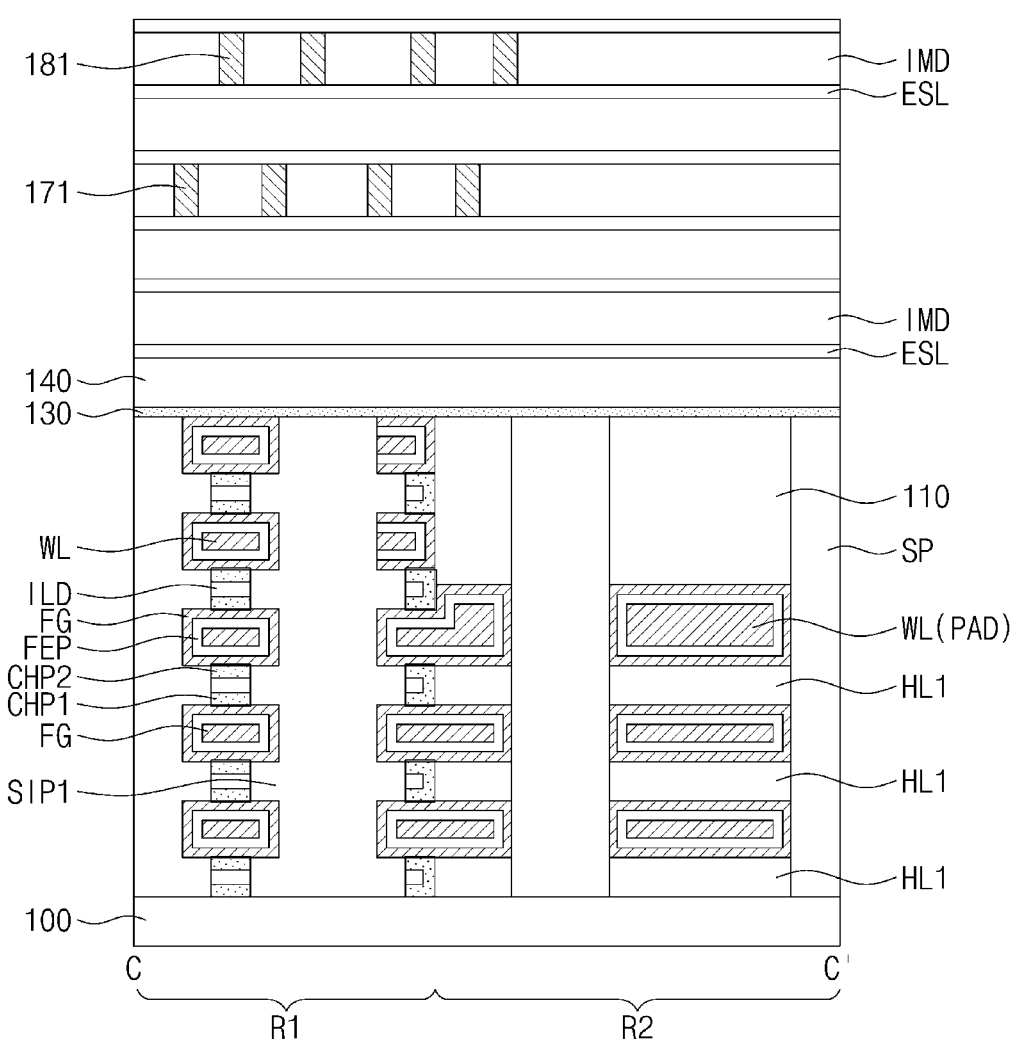
Figure 7D:
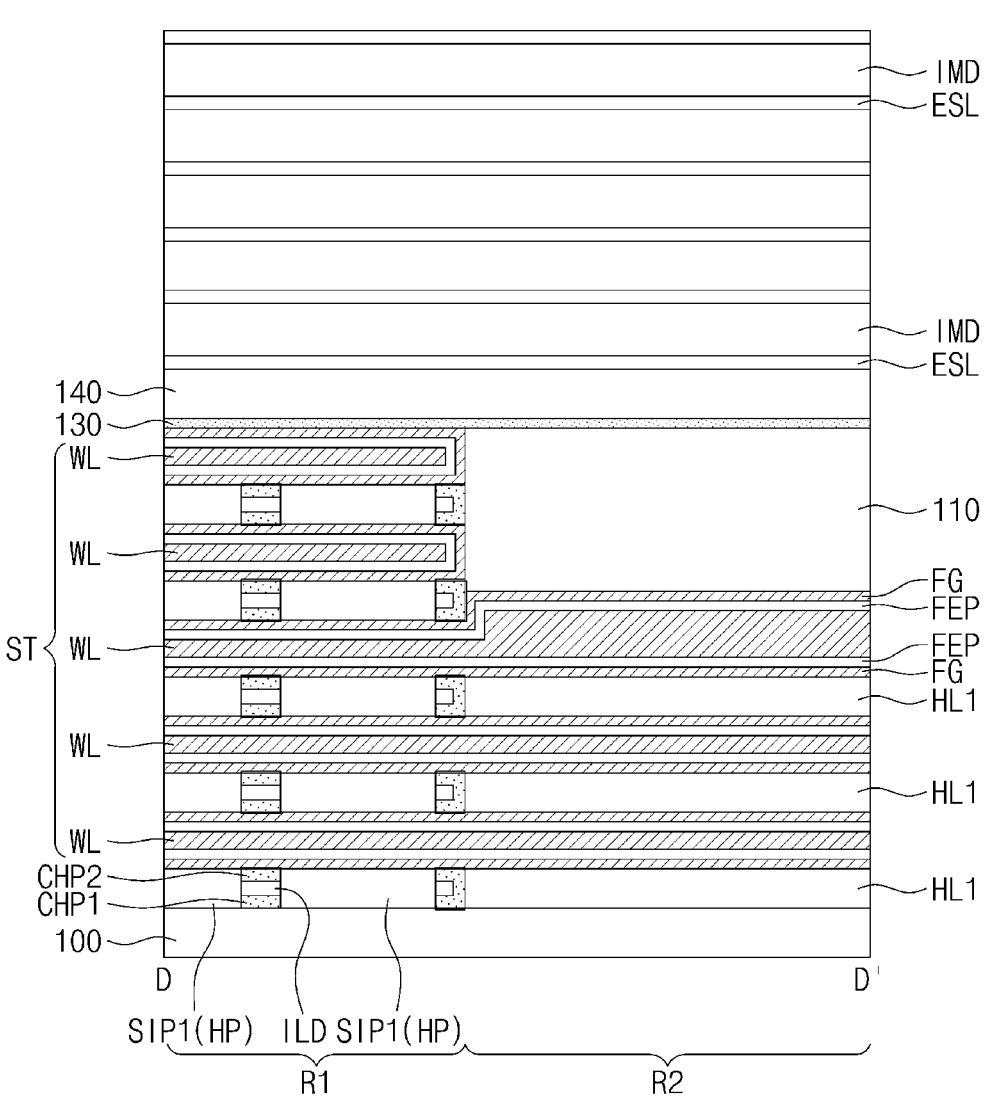
Figure 7E:
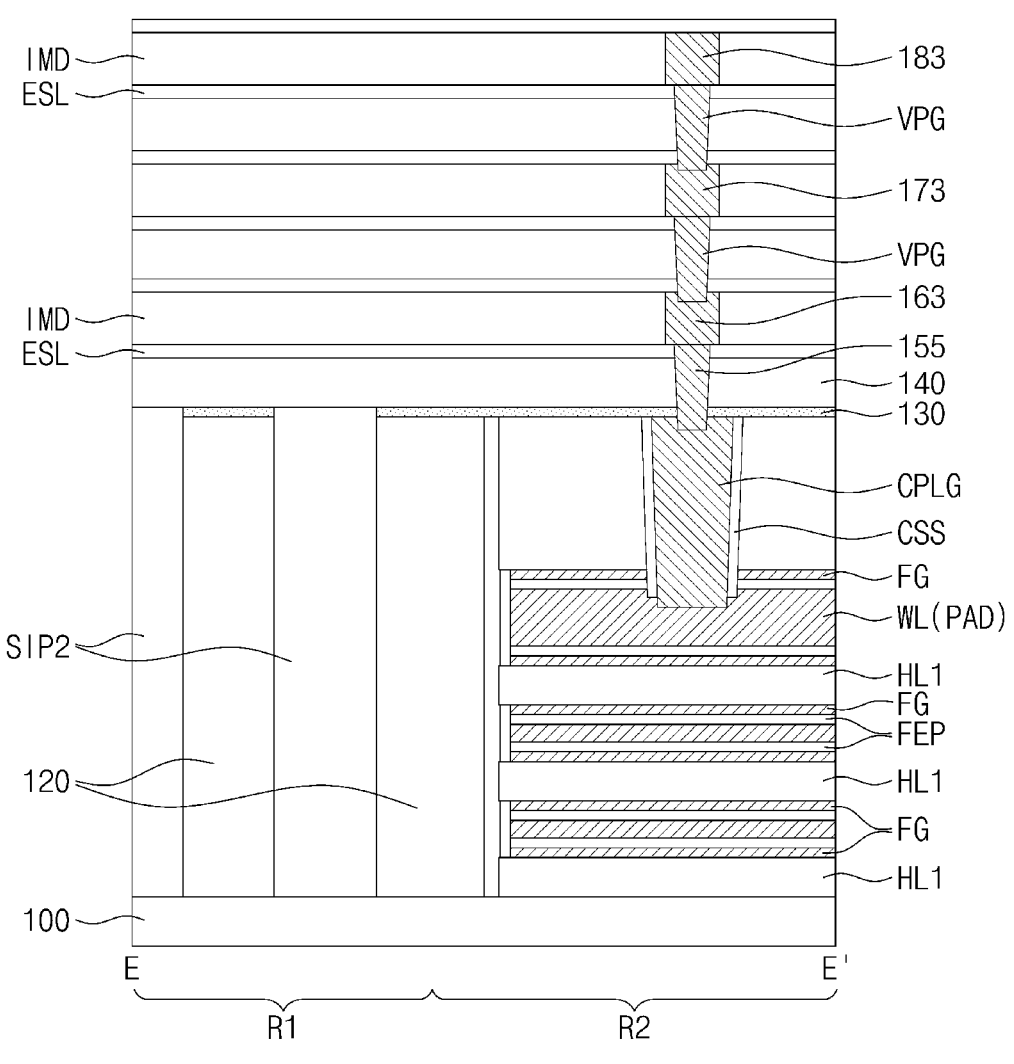
Figure 7F:
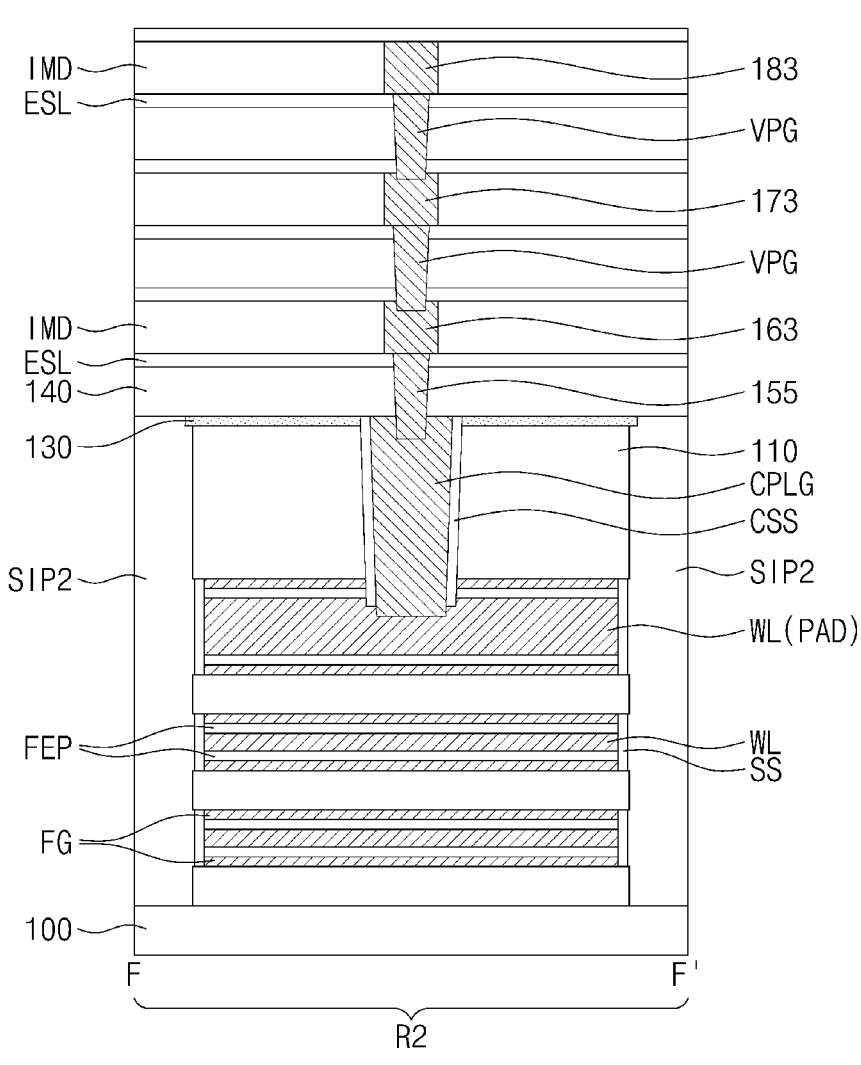

FIG. 7A is a plan view of a semiconductor memory device according to an embodiment of the inventive concept. FIGS. 7B, 7C, 7D, 7E, and 7F are sectional views taken along lines A-A', B-B', C-C', D-D', E-E', and F-F' of FIG. 7A, respectively, of a semiconductor memory device according to an embodiment of the inventive concept.

Referring to FIGS. 7A, 7B, 7C, 7D, 7E, and 7F, in an embodiment, the substrate 100 includes a first region R1 and a second region R2 that are adjacent to each other. As described above, the electrode structure ST that includes the vertically-stacked word lines WL is disposed on the substrate 100.

Each of the word lines WL includes line portions that are provided in the first region R1 and extend in the first direction D1, and a pad portion PAD that is provided in the second region R2 and connects the line portions in the second direction D2. As described above, each of the line portions includes the gate electrode portion GEP that is provided in the first region R1 and covers the first and second channel patterns CHP1 and CHP2, and the connecting portion CNP that is provided in the first region R1 and encloses the first vertical insulating pillars SIP1. The pad portions PAD of the word lines WL are stacked and form a staircase structure in the second region R2. For example, lengths of the pad portions PAD of the word lines WL measured in the first direction D1 decrease with increasing height from the substrate 100.

In an embodiment, first mold layers HL1 and the pad portions PAD of the word lines WL are alternately stacked on the second region R2. The first mold layers HL1 are located at the same level as the interlayer insulating layers ILD in the first region R1, and a thickness of each of the first mold layers HL1 is greater than a thickness of each interlayer insulating layer ILD.

A planarization insulating layer 110 covers the pad portions PAD of the word lines WL. For example, the planarization insulating layer 110 has the staircase structure of the electrode structure ST in the second region R2. A top surface of the planarization insulating layer 110 is substantially coplanar with the top surfaces of the first vertical insulating pillars SIP1.

Supporter pillars SP penetrate the pad portions PAD of the word lines WL in the second region R2. The supporter pillars SP have a circular pillar shape and are spaced apart from each other in the first and second directions D1 and D2. The supporter pillars SP have top surfaces that are substantially coplanar with the top surfaces of the first vertical insulating pillars SIP1 on the first region R1. In an embodiment, the supporter pillars SP are formed of or include silicon oxide or silicon oxynitride.

Cell contact plugs CPLG penetrate the planarization insulating layer 110 and are coupled to the pad portions PAD of the word lines WL, respectively. The cell contact plugs CPLG are formed of or include at least one of a metal and/or ac metal nitride.

A contact spacer CSS penetrates the planarization insulating layer 110 and encloses a side surface of each cell contact plug CPLG. The contact spacer CSS is formed of an insulating material, and the cell contact plugs CPLG are electrically disconnected from the data storage pattern FEP and the floating gate FG by the contact spacer CSS.

In an embodiment, the upper insulating layer 140 is formed on the hard mask layer 130 in the first and second regions R1 and R2.

The first conductive vias 151 penetrate the upper insulating layer 140 in the first region R1 and are coupled to the bit lines BL1 and BL2, respectively, and the second conductive vias 153 penetrate the upper insulating layer 140 in the first region R1 and are coupled to the source lines SL1 and SL2, respectively. Furthermore, third conductive vias 155 penetrate the upper insulating layer 140 in the second region R2 and are coupled to the cell contact plugs CPLG, respectively.

Inter-metal insulating layers IMD and etch stop layers ESL may be alternately stacked on the upper insulating layer 140 in the first and second regions R1 and R2.

In the first region R1, first and second conductive pads 161 and 162 are coupled to the first and second conductive vias 151 and 153, respectively. Each of the first and second conductive pads 161 and 162 has a long axis parallel to the first direction D1 and are spaced apart from each other in the first direction D1. A third conductive pad 163 is disposed in the second region R2 at the same level as the first and second conductive pads 161 and 162. The third conductive pad 163 are coupled to the third conductive via 155.

Horizontal bit lines 171 are disposed on one of the inter-metal insulating layers IMD. The horizontal bit lines 171 are spaced apart from each other in the first direction D1 by a predetermined distance and extend in the second direction D2. The horizontal bit lines 171 are electrically connected to the bit lines BL1 and BL2 through the first conductive pads 161 and the first conductive vias 151.

Horizontal source lines 181 are disposed on one of the inter-metal insulating layers IMD. The horizontal source lines 181 are located at a different level from the horizontal bit lines 171. The horizontal source lines 181 are spaced apart from each other in the first direction D1 by a predetermined distance and extend in the second direction D2. The horizontal source lines 181 are disposed between the horizontal bit lines 171, when viewed in a plan view. The horizontal source lines 181 are electrically connected to the source lines SL1 and SL2 through the second conductive pads 162 and the second conductive vias 153.

In the second region R2, a first upper conductive pattern 173 is disposed at the same level as the horizontal bit lines 171, and a second upper conductive pattern 183 is disposed at the same level as the horizontal source lines 181. The first and second upper conductive patterns 173 and 183 are coupled to the third conductive pad 163 through via plugs VPG.

Figure 8A:
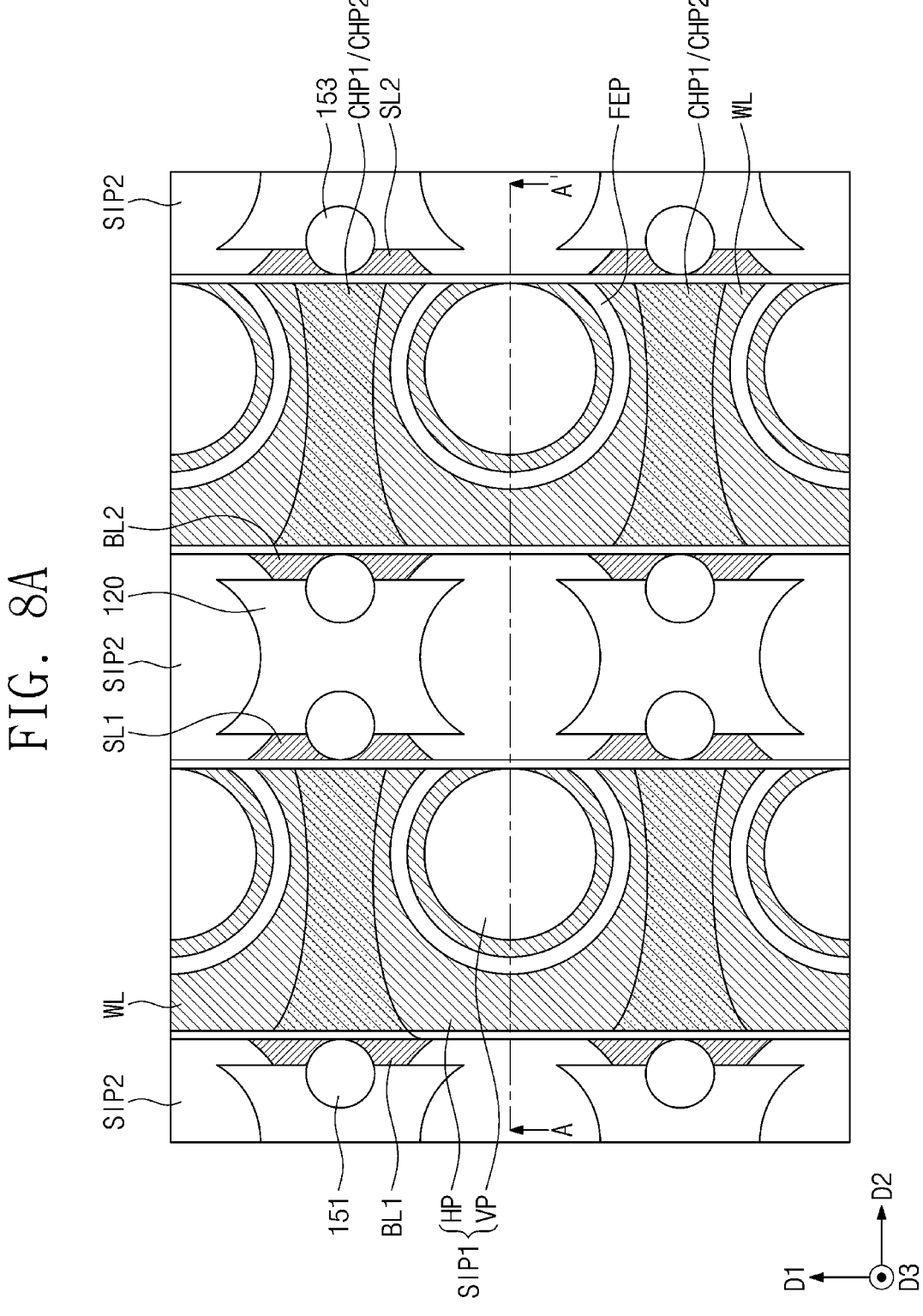
FIG. 8A is a plan view of a semiconductor memory device according to an embodiment of the inventive concept.
Figure 8B:
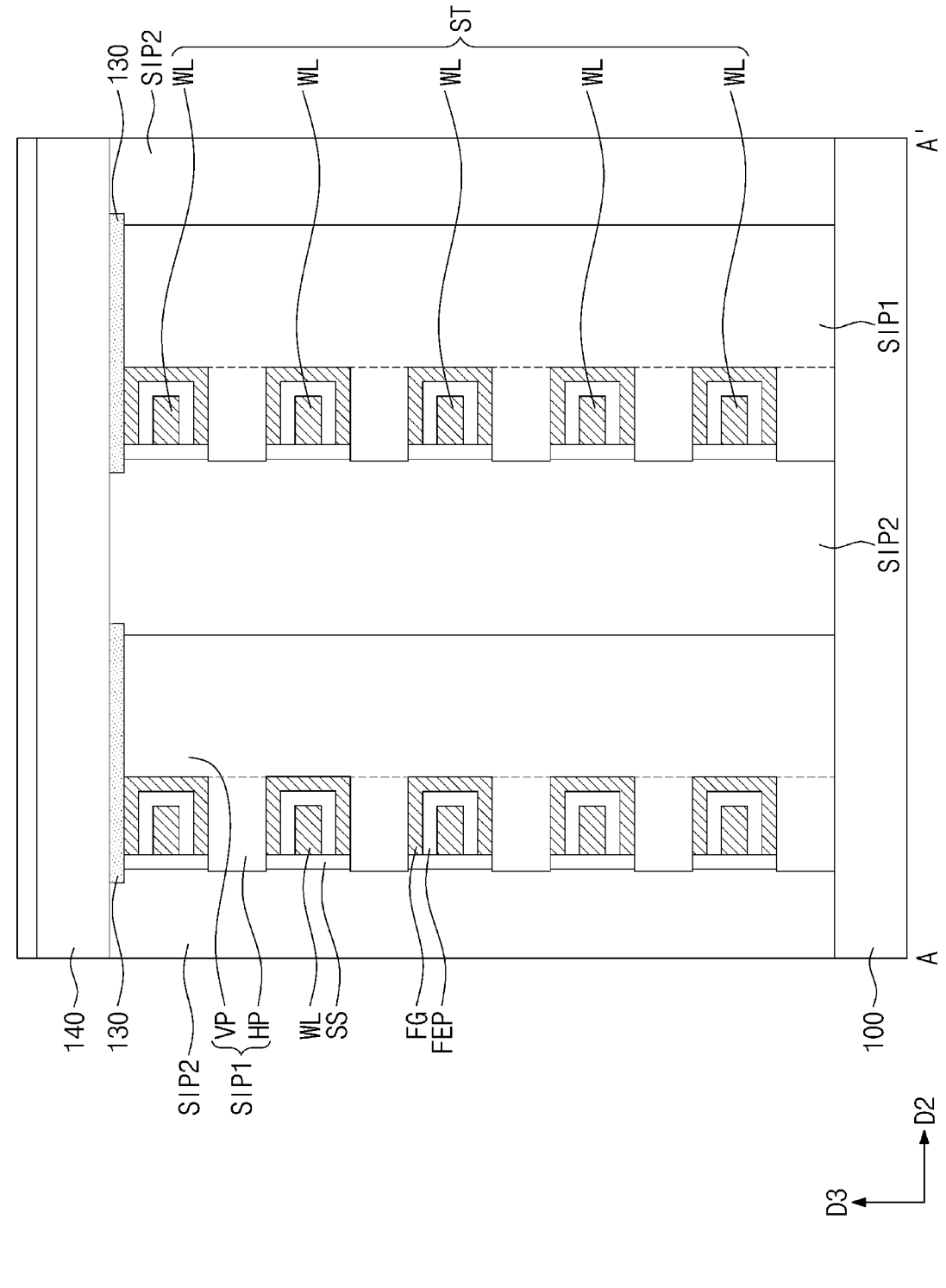
FIG. 8B is a sectional view taken along a line A-A' of FIG. 8A of a semiconductor memory device according to an embodiment of the inventive concept.

FIG. 8A is a plan view of a semiconductor memory device according to an embodiment of the inventive concept. FIG. 8B is a sectional view taken along a line A-A' of FIG. 8A of a semiconductor memory device according to an embodiment of the inventive concept.

In an embodiment shown in FIGS. 8A and 8B, the horizontal portions HP are asymmetrically formed in each of the first vertical insulating pillars SIP1. For example, a side surface of the vertical portion VP of each of the first vertical insulating pillars SIP1 is in contact with the separation insulating pattern 120.

The electrode structure ST has a first side surface and a second side surface that are opposite to each other in the second direction D2. For example, each word line WL has a first side surface and a second side surface that are opposite to each other in the second direction D2. In an embodiment, a distance from the first side surface of each word line WL to a center of each of the first vertical insulating pillars SIP1 differs from a distance from the second side surface of each word line WL to a center of each of the first vertical insulating pillars SIP1.

Figure 9A:
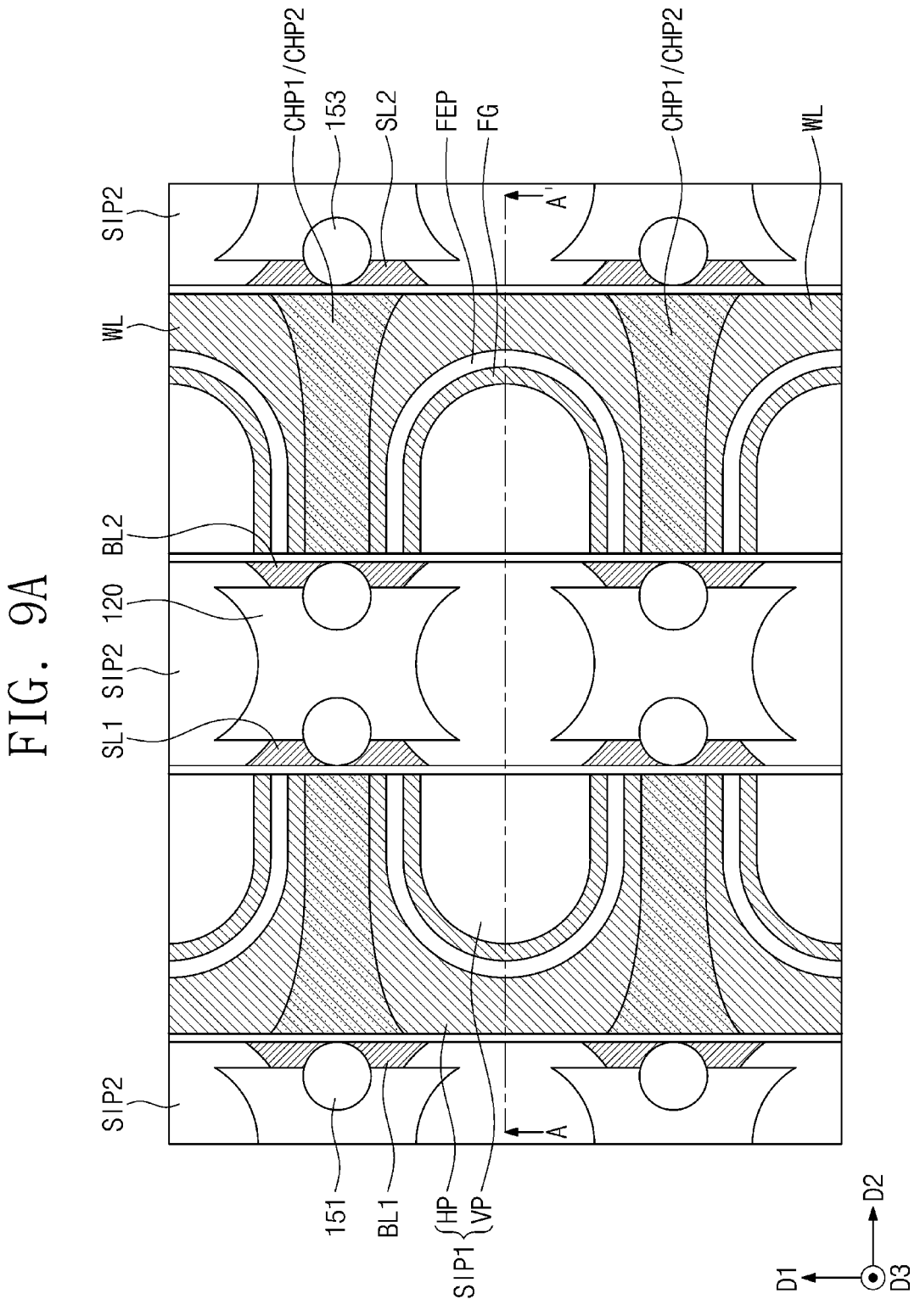
FIG. 9A is a plan view of a semiconductor memory device according to an embodiment of the inventive concept.
Figure 9B:
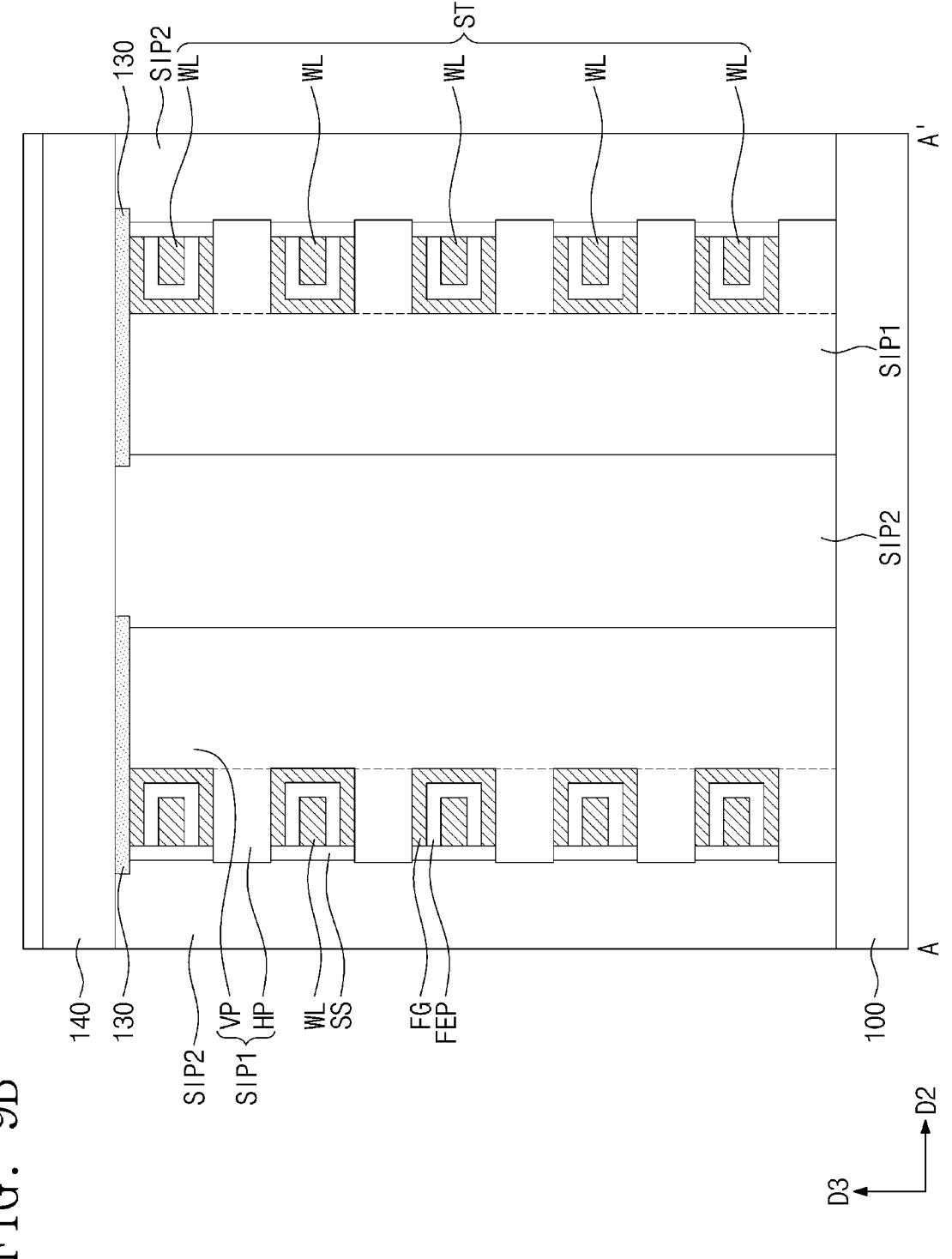
FIG. 9B is a sectional view taken alone a line A-A' of FIG. 9A of a semiconductor memory device according to an embodiment of the inventive concept.

FIG. 9A is a plan view of a semiconductor memory device according to an embodiment of the inventive concept. FIG. 9B is a sectional view taken along a line A-A' of FIG. 9A of a semiconductor memory device according to an embodiment of the inventive concept.

In an embodiment shown in FIGS. 9A and 9B, first vertical insulating pillars SIP1 that are adjacent to each other in the second direction D2 have a mirror symmetry with respect to each other. In addition, the vertical portion VP of each of the first vertical insulating pillars SIP1 has a flat side surface that is in contact with the second vertical insulating pillars SIP2.

In an embodiment, the shape and size of the first and second channel patterns CHP1 and CHP2 depend on a sectional shape of the vertical portion VP of each of the first vertical insulating pillars SIP1. In an embodiment, as shown in FIG. 9A, a width of the first and second channel patterns CHP1 and CHP2 in the first direction D1 is greater nearer to the first bit line BL1 than the first source line SL1. A width of the first and second channel patterns CHP1 and CHP2 in the first direction D1 is greater nearer to the second source line SL2 than the second bit line BL2.

Figure 10A:
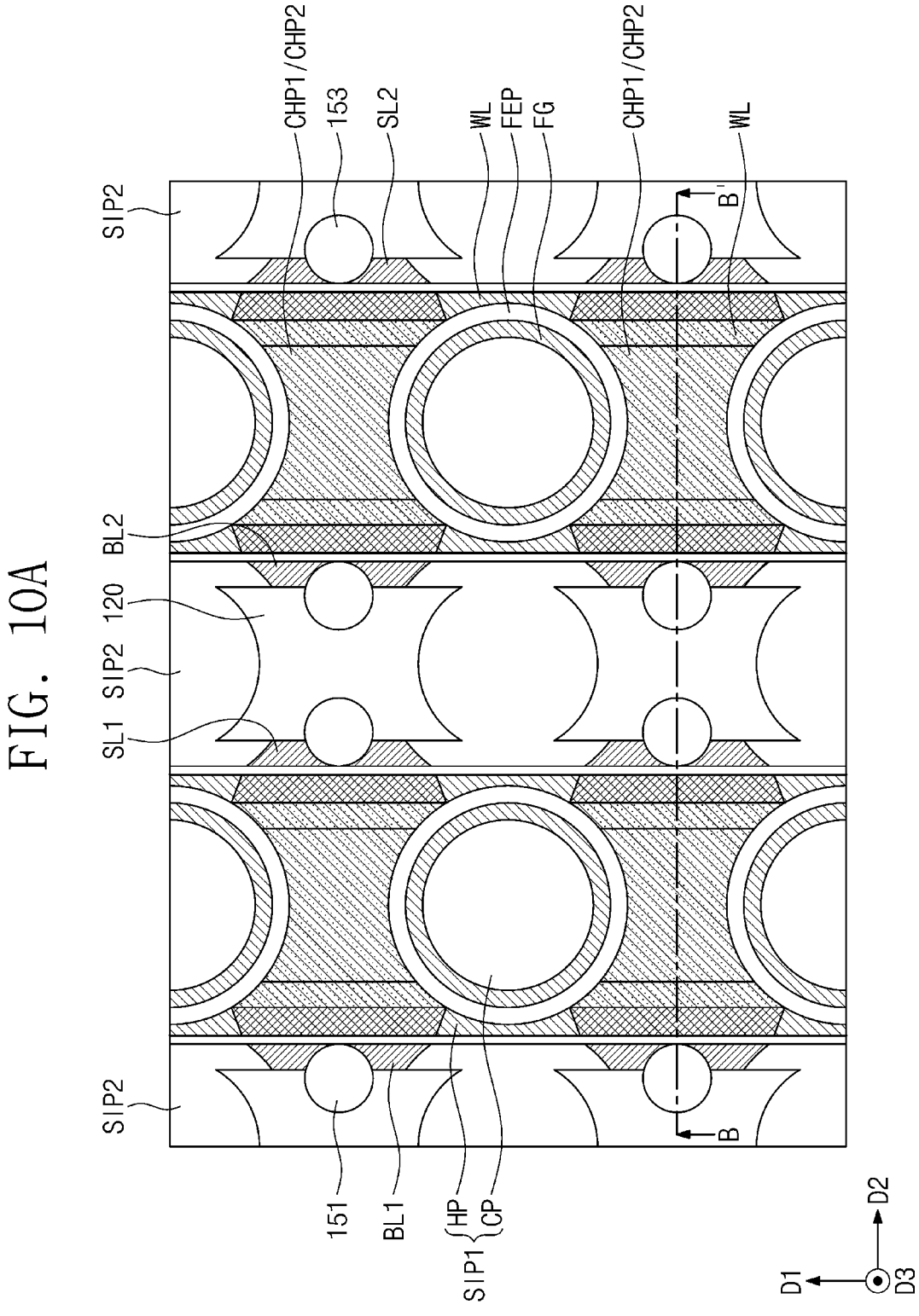
FIG. 10A is a plan view of a semiconductor memory device according to an embodiment of the inventive concept.
Figure 10B:
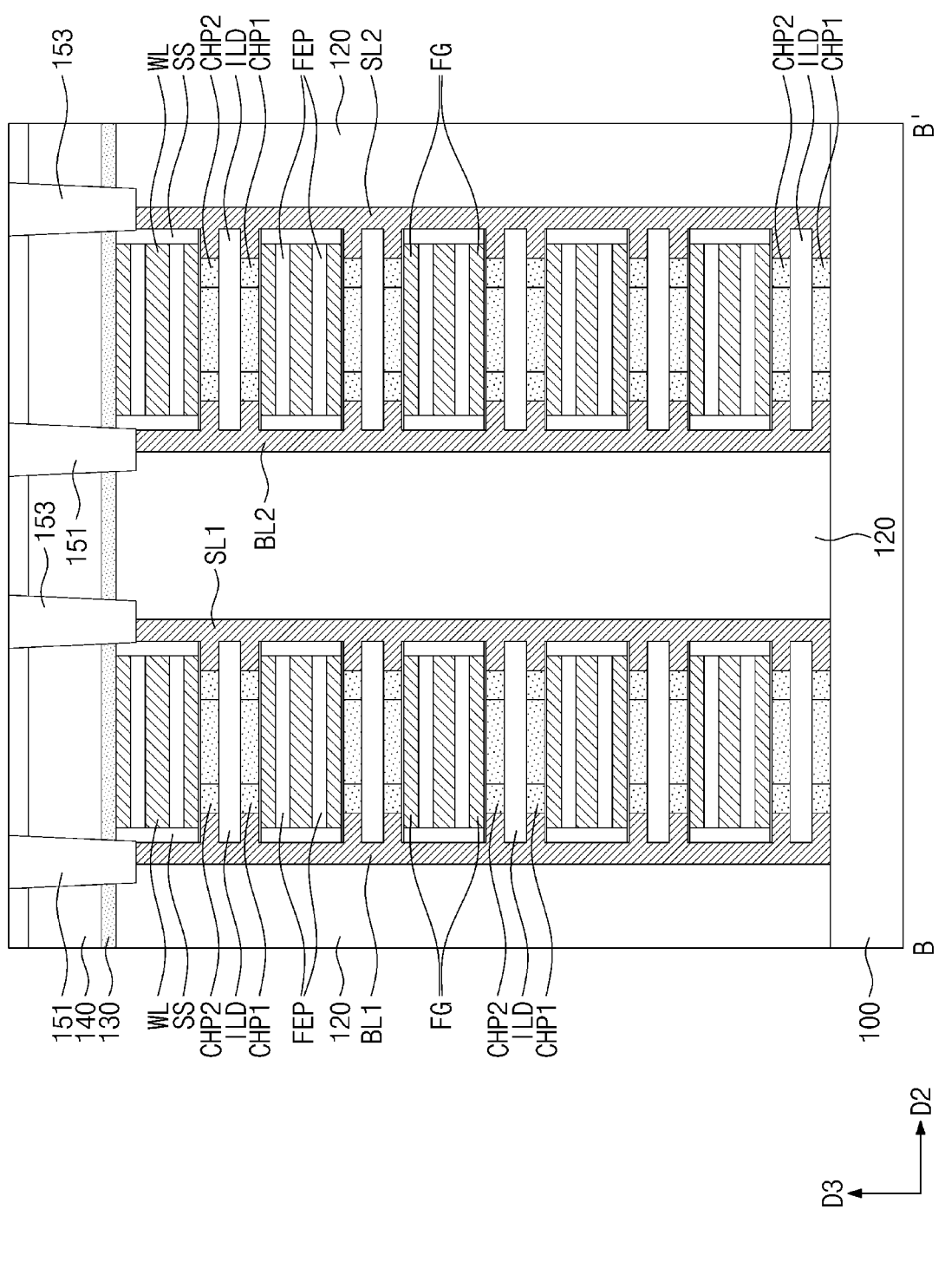
FIG. 10B is a sectional view taken along a line B-B' of FIG. 10A of a semiconductor memory device according to an embodiment of the inventive concept.

FIG. 10A is a plan view of a semiconductor memory device according to an embodiment of the inventive concept. FIG. 10B is a sectional view taken along a line B-B' of FIG. 10A of a semiconductor memory device according to an embodiment of the inventive concept.

In an embodiment shown in FIGS. 10A and 10B, each of the first vertical insulating pillars SIP1 have a uniform diameter and a circular pillar shape that extends in the third direction D3. For example, each of the first vertical insulating pillars SIP1 has only a vertical portion, but not a horizontal portion. A length of the first and second channel patterns CHP1 and CHP2 in the second direction D2 is less than a line width of the word line WL and is less than a diameter of the data storage pattern FEP.

Furthermore, each of the bit lines BL1 and BL2 includes horizontal portions that protrude in the second direction D2 and are in contact with the first and second channel patterns CHP1 and CHP2. The horizontal portions of the bit lines BL1 and BL2 overlap the word lines WL in the third direction D3. Similarly, each of the source lines SL1 and SL2 includes horizontal portions that protrude in the second direction D2 and are in contact with the first and second channel patterns CHP1 and CHP2. The horizontal portions of the source lines SL1 and SL2 overlap the word lines WL in the third direction.

Figure 11:
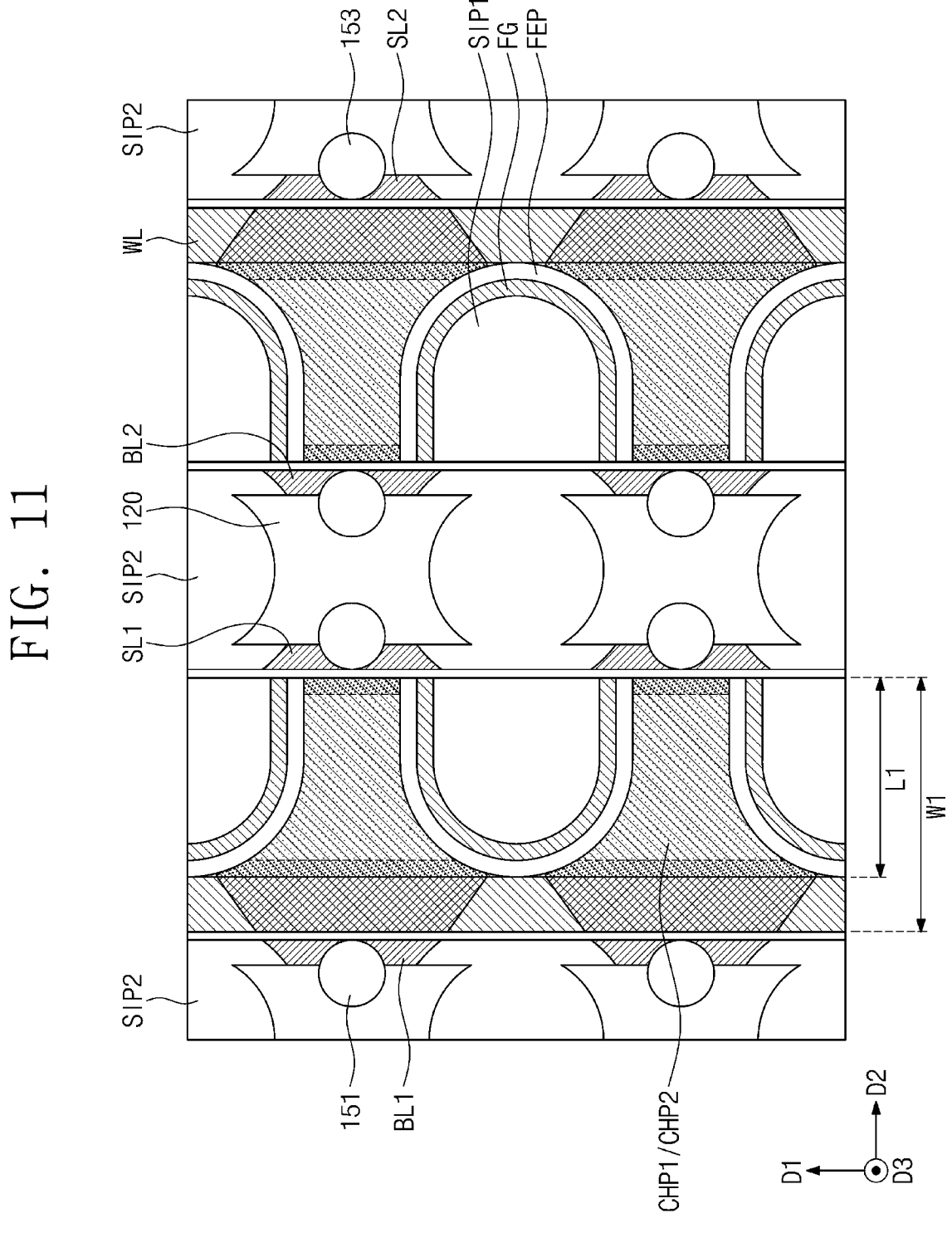
FIG. 11 is a plan view of a semiconductor memory device according to an embodiment of the inventive concept.

FIG. 11 is a plan view of a semiconductor memory device according to an embodiment of the inventive concept.

In an embodiment shown in FIG. 11, first vertical insulating pillars SIP1 that are adjacent to each other in the second direction D2 have a mirror symmetry with respect to each other. In addition, a length L1 of the first and second channel patterns CHP1 and CHP2 in the second direction D2 is less than a line width W1 of the word line WL.

Each of the bit lines BL1 and BL2 includes horizontal portions that protrude in the second direction D2 and are in contact with the first and second channel patterns CHP1 and CHP2. By contrast, the source lines SL1 and SL2 do not have horizontal portions, and the first and second channel patterns CHP1 and CHP2 are in contact with side walls of the source lines SL1 and SL2.

Figure 12A:
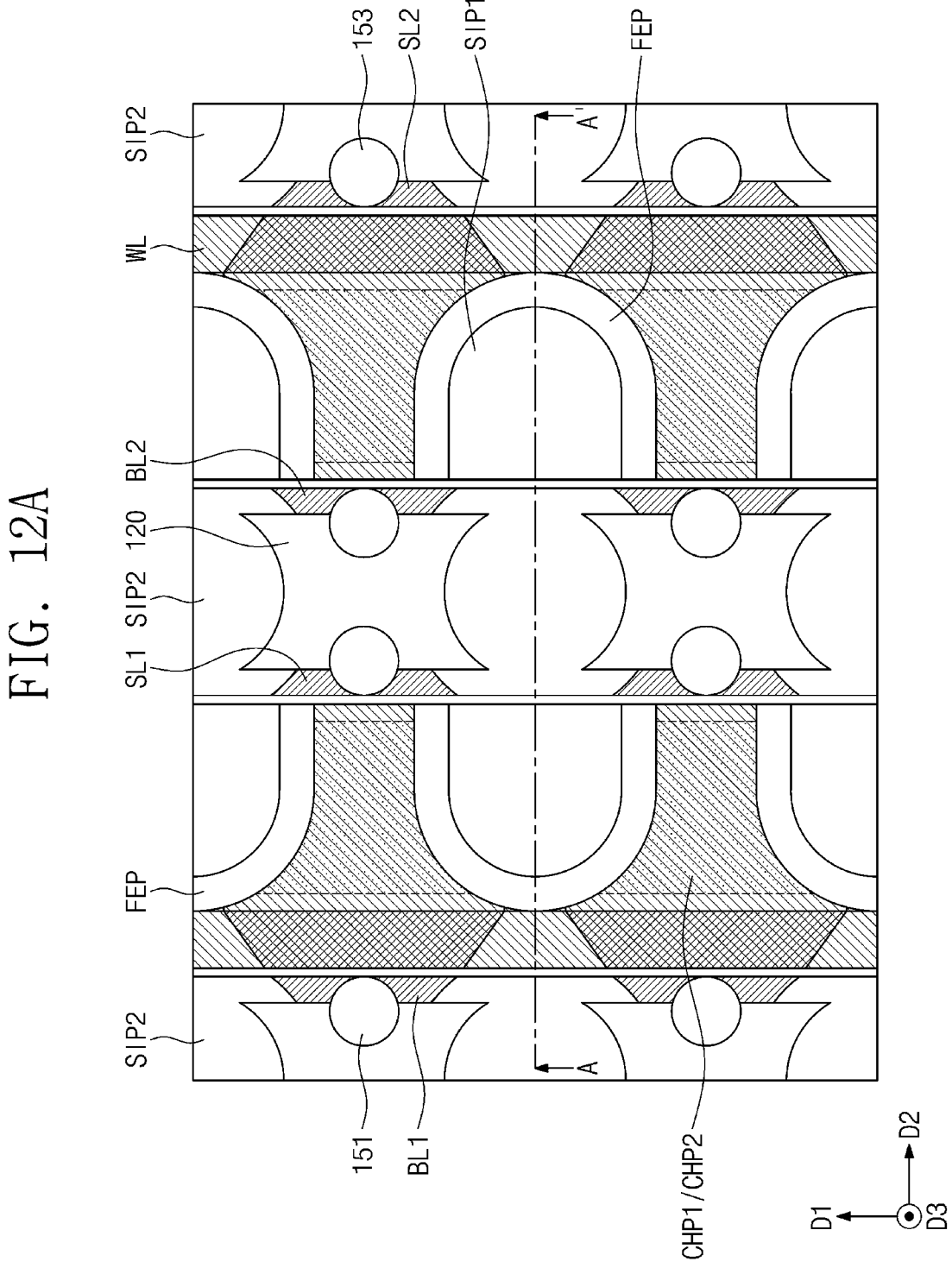
FIG. 12A is a plan view of a semiconductor memory device according to an embodiment of the inventive concept.
Figure 12B:
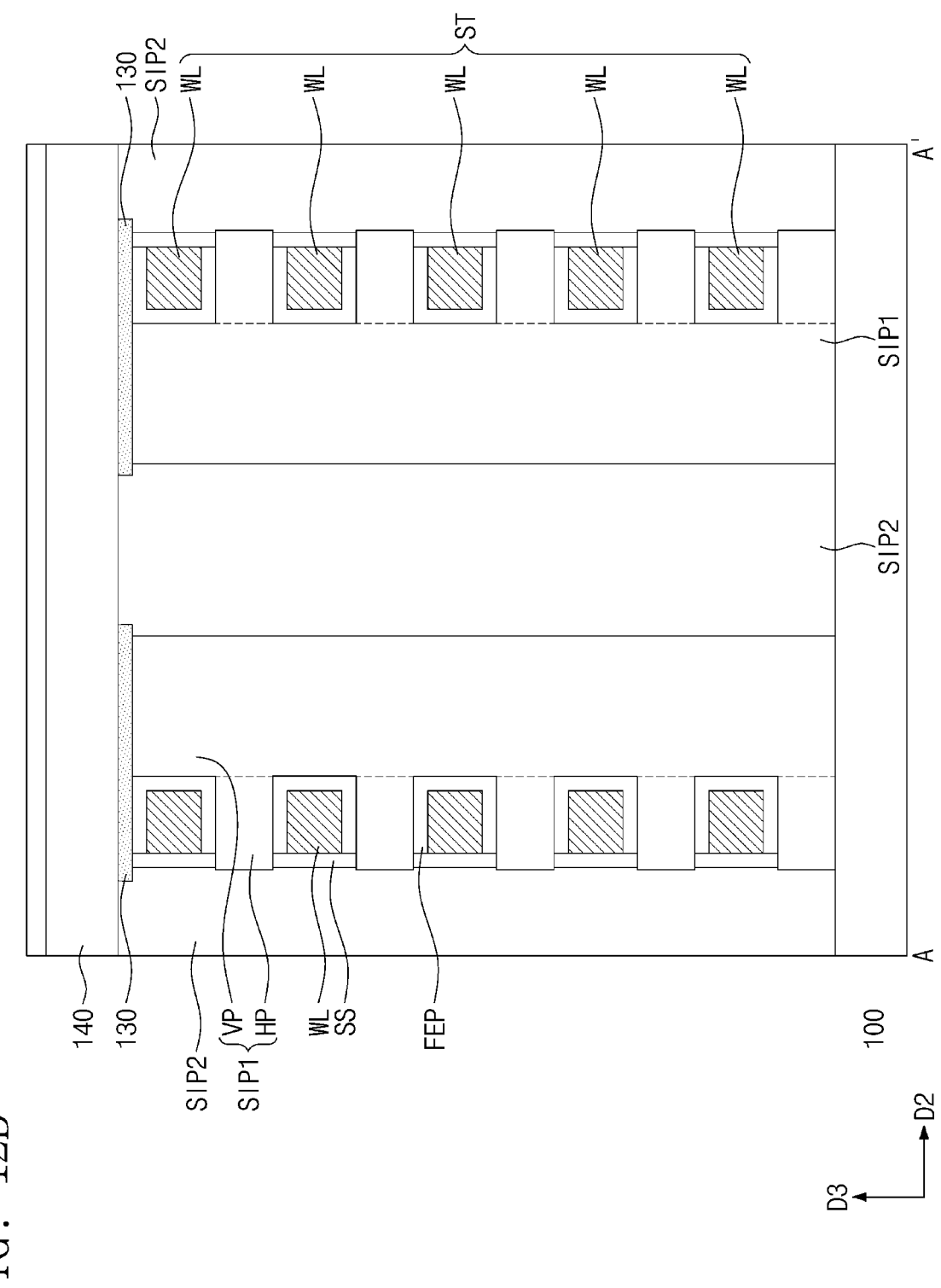
FIG. 12B is a sectional view taken along a line A-A' of FIG. 12A of a semiconductor memory device according to an embodiment of the inventive concept.

FIG. 12A is a plan view of a semiconductor memory device according to an embodiment of the inventive concept. FIG. 12B is a sectional view taken along a line A-A' of FIG. 12A of a semiconductor memory device according to an embodiment of the inventive concept.

In an embodiment shown in FIGS. 12A and 12B, first vertical insulating pillars SIP1 that are adjacent to each other in the second direction D2 have a mirror symmetry with respect to each other. In addition, a length of the first and second channel patterns CHP1 and CHP2 in the second direction D2 is less than a line width of the word line WL.

Referring to FIGS. 12A and 12B, in an embodiment, the floating gates FG in other embodiments are omitted. For example, top and bottom surfaces of the data storage patterns FEP are in direct contact with the horizontal portions HP of the first vertical insulating pillars SIP1, and the data storage pattern FEP have a flat side surface that is in contact with the source lines SL1 or the bit lines BL2.

Figure 13A:
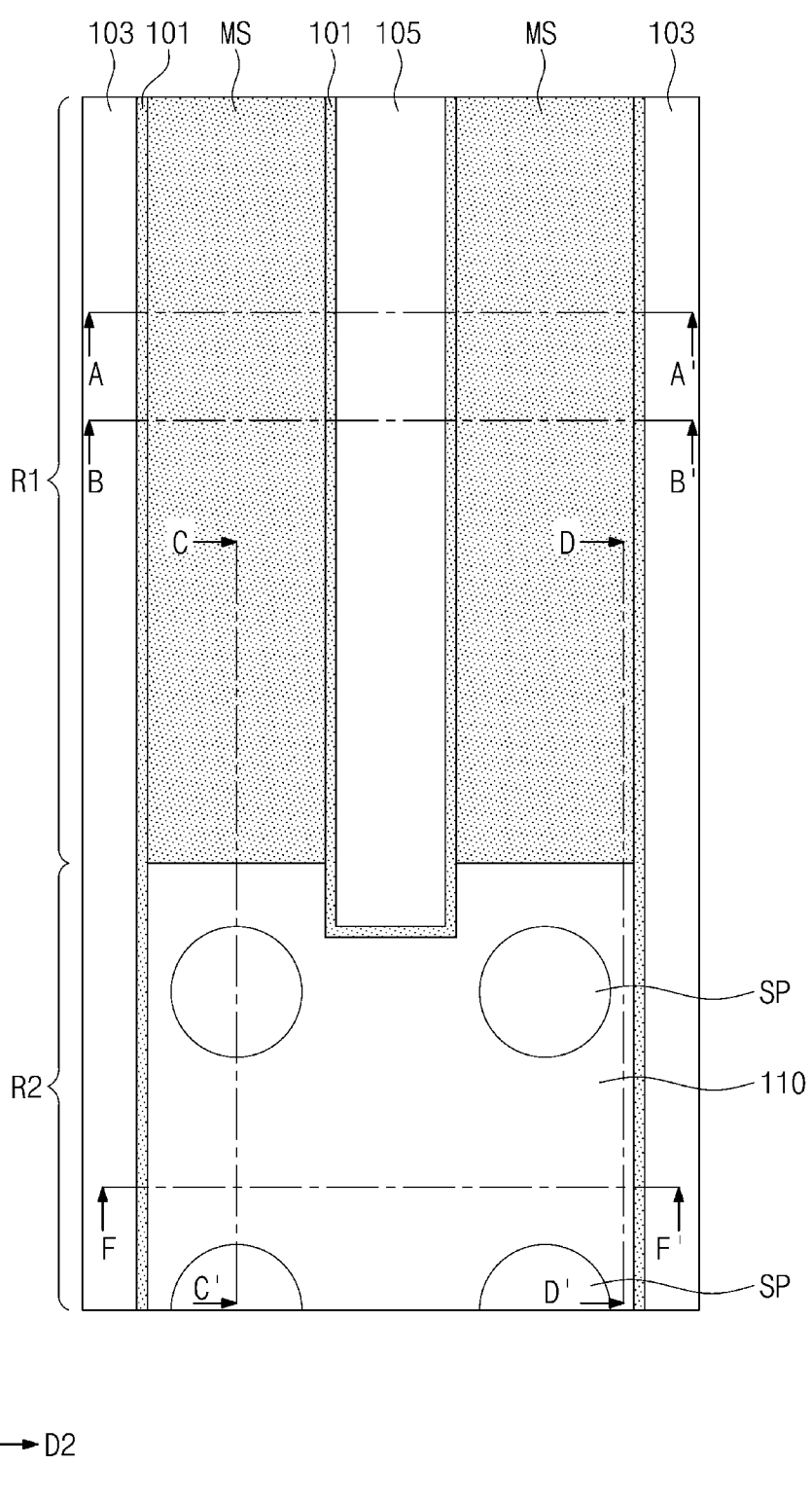
Figure 13B:
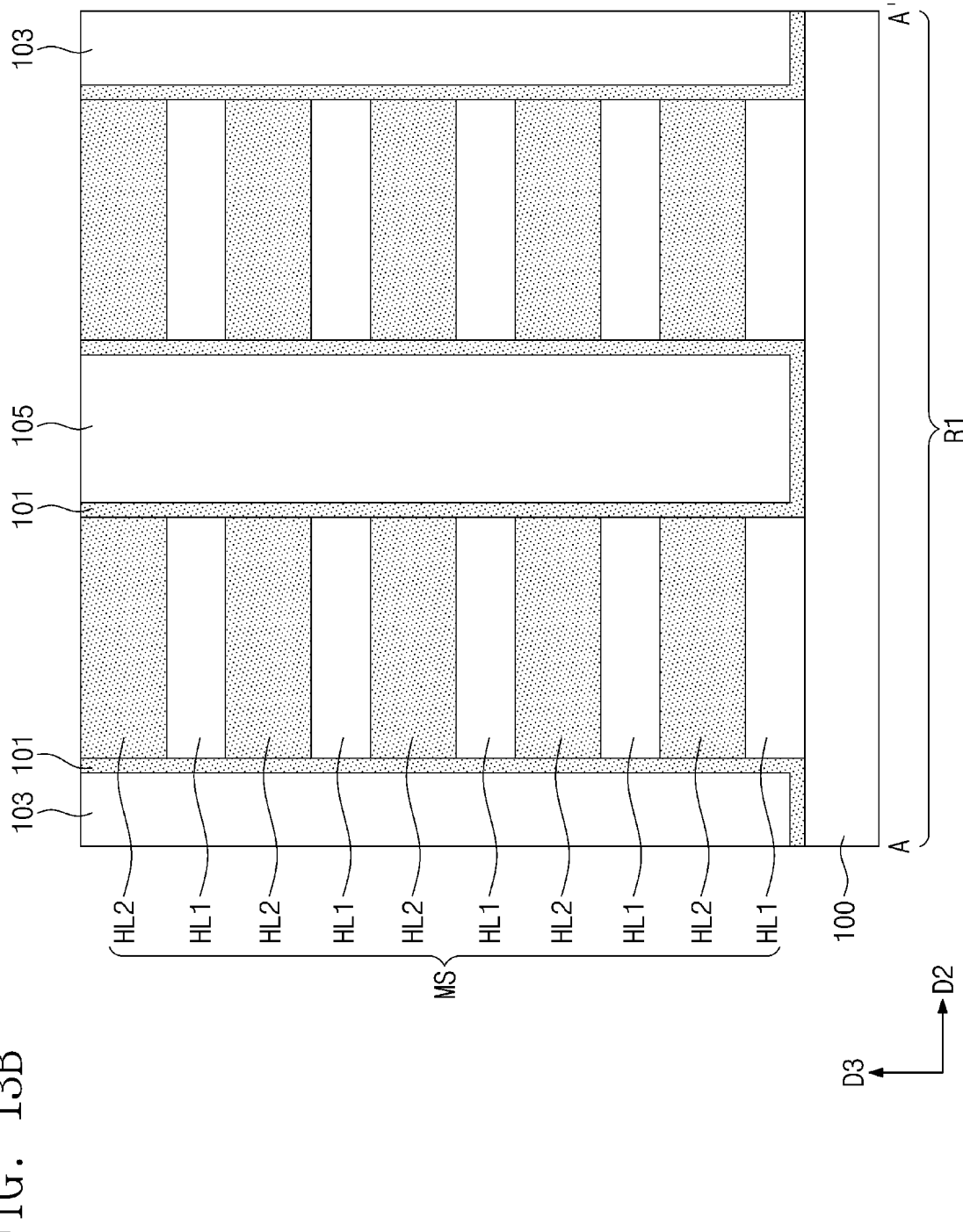
Figure 13C:
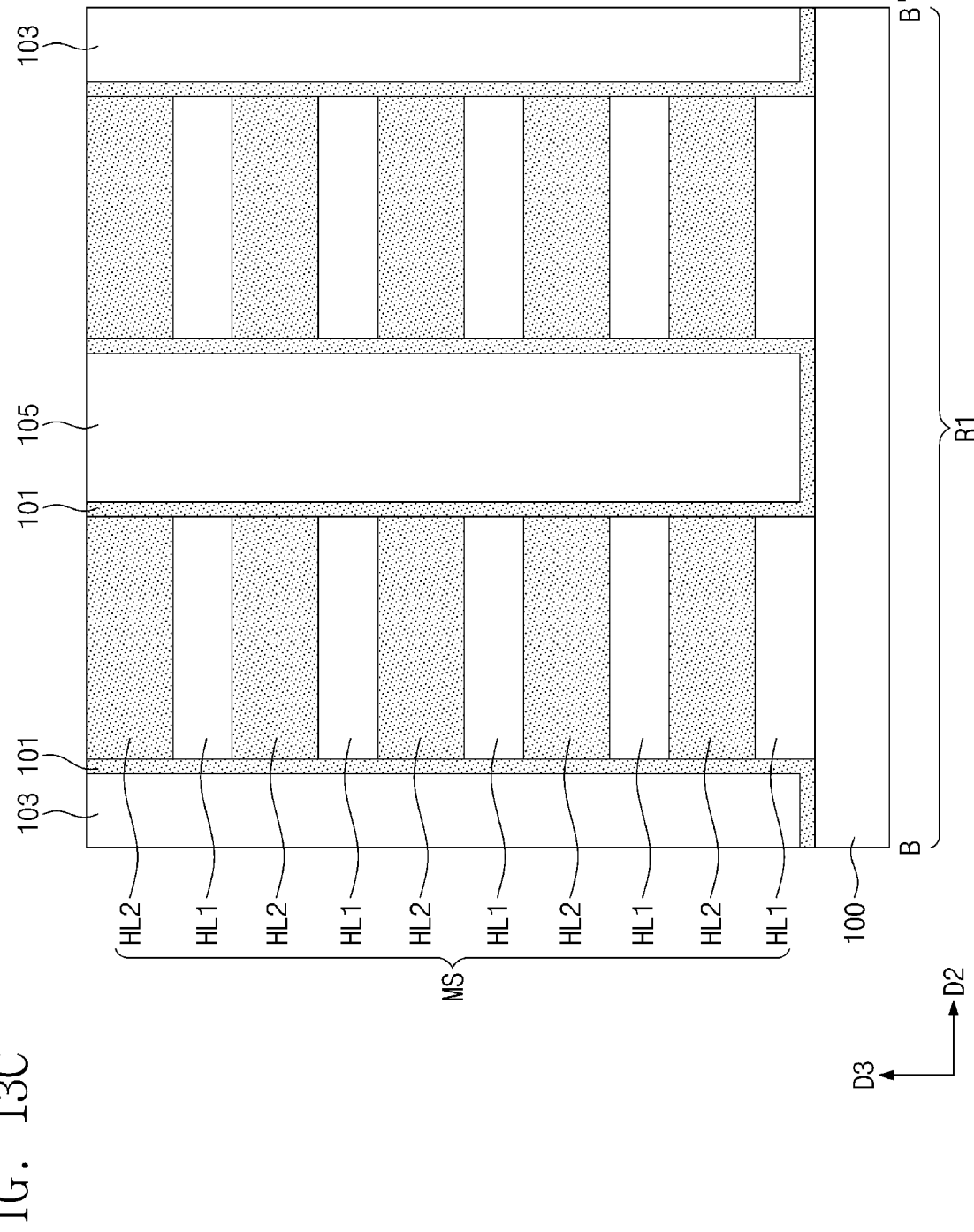
Figure 13D:
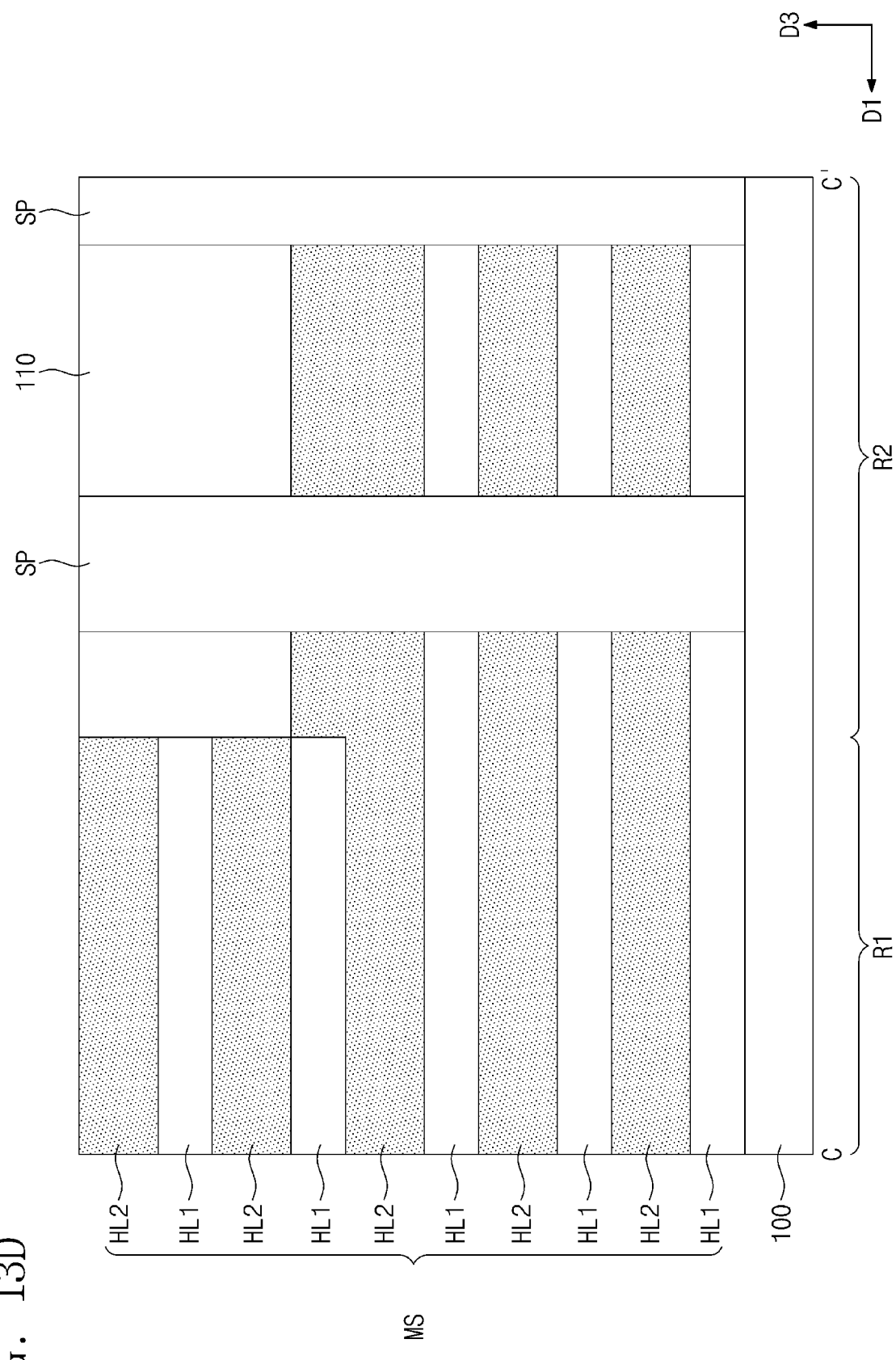
Figure 13E:
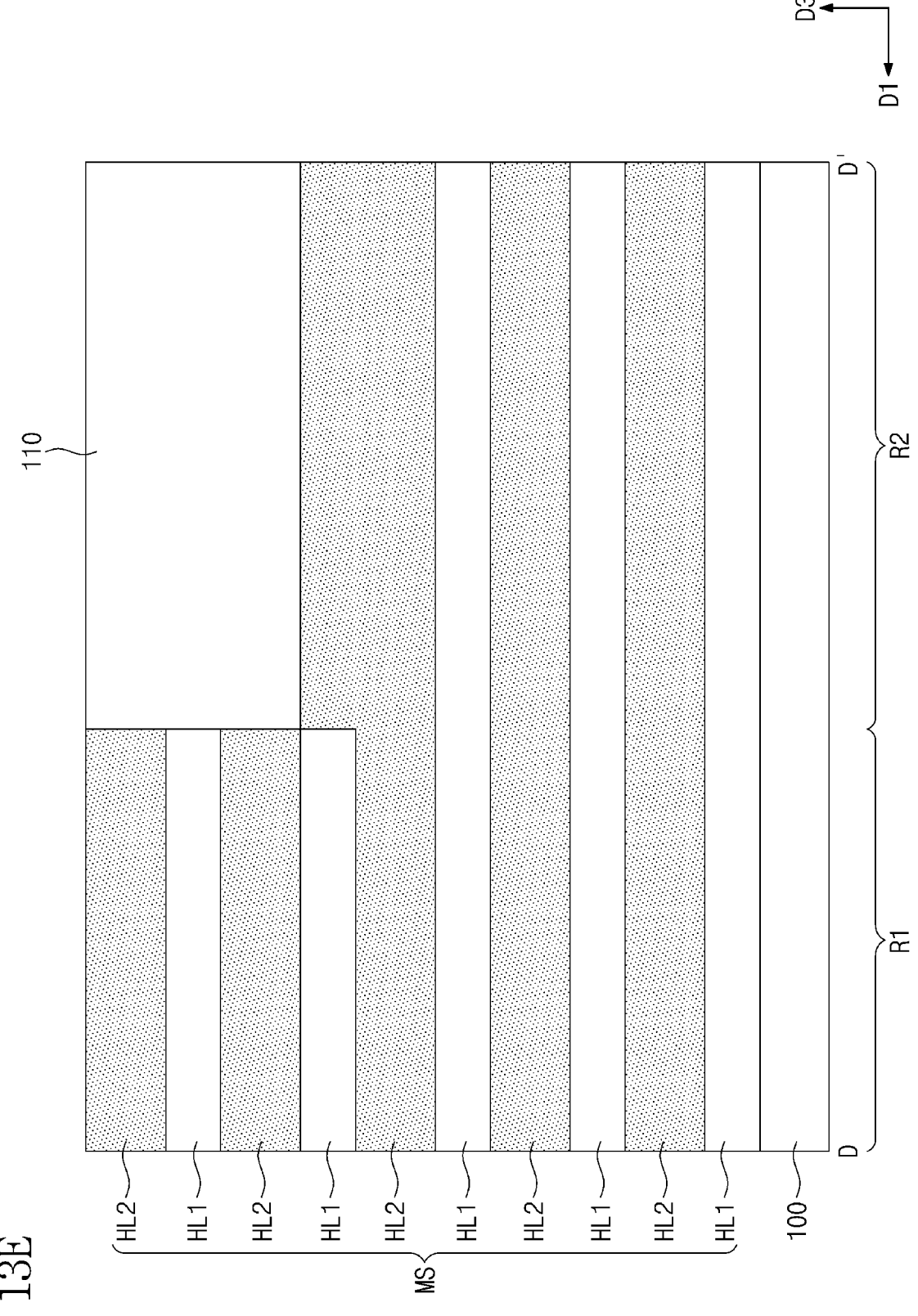
Figure 13F:
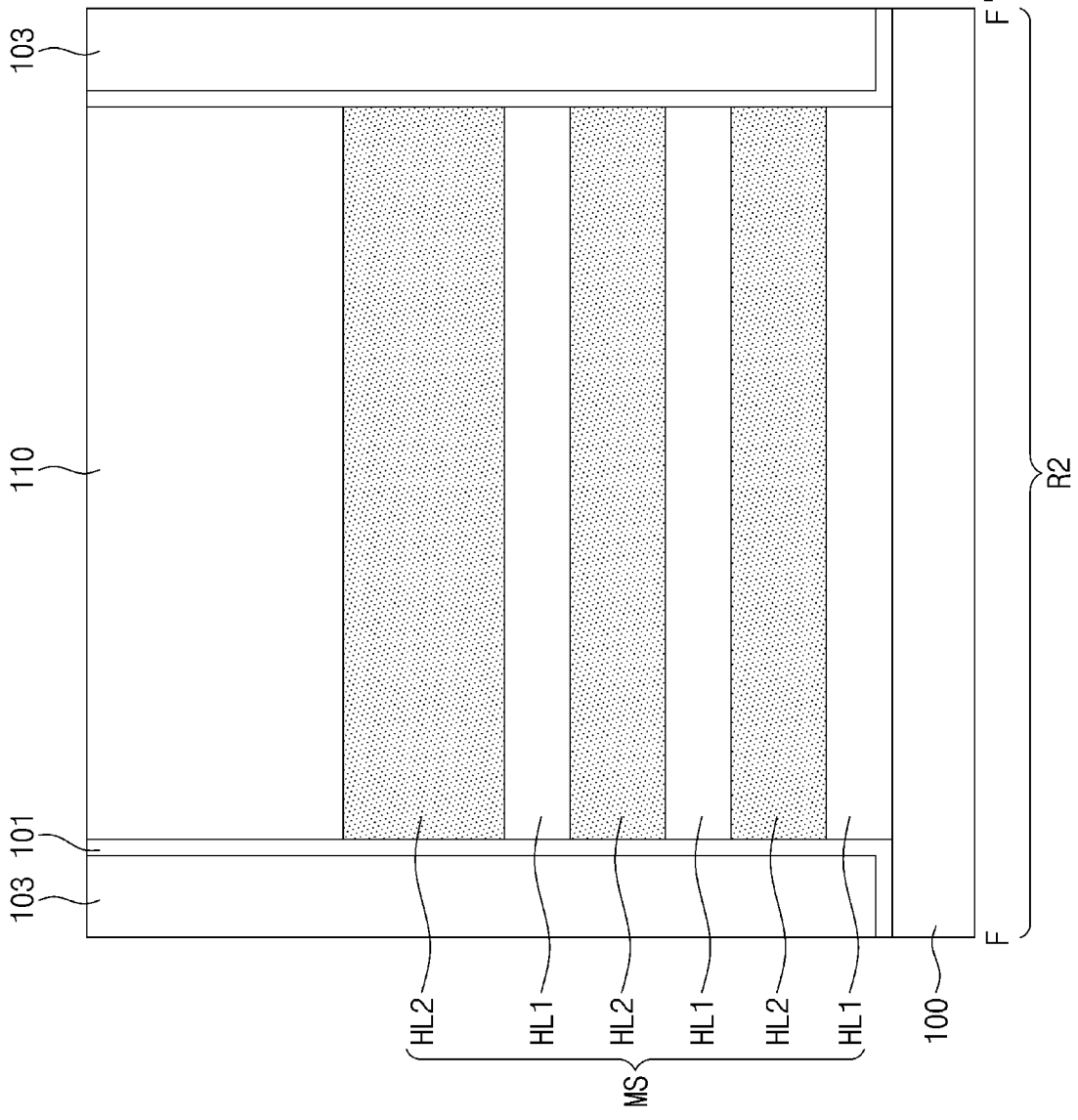
FIG. 13F is a sectional view taken along a line F-F' of FIG. 13A.
Figure 14A:
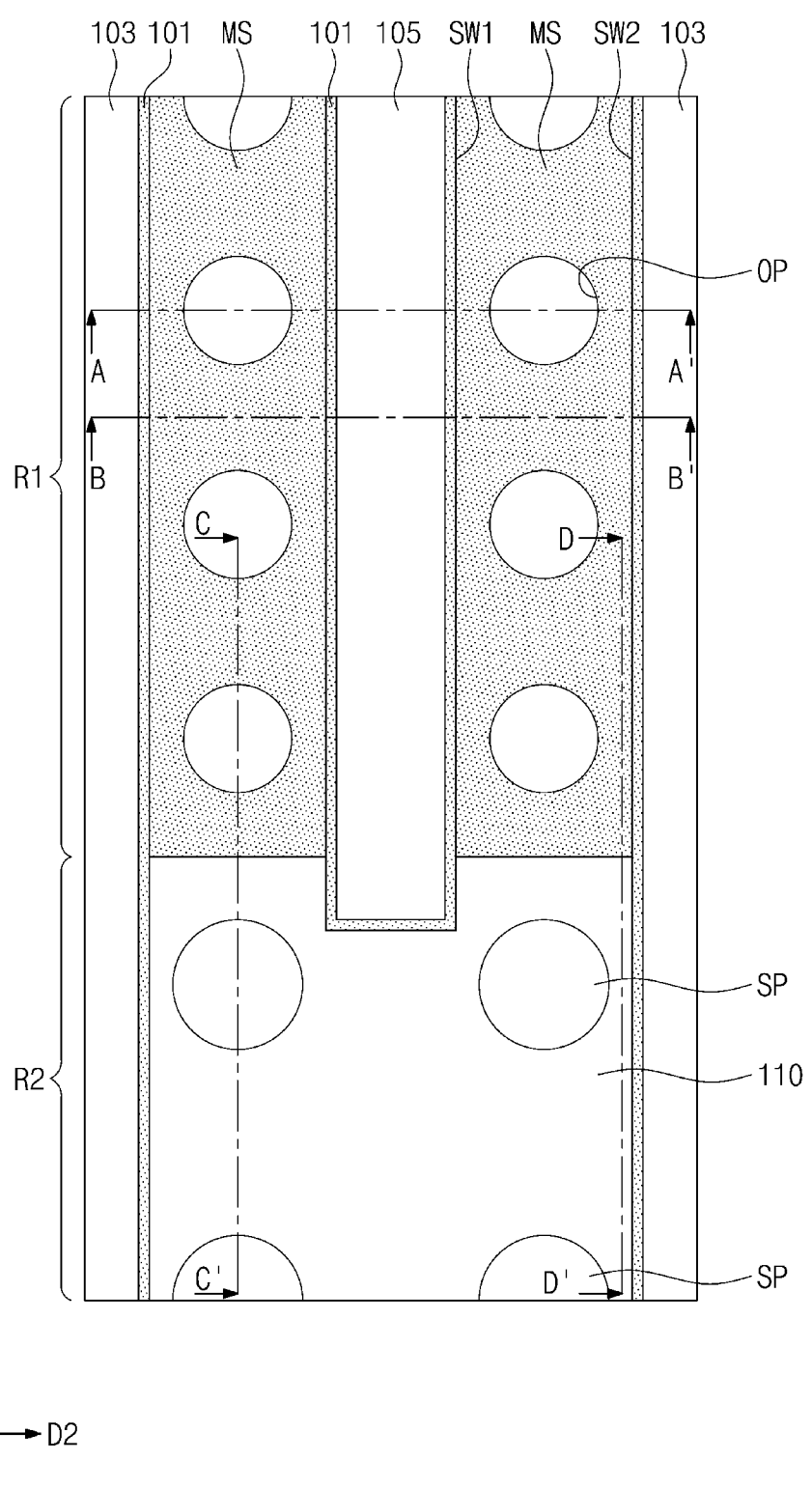
Figure 14B:
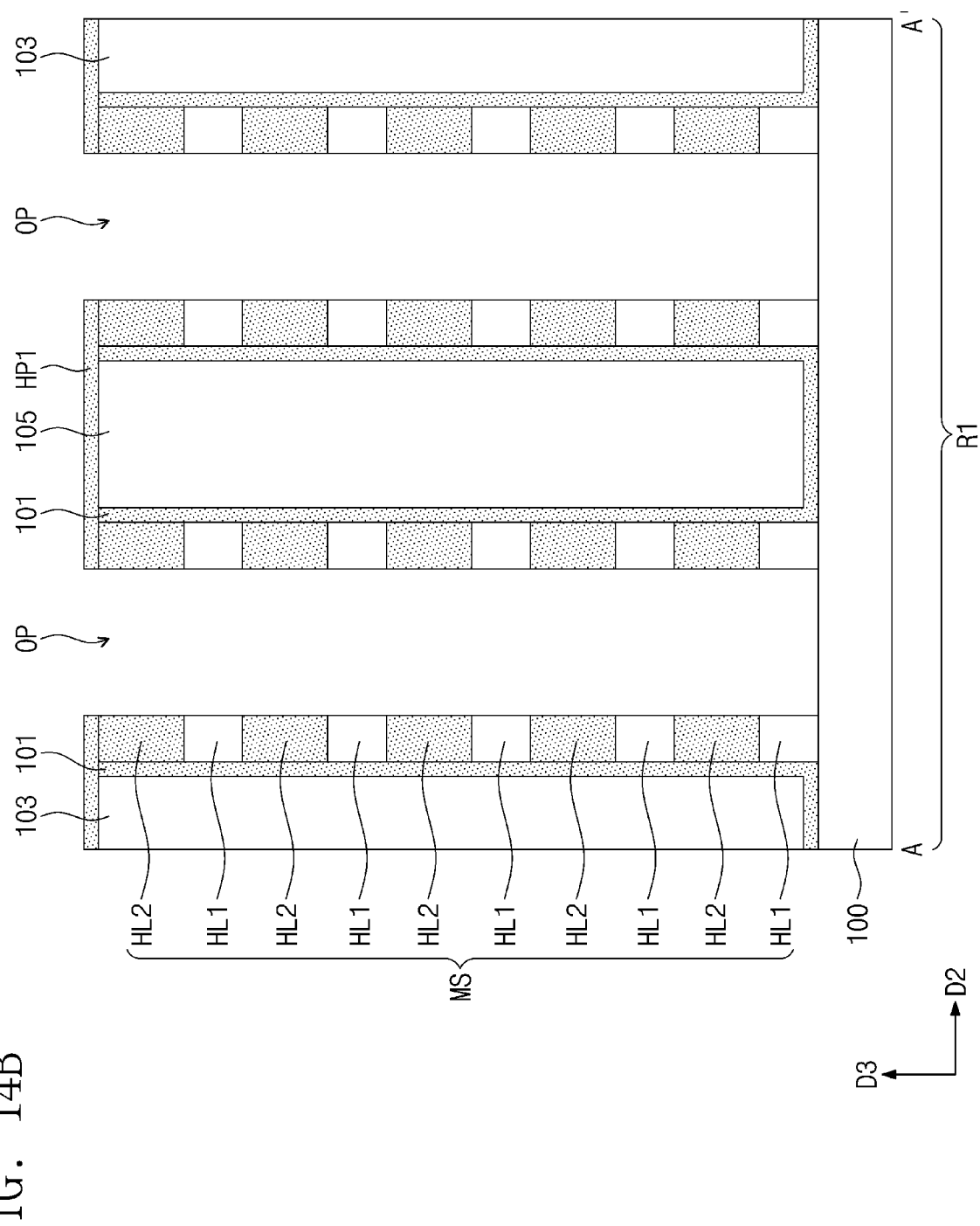
Figure 14C:
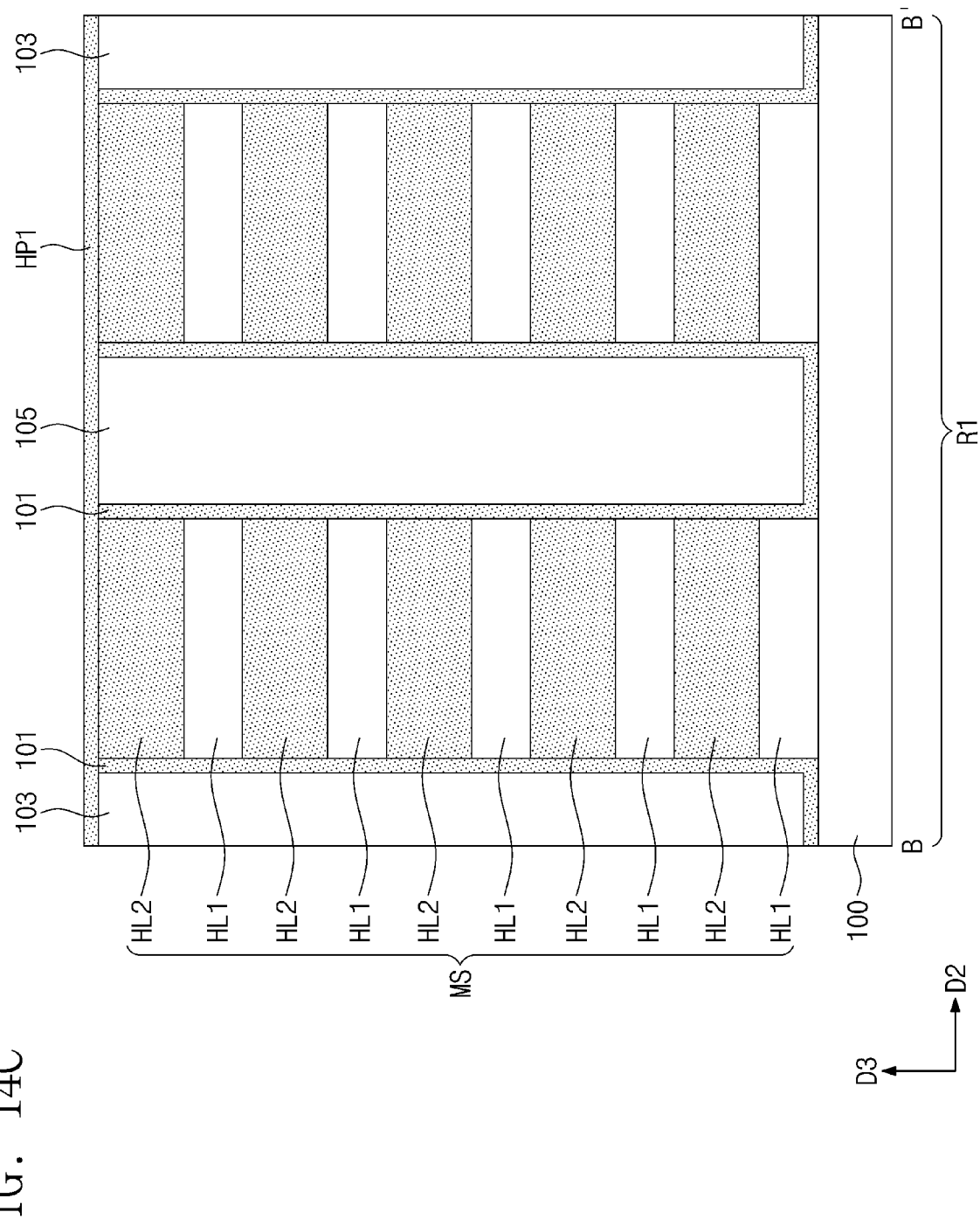
Figure 14D:
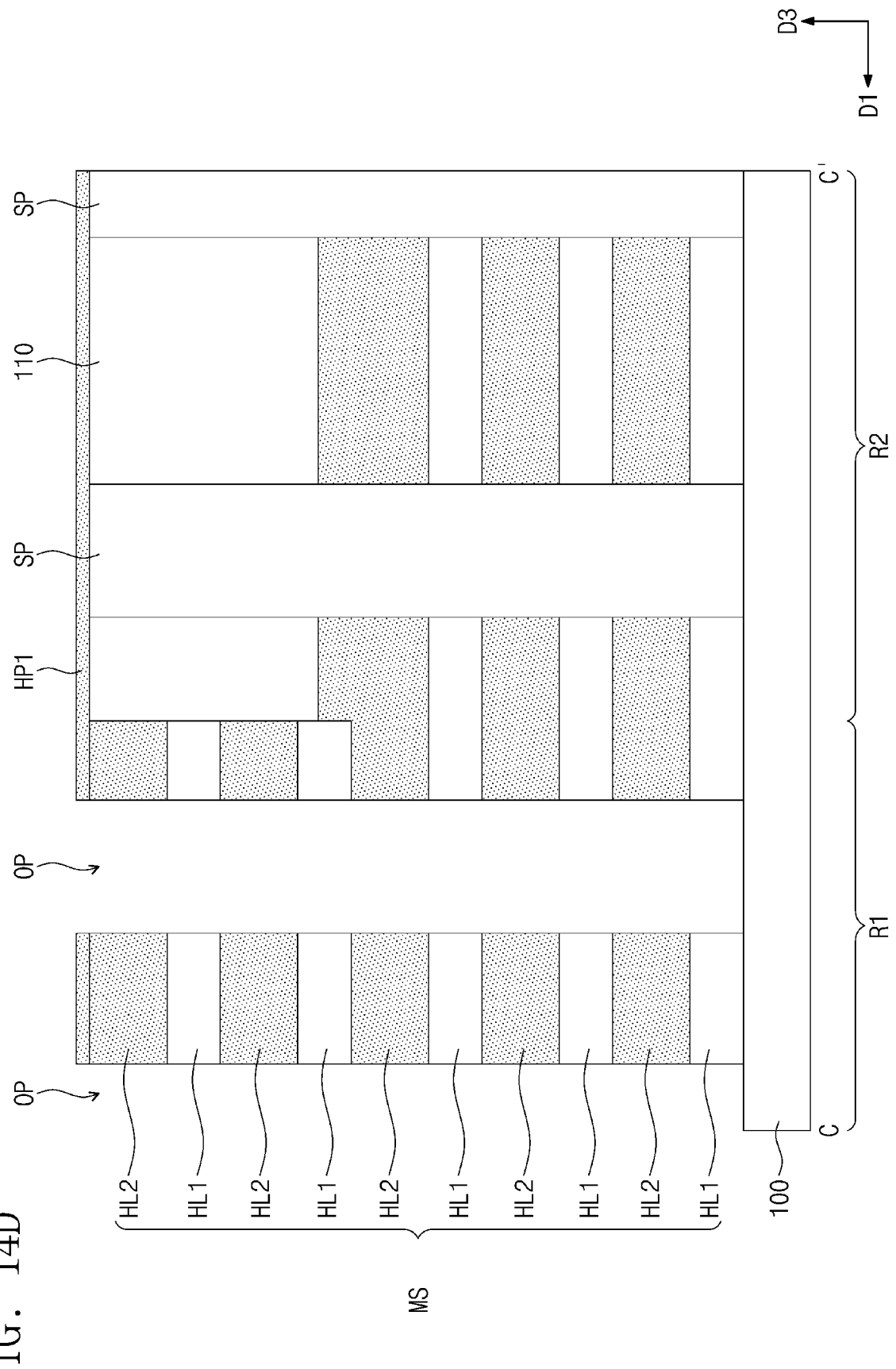
Figure 14E:
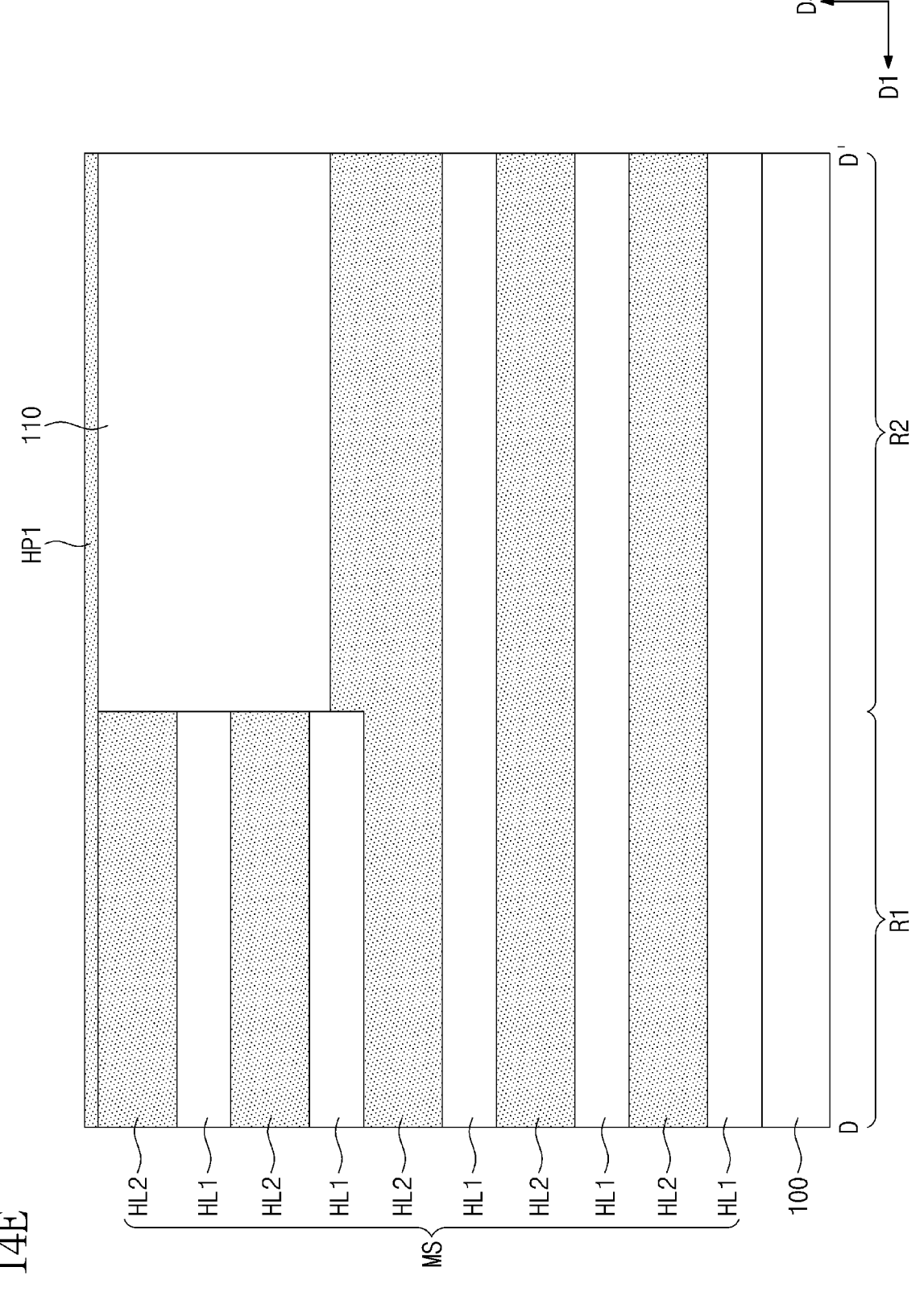
Figure 15A:
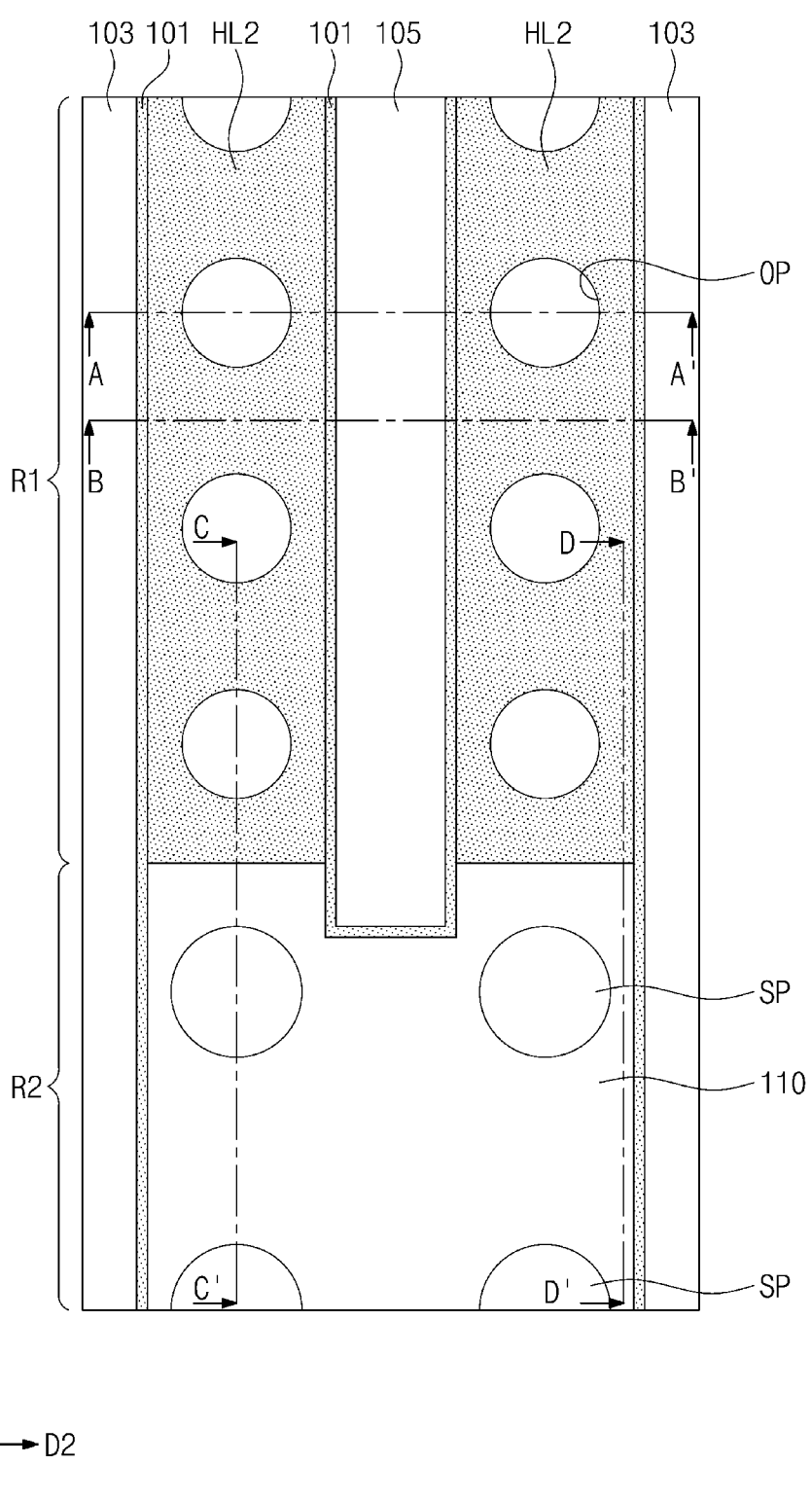
Figure 15B:
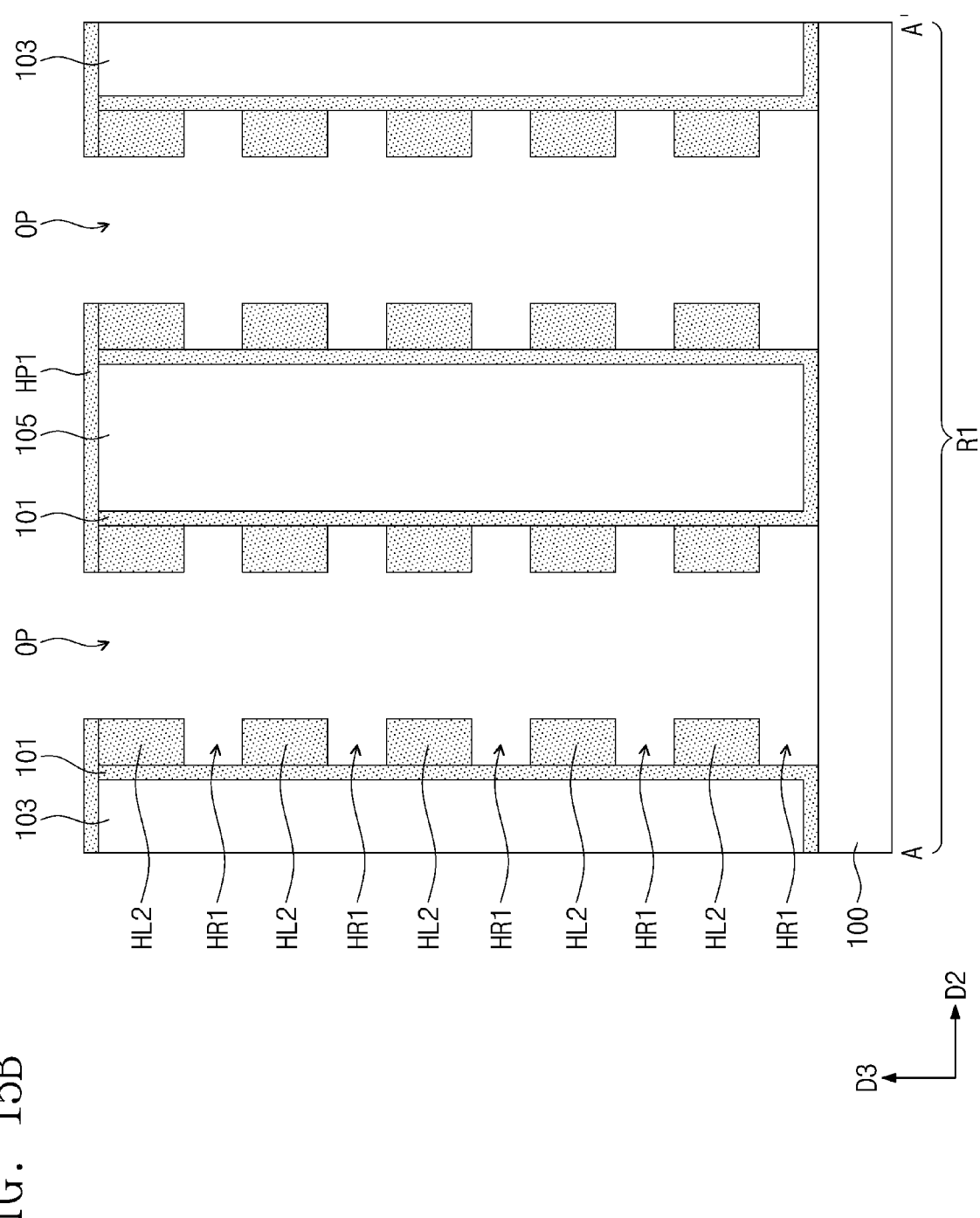
Figure 15C:
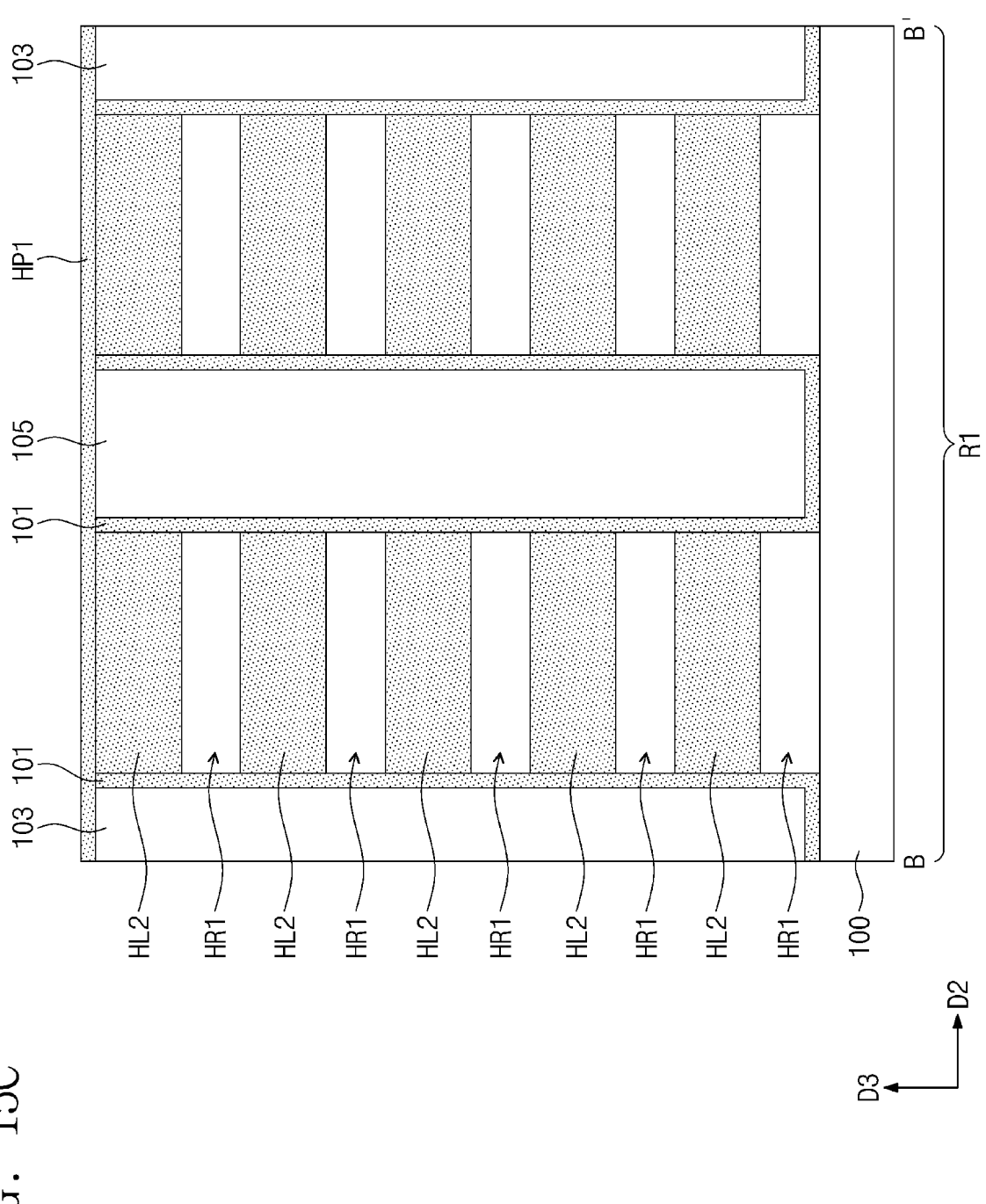
Figure 15D:
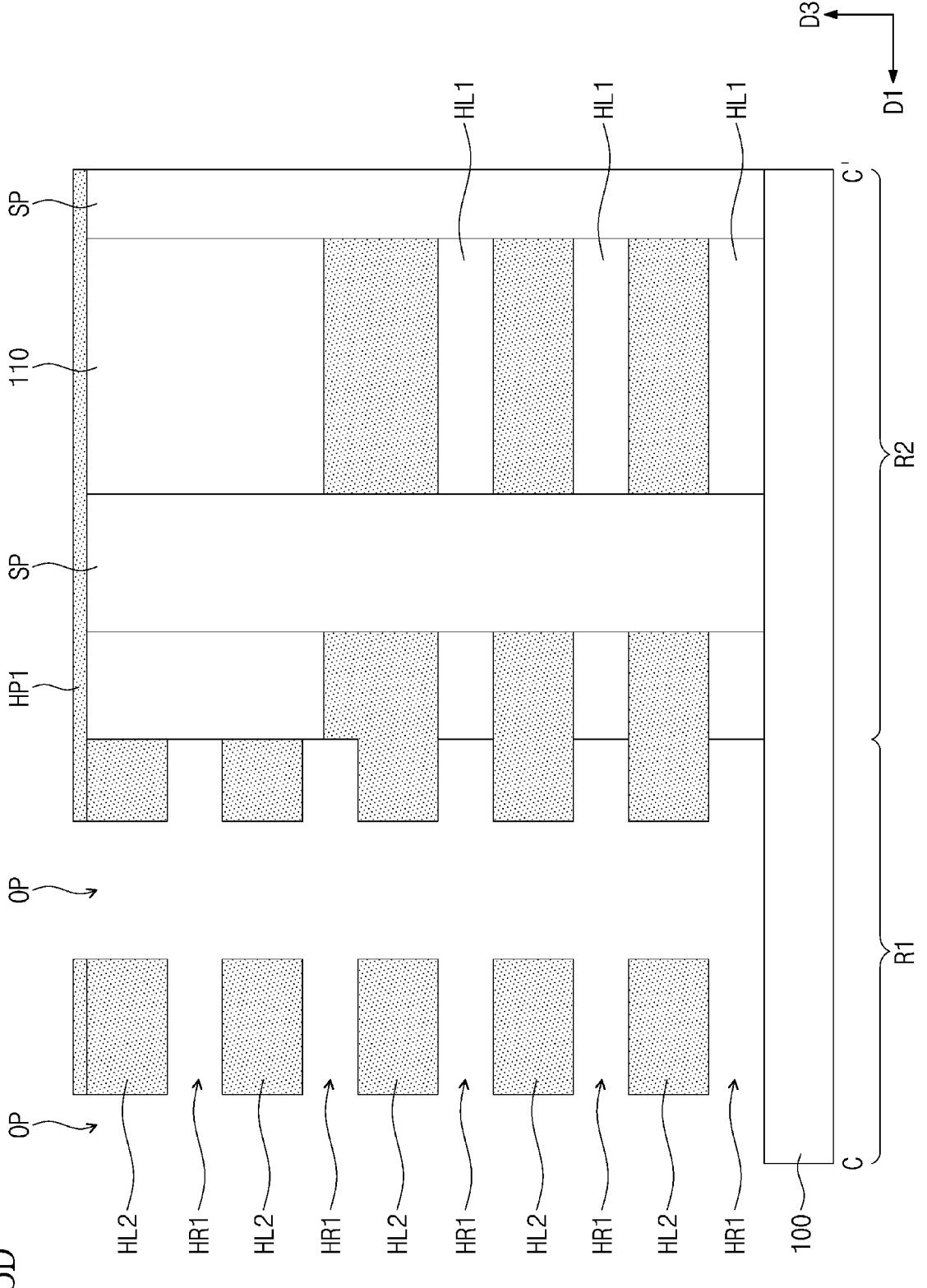
Figure 15E:
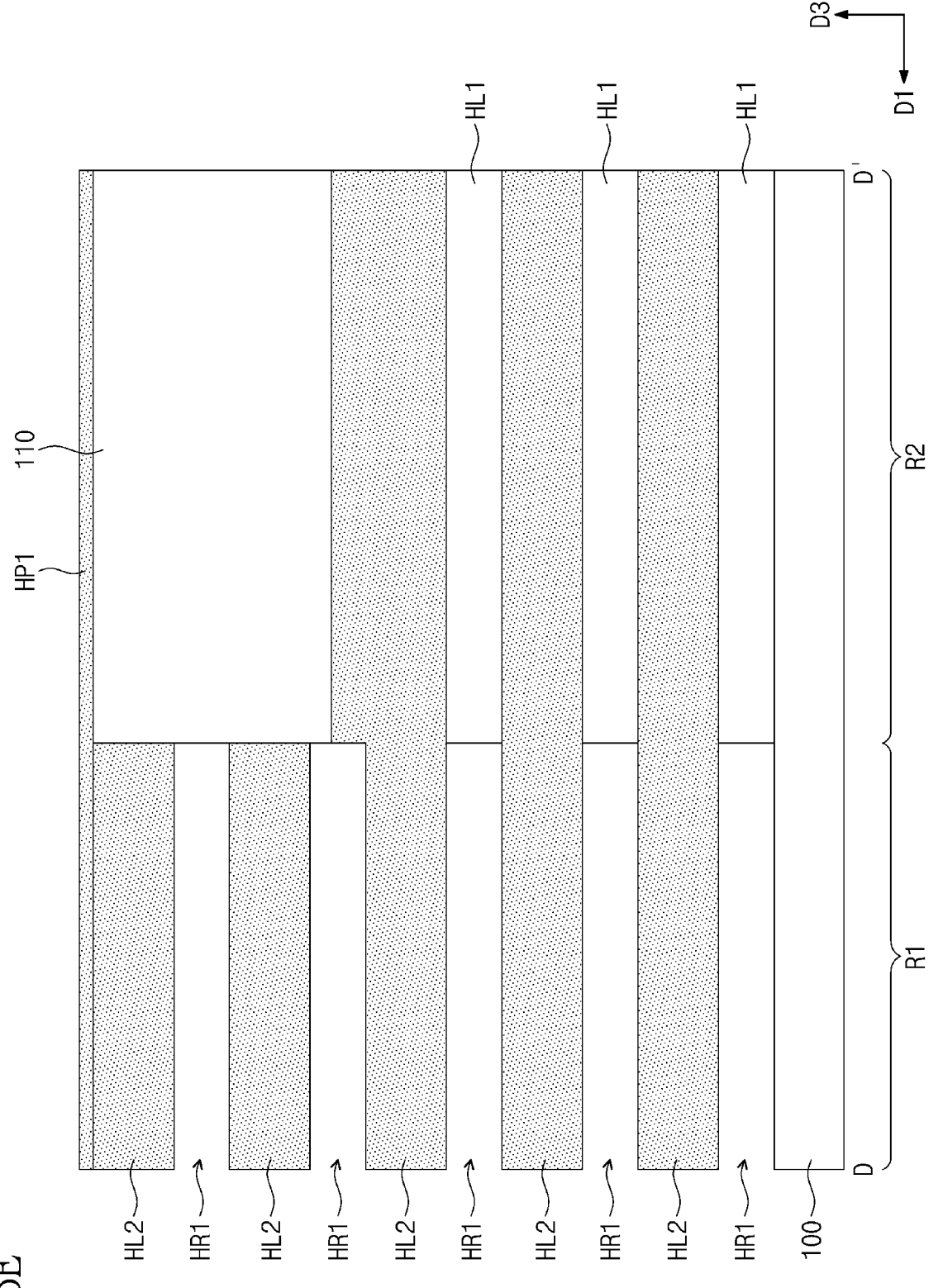
Figure 16A:
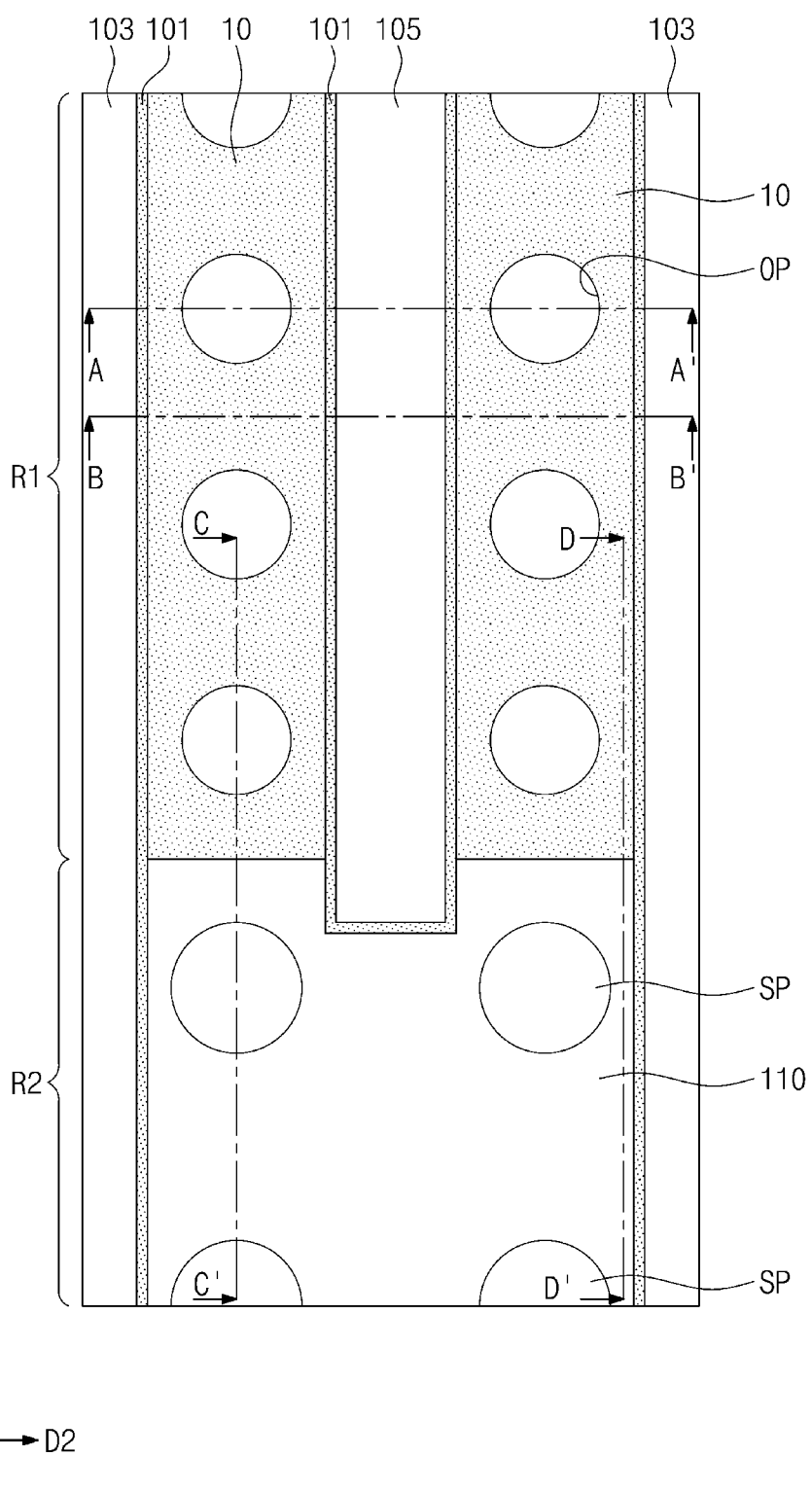
Figure 16B:
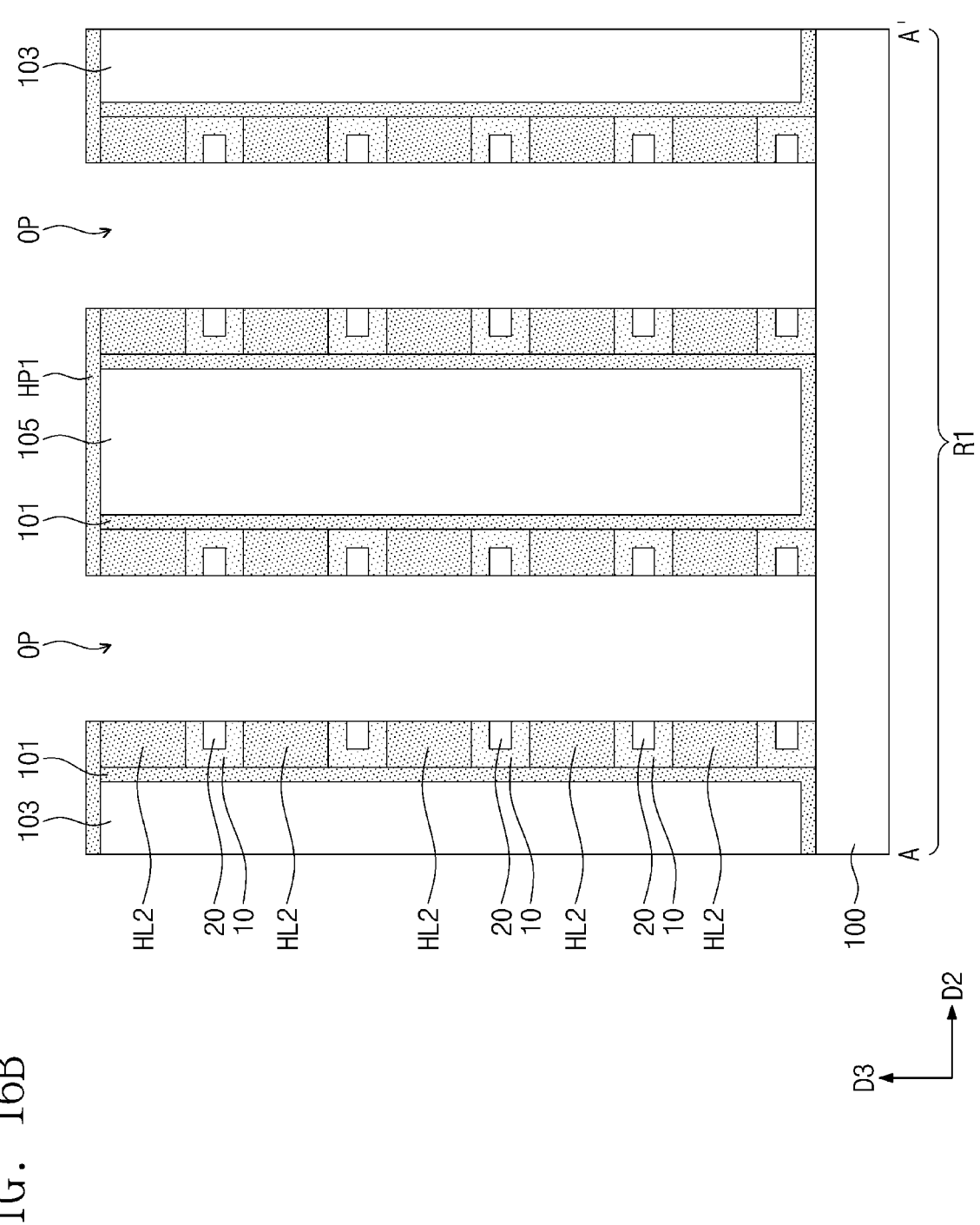
Figure 16C:
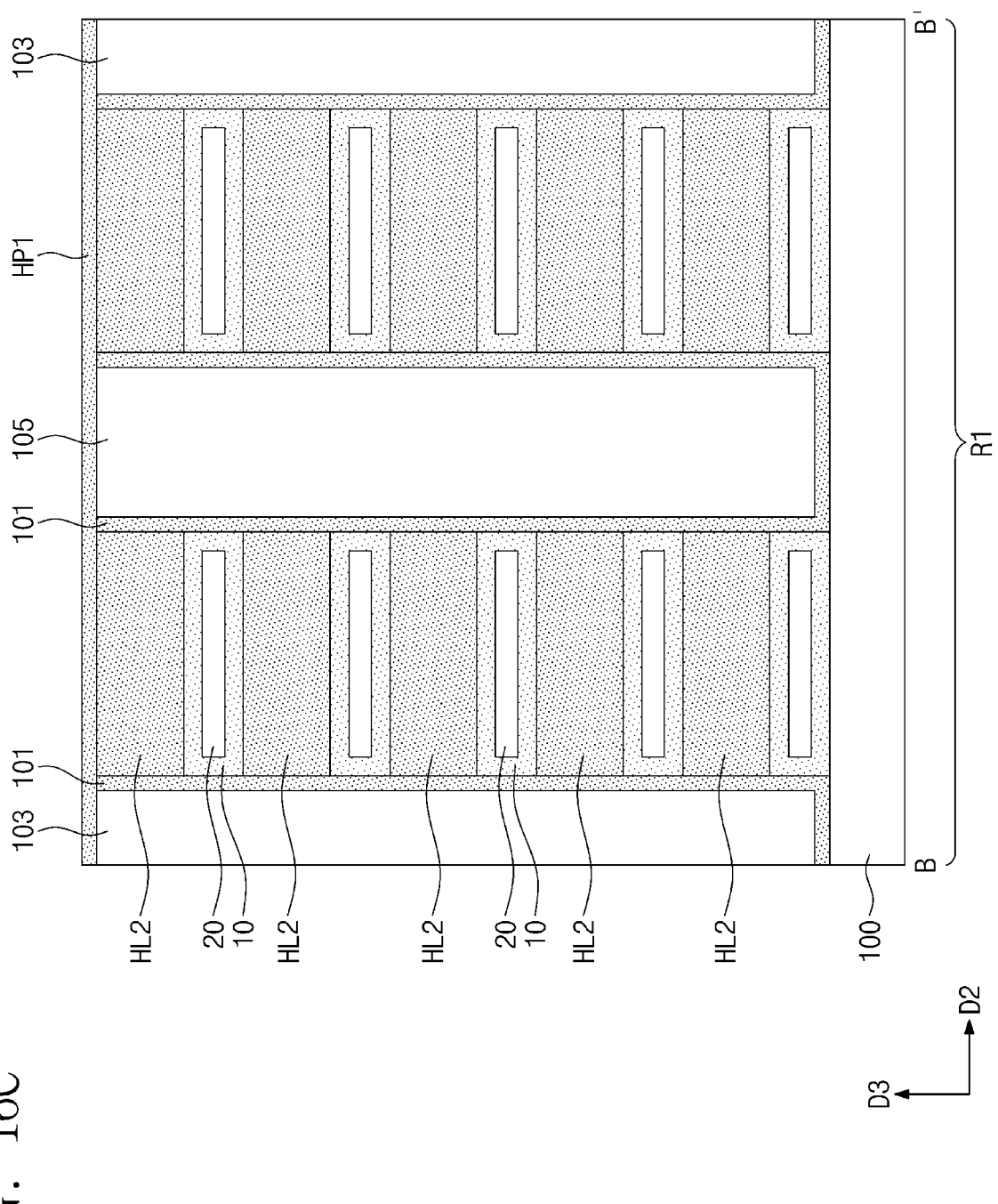
Figure 16D:
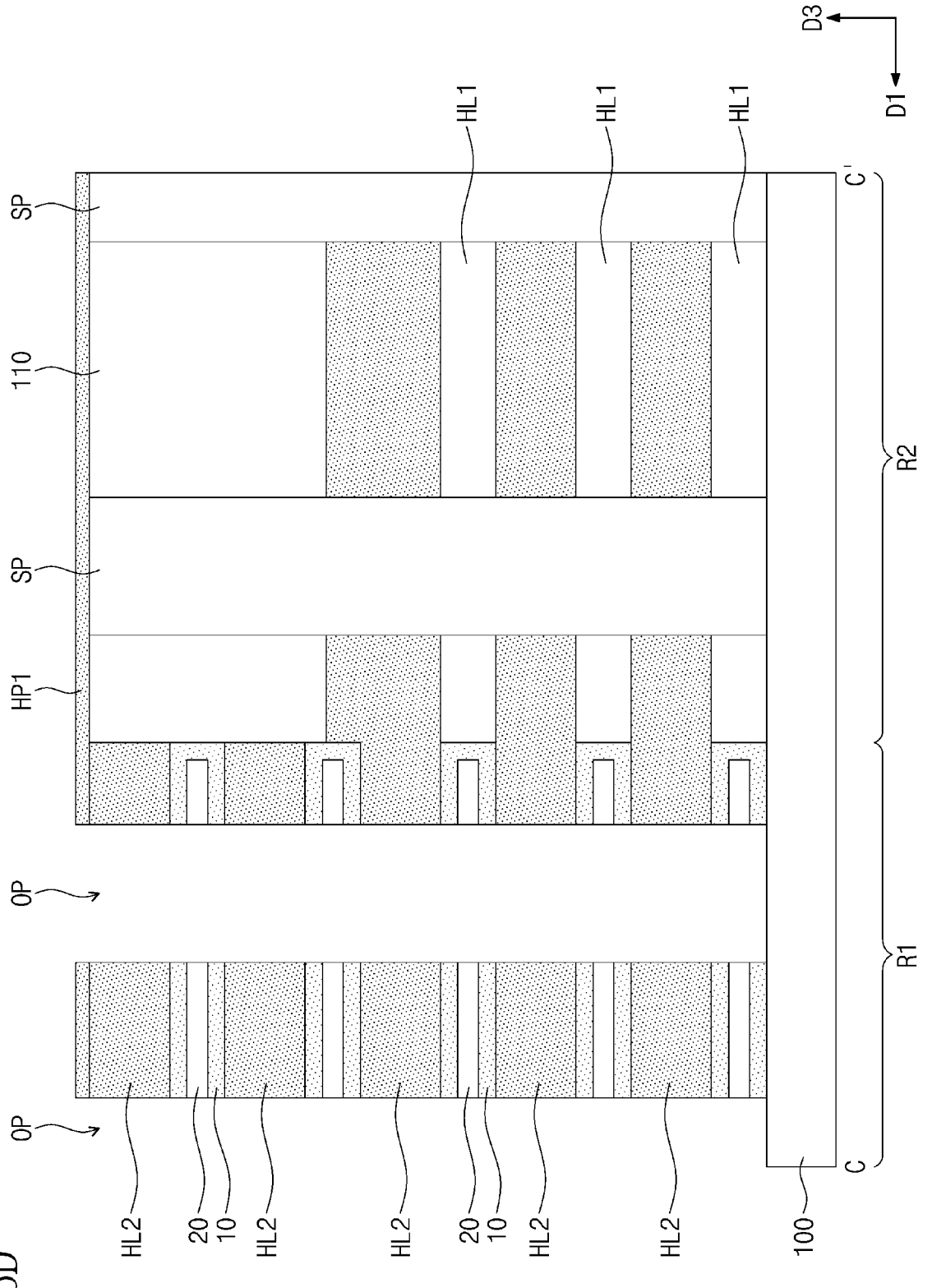
Figure 16E:
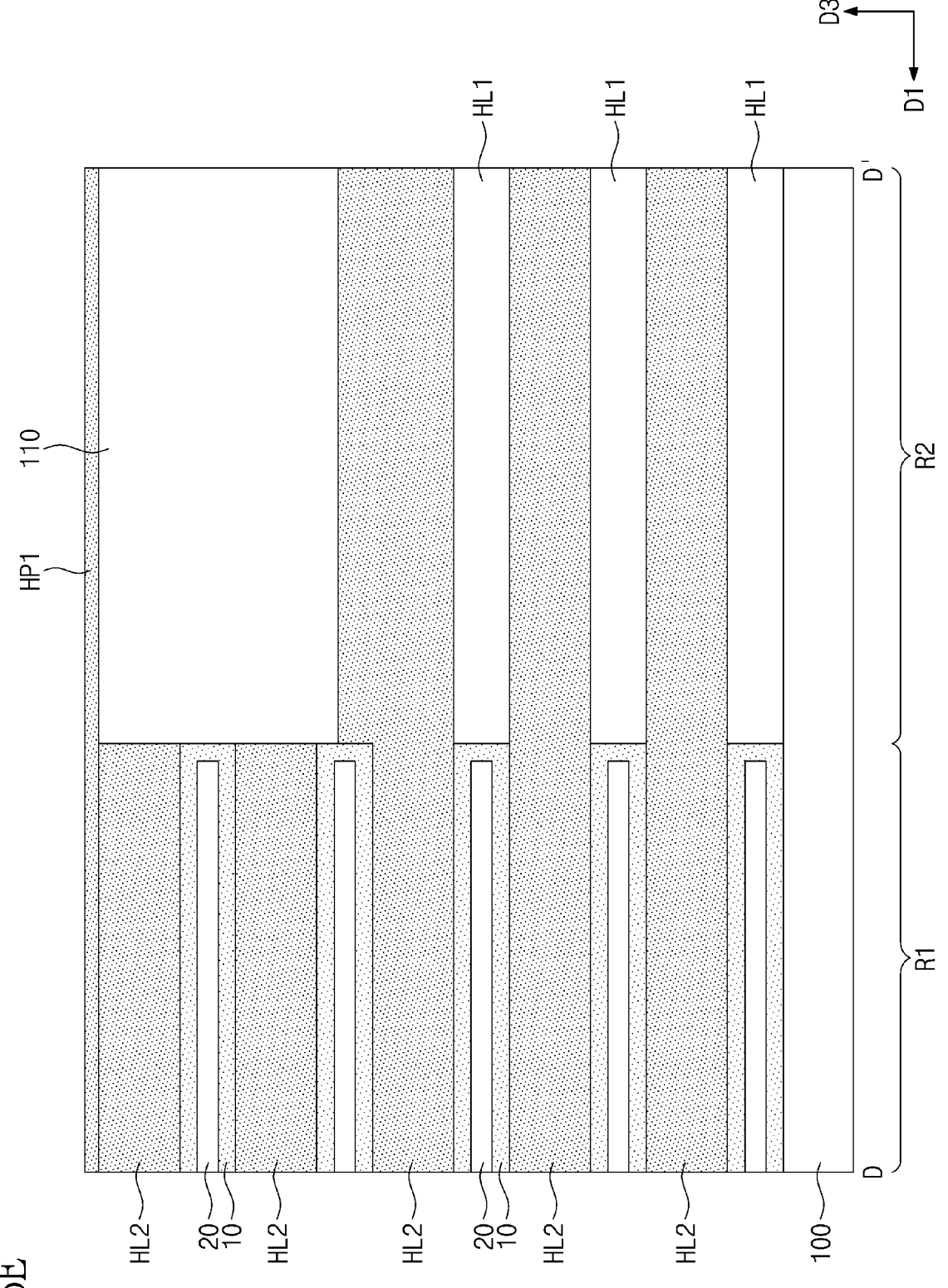
Figure 17A:
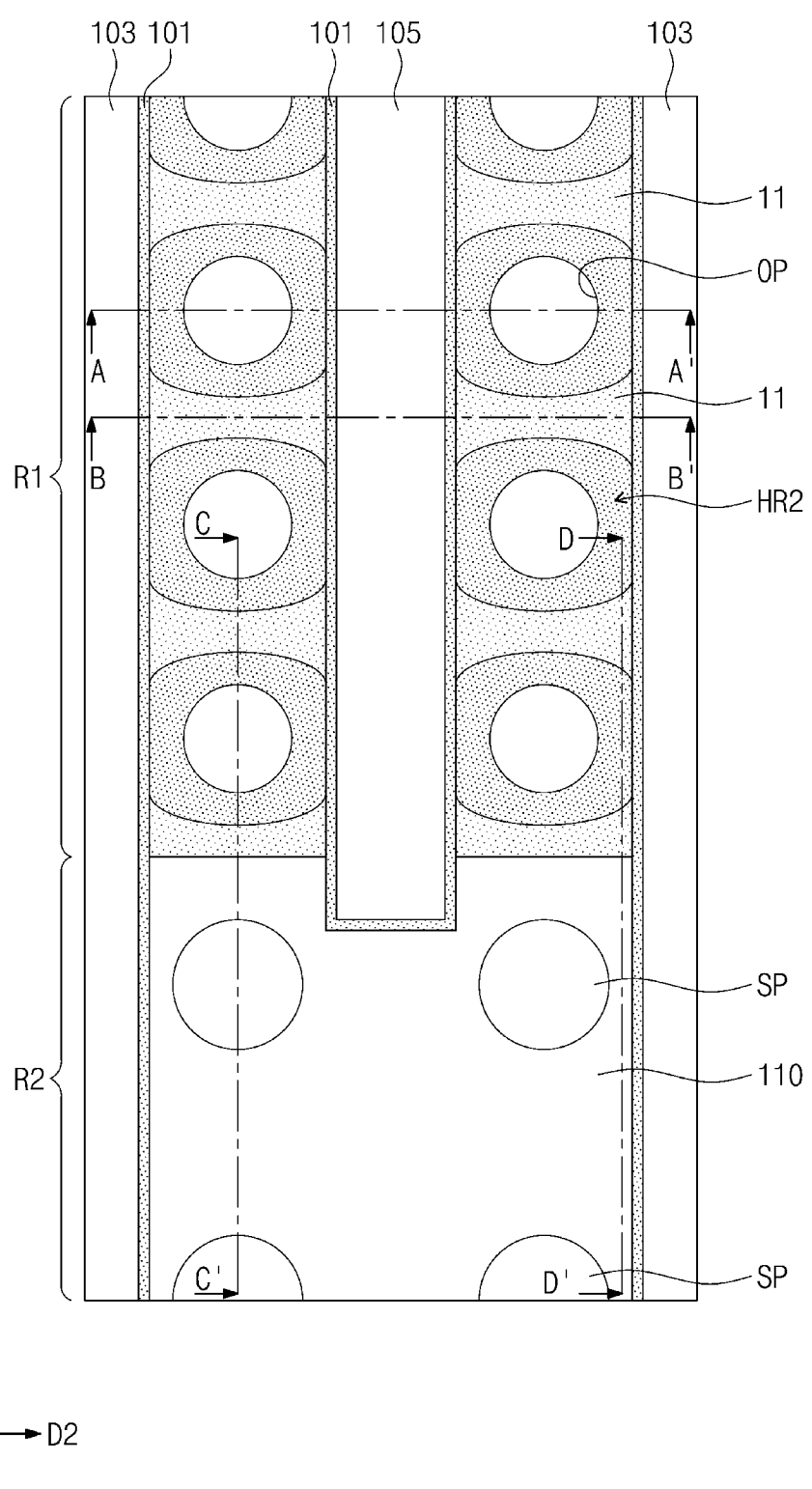
Figure 17B:
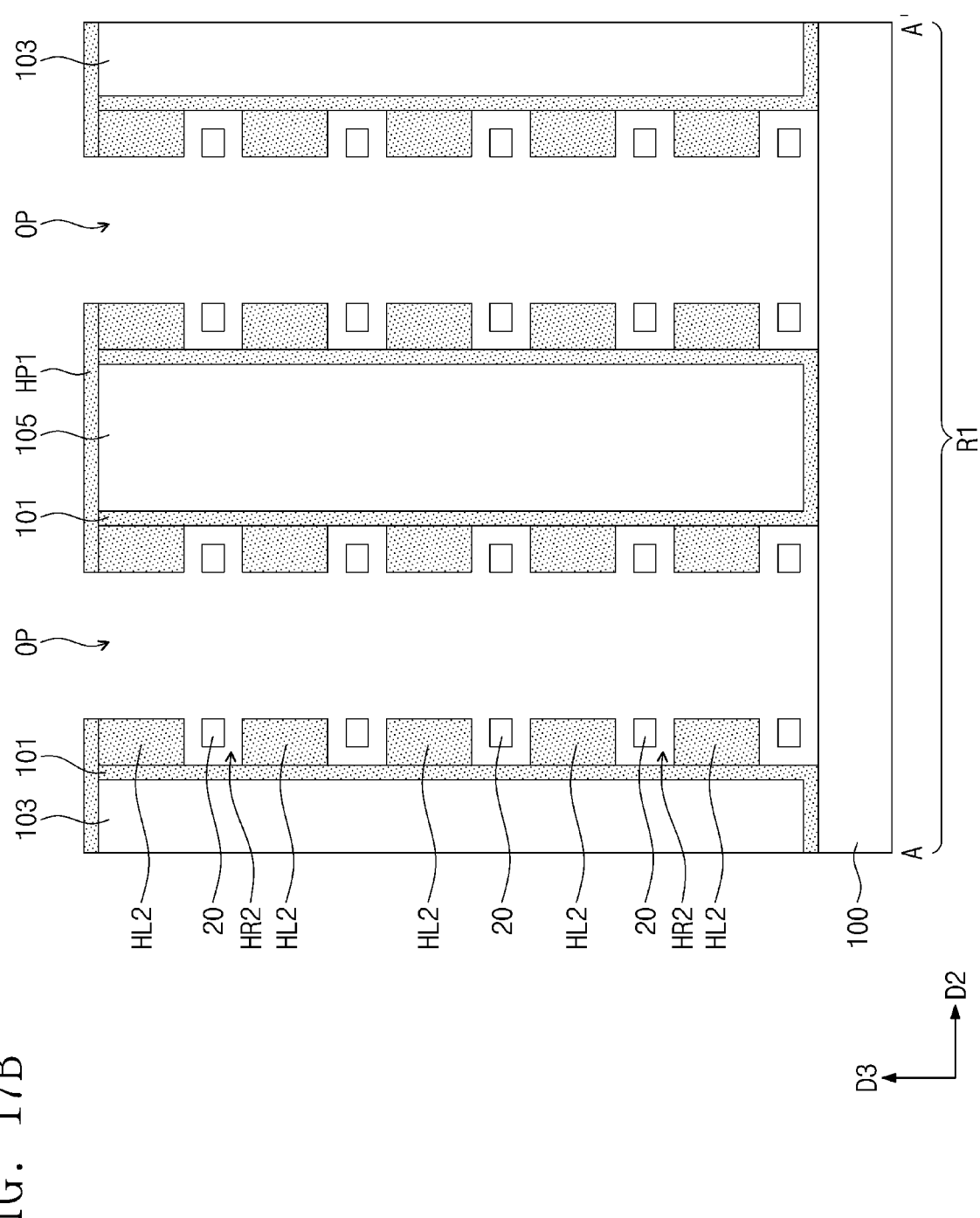
Figure 17C:
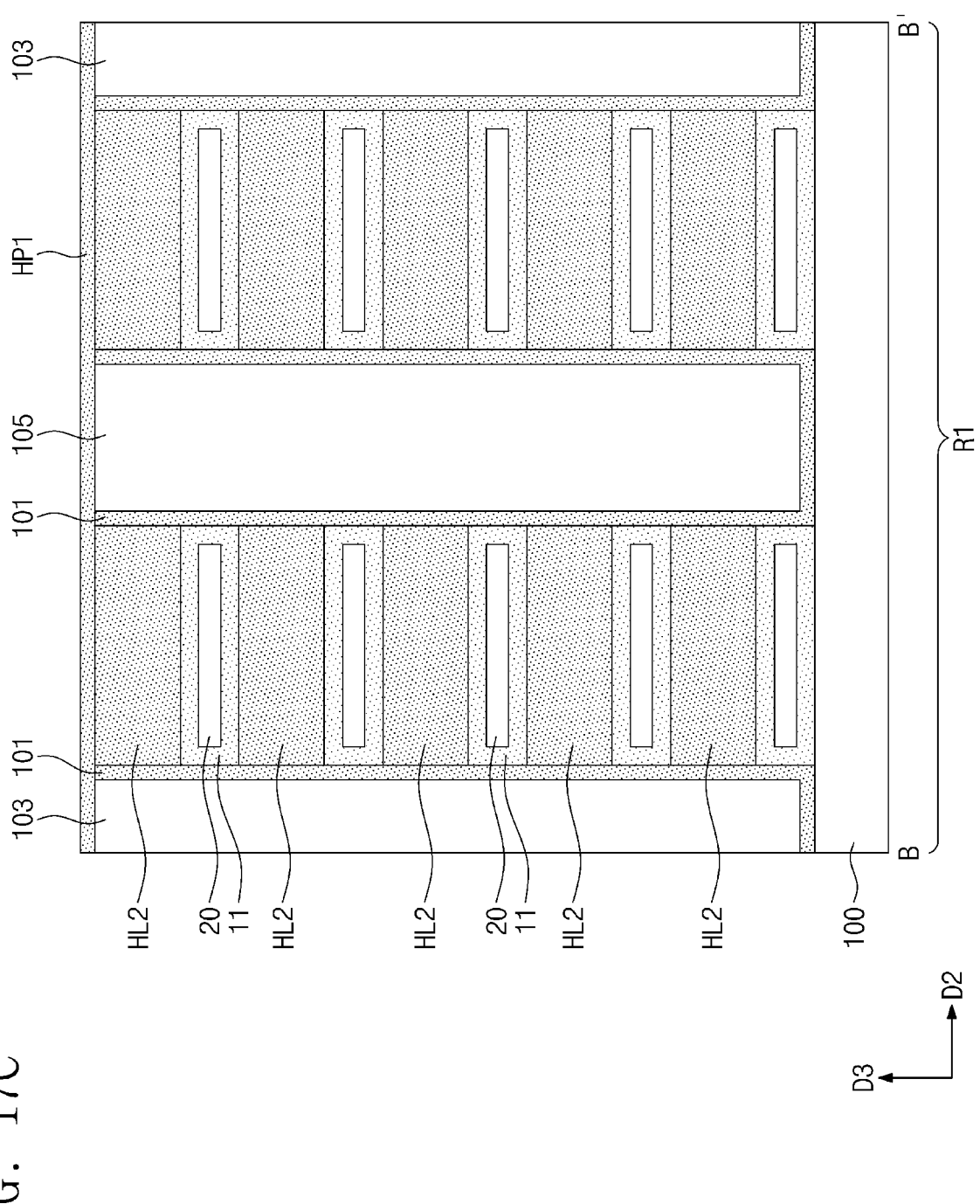
Figure 17D:
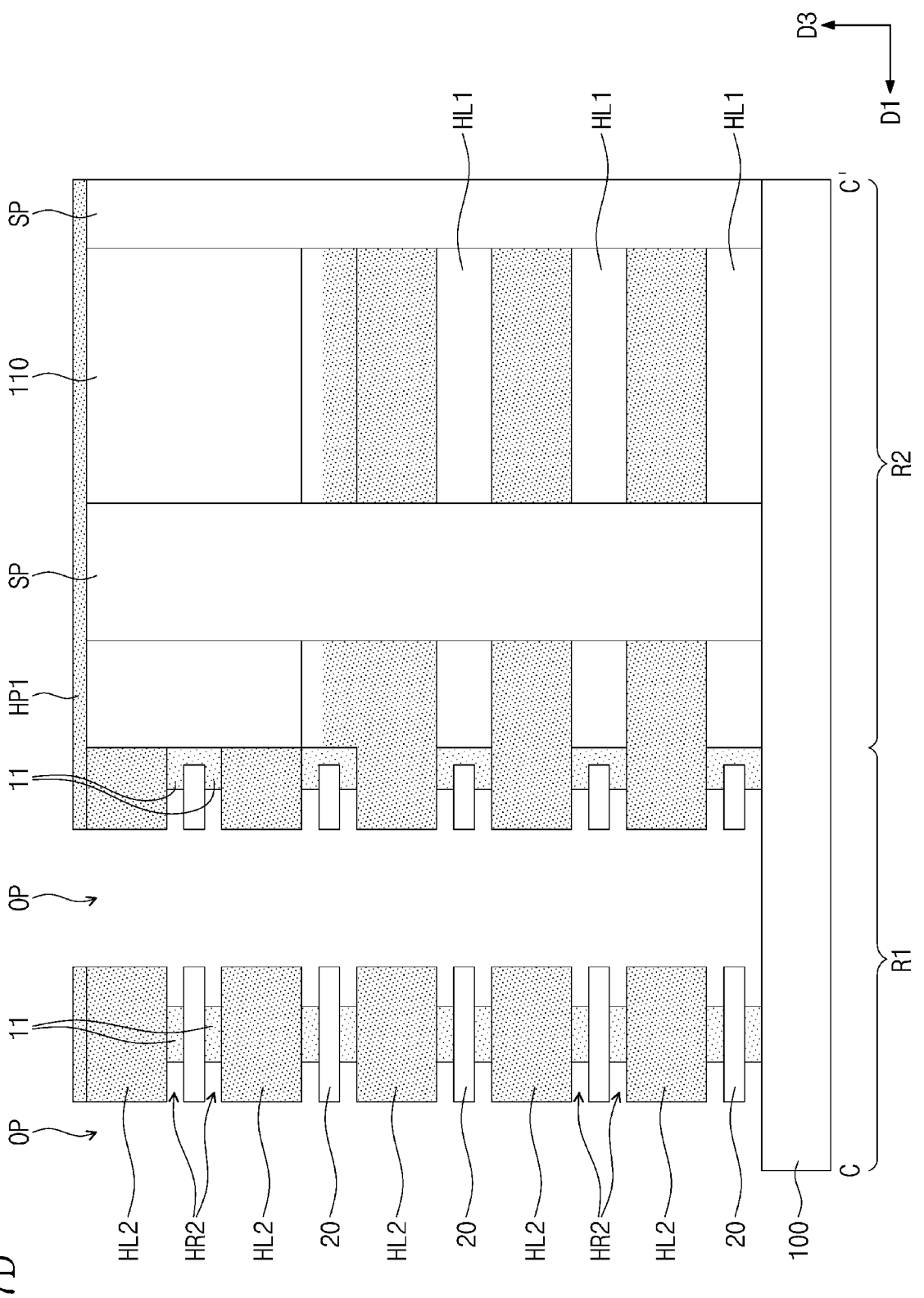
Figure 17E:
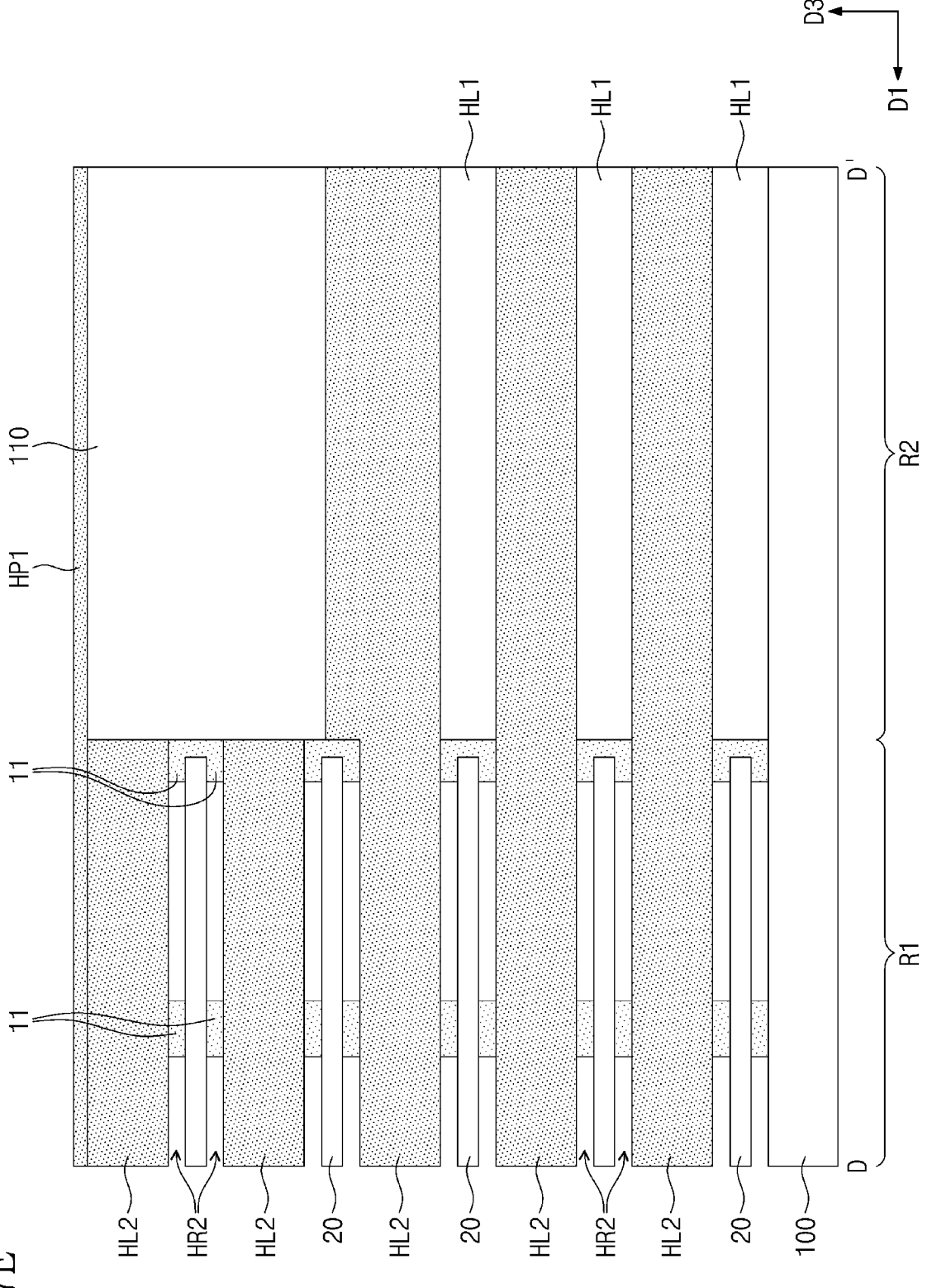
Figure 18A:
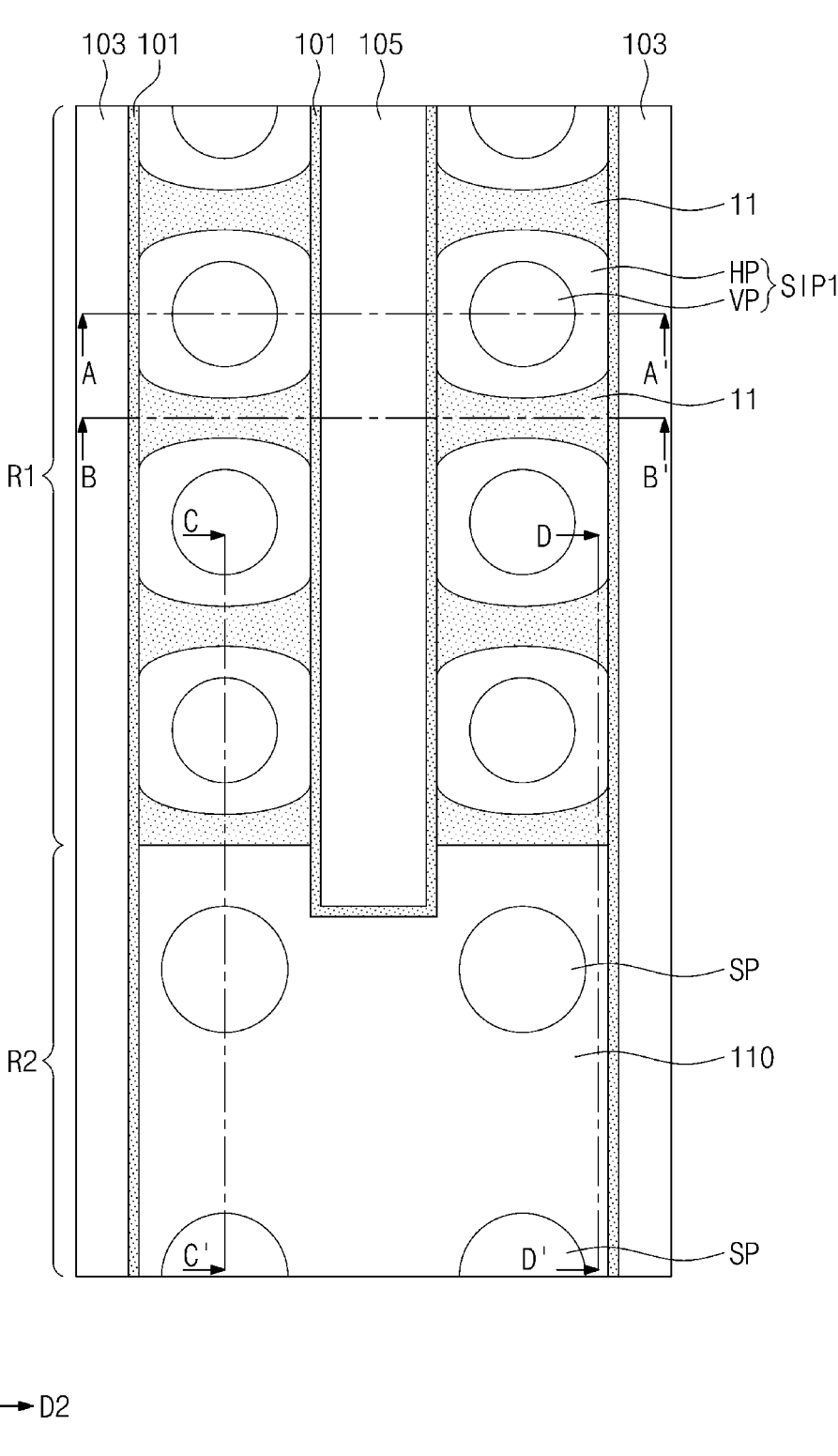
Figure 18B:
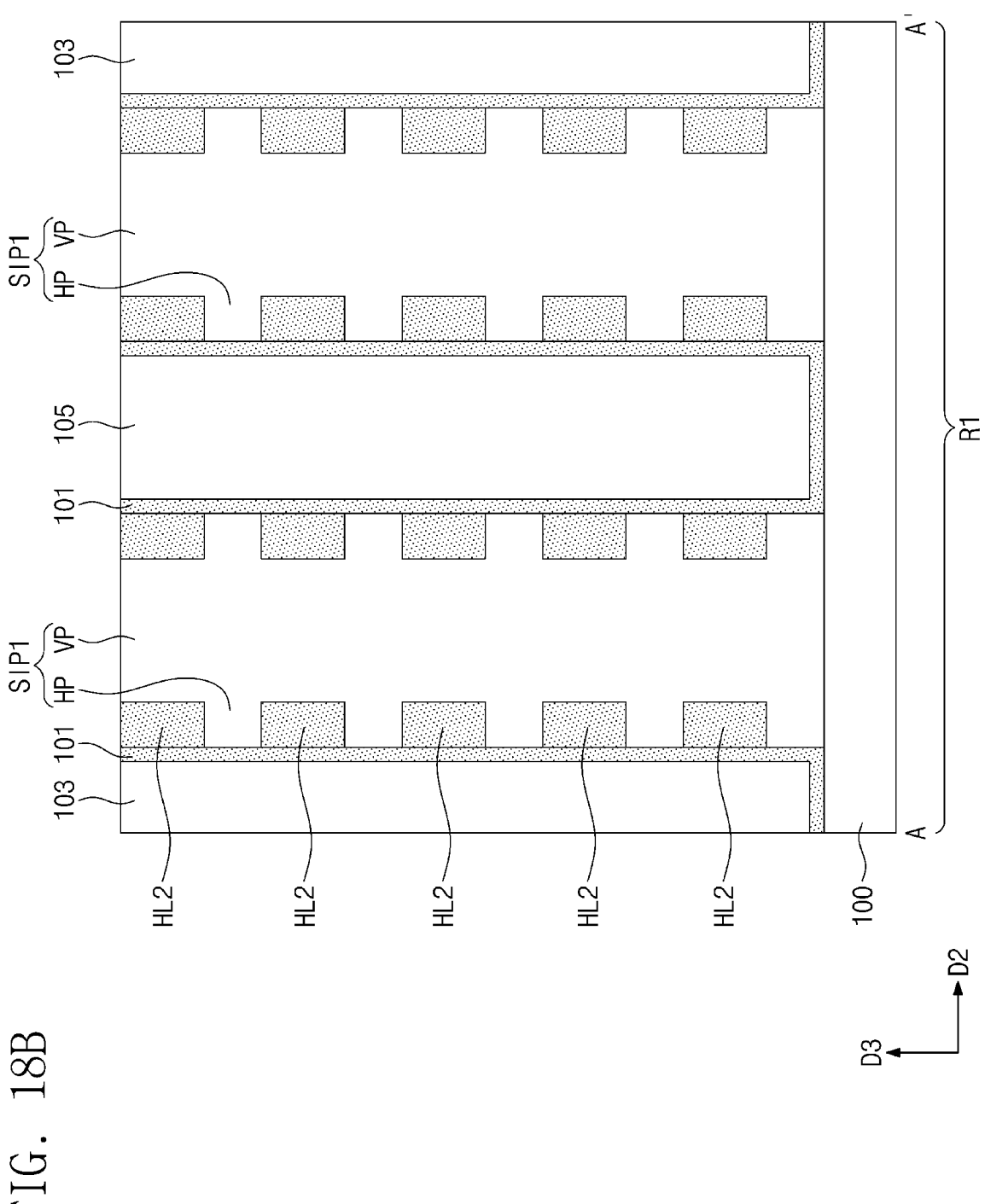
Figure 18C:
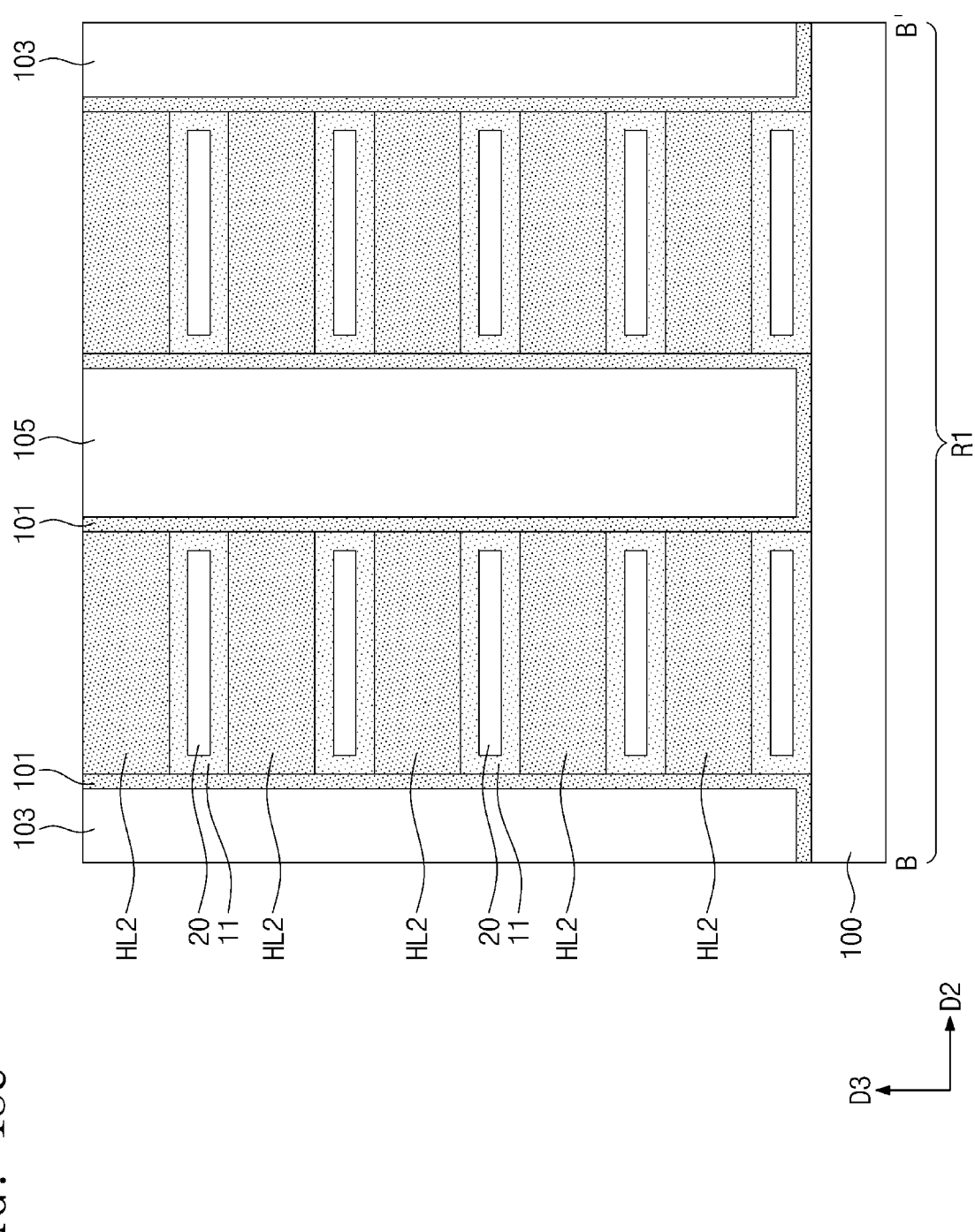
Figure 18D:
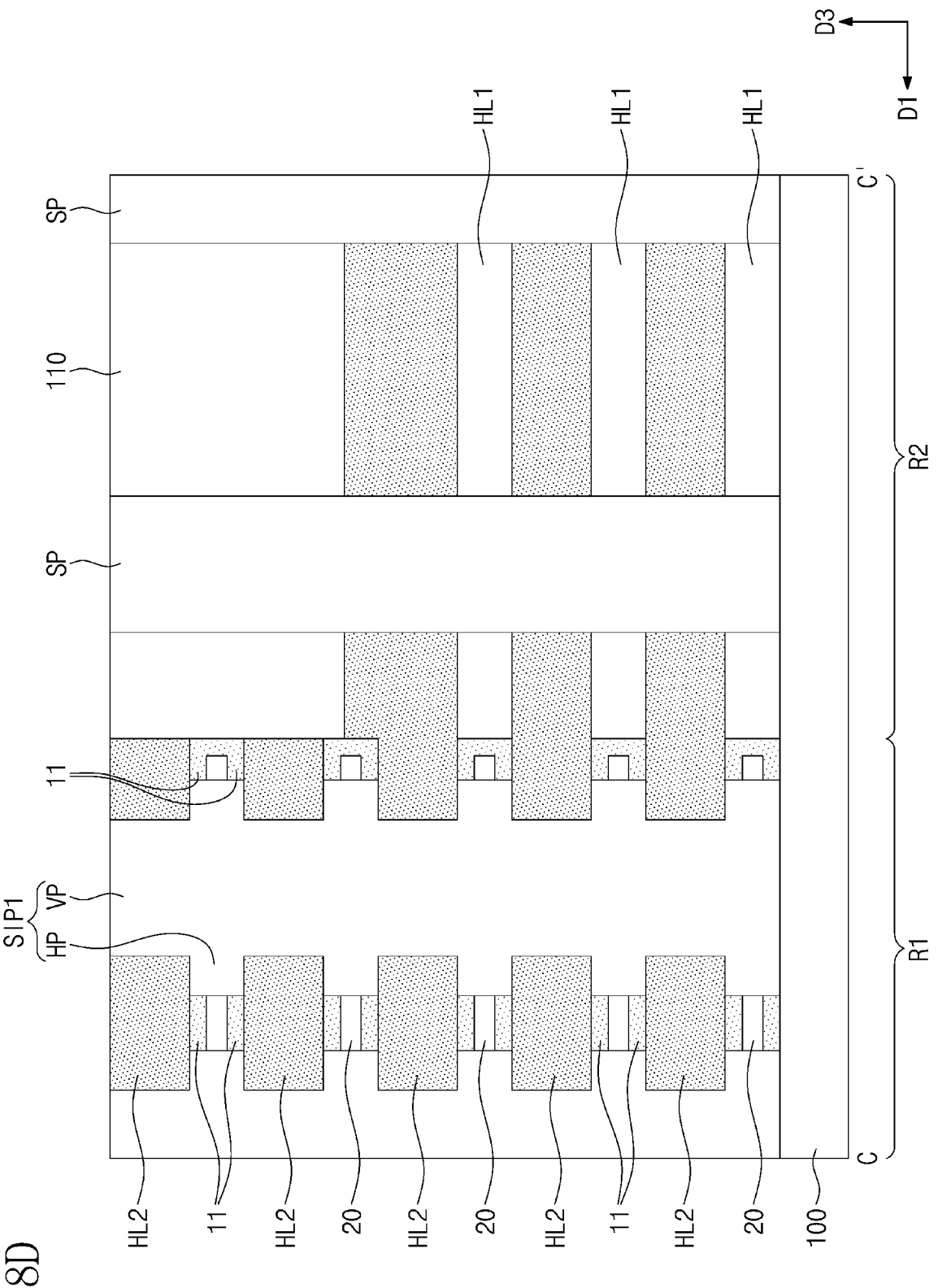
Figure 18E:
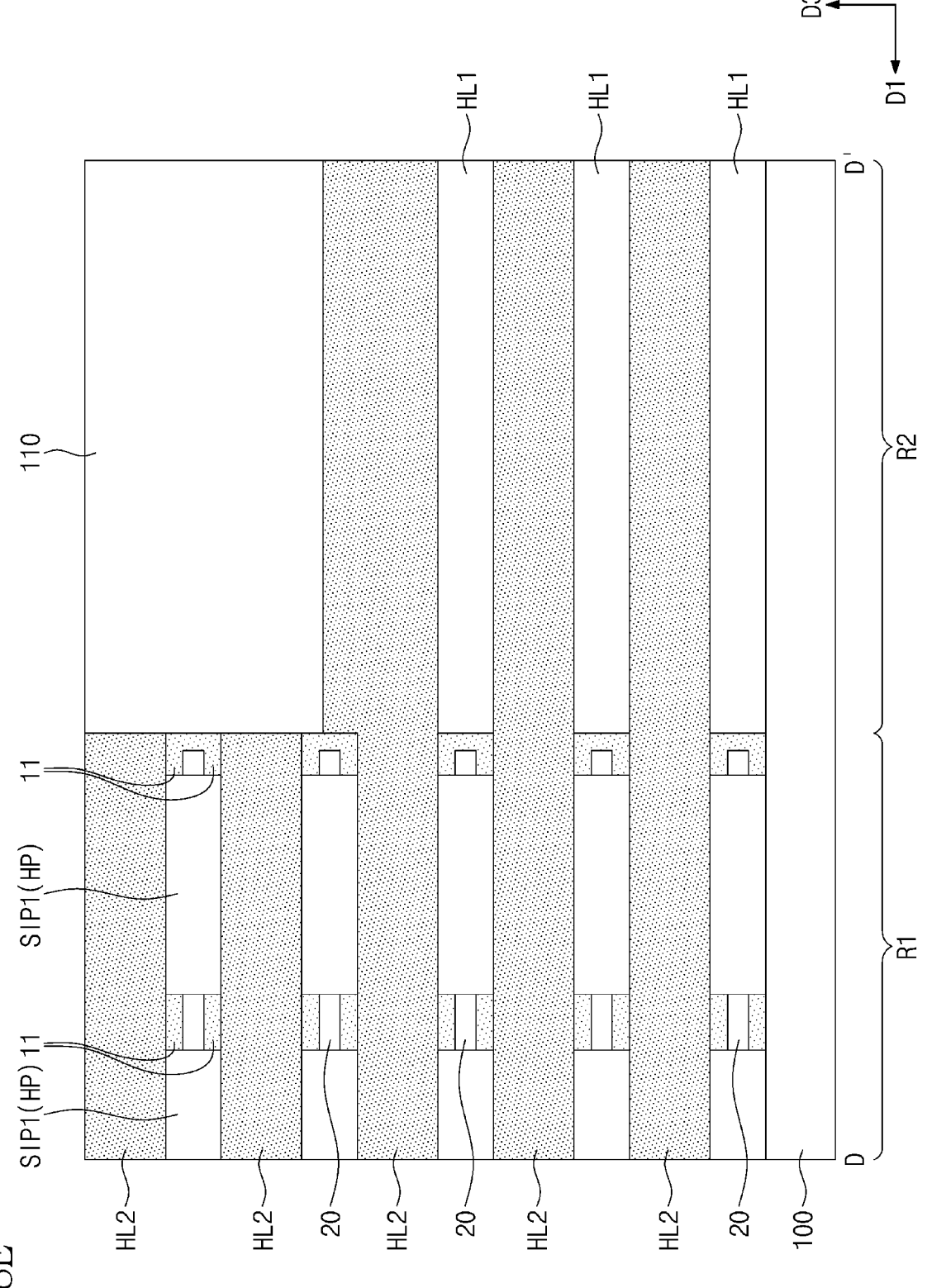
Figure 19A:
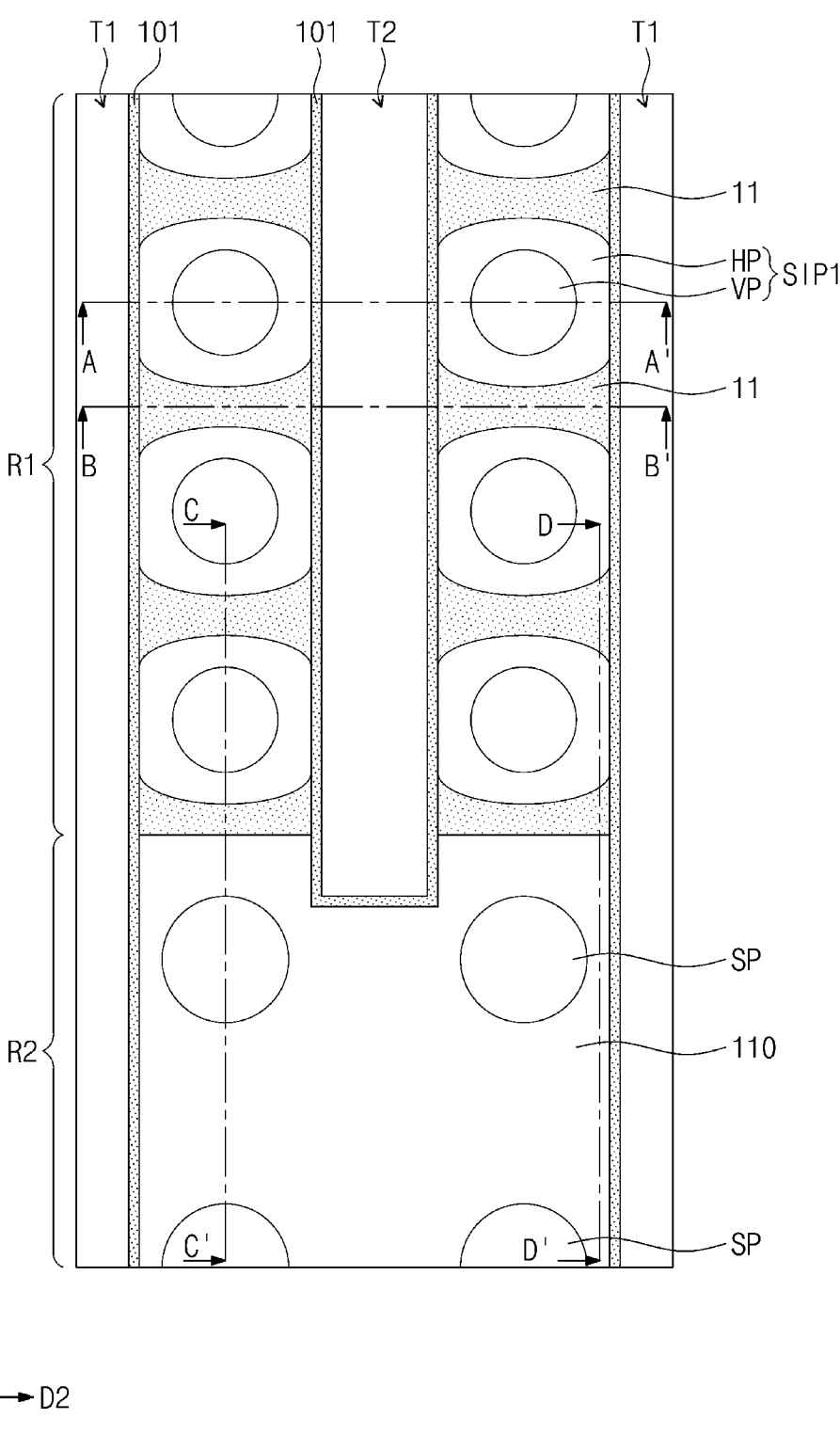
Figure 19B:
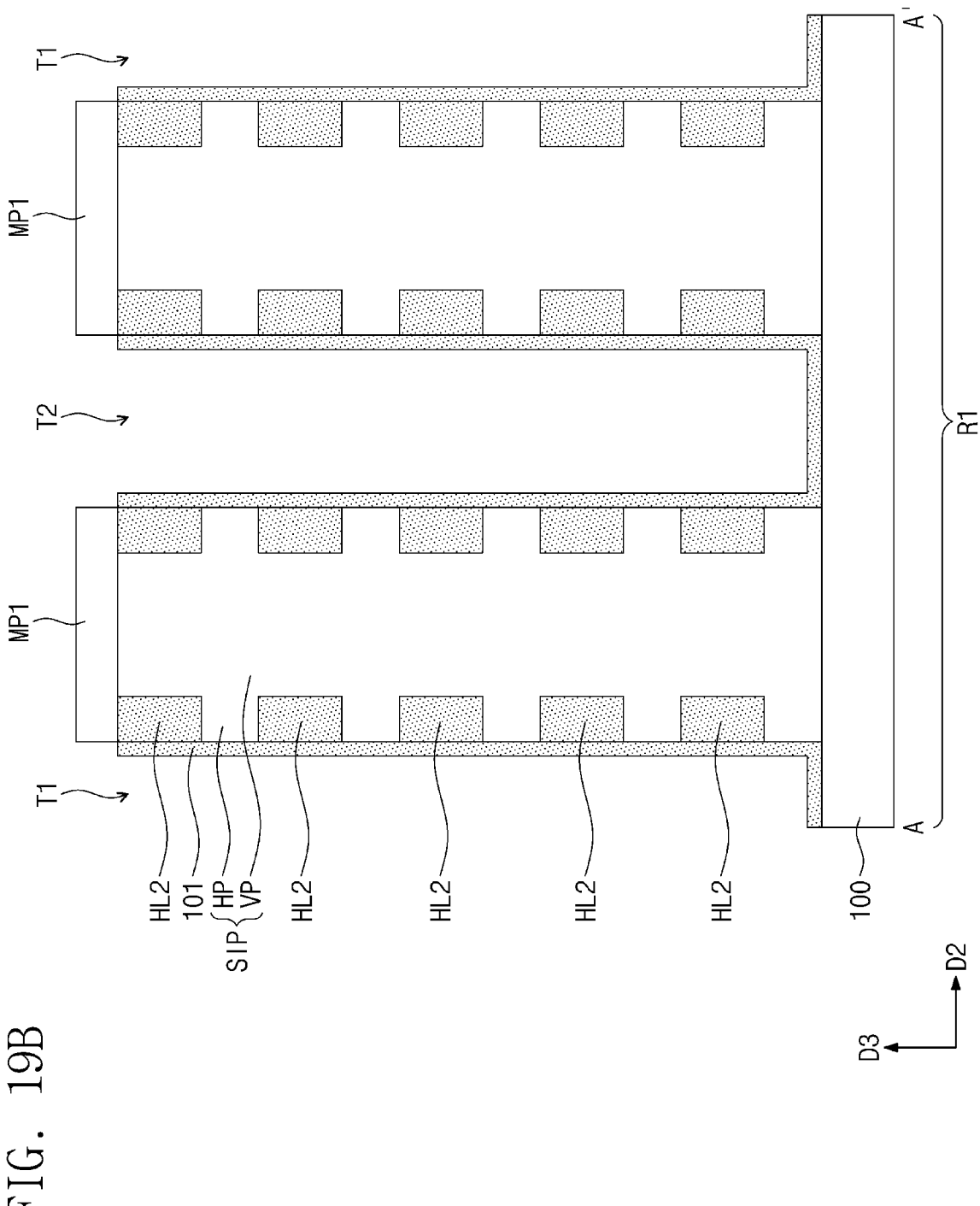
Figure 19C:
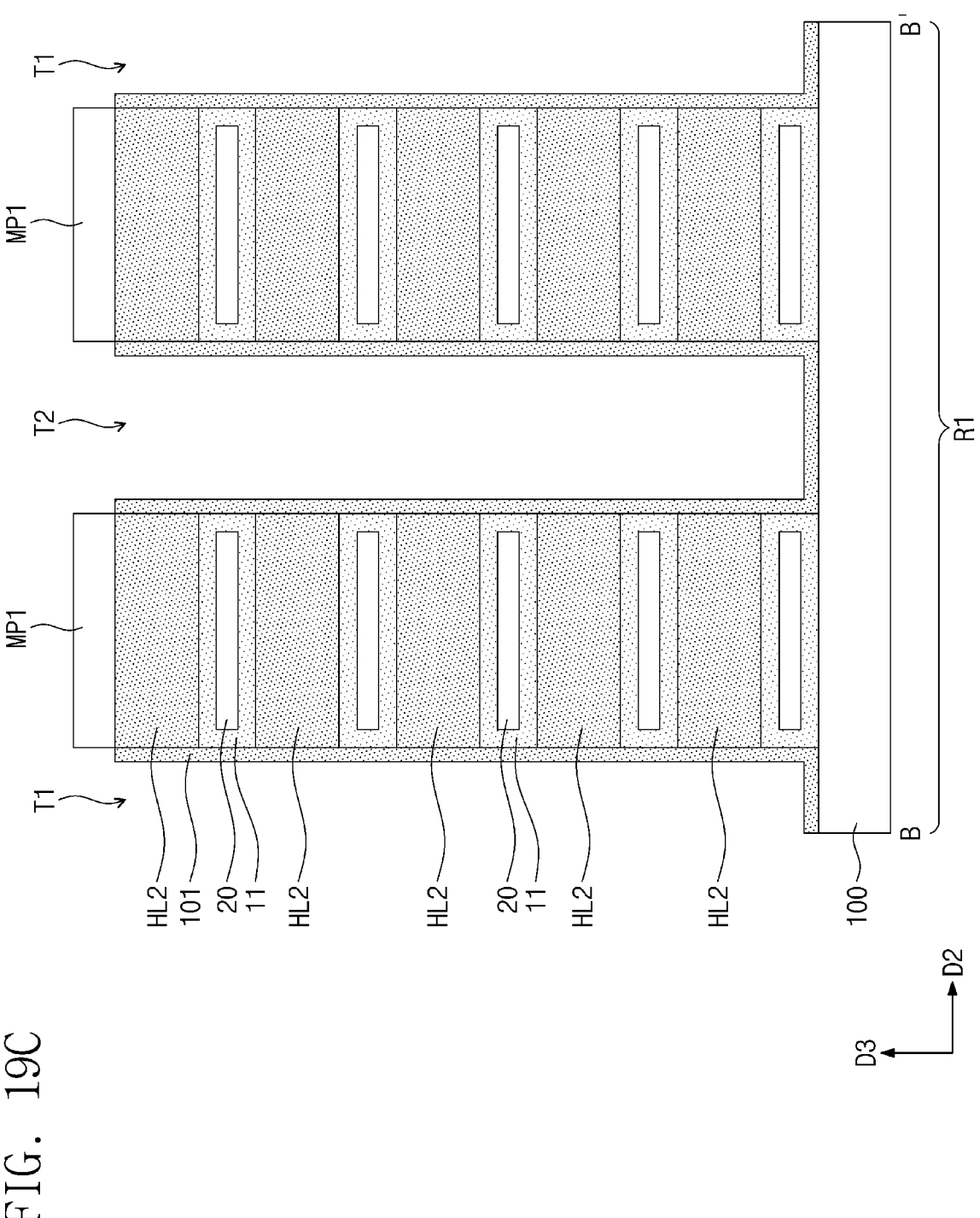
Figure 19D:
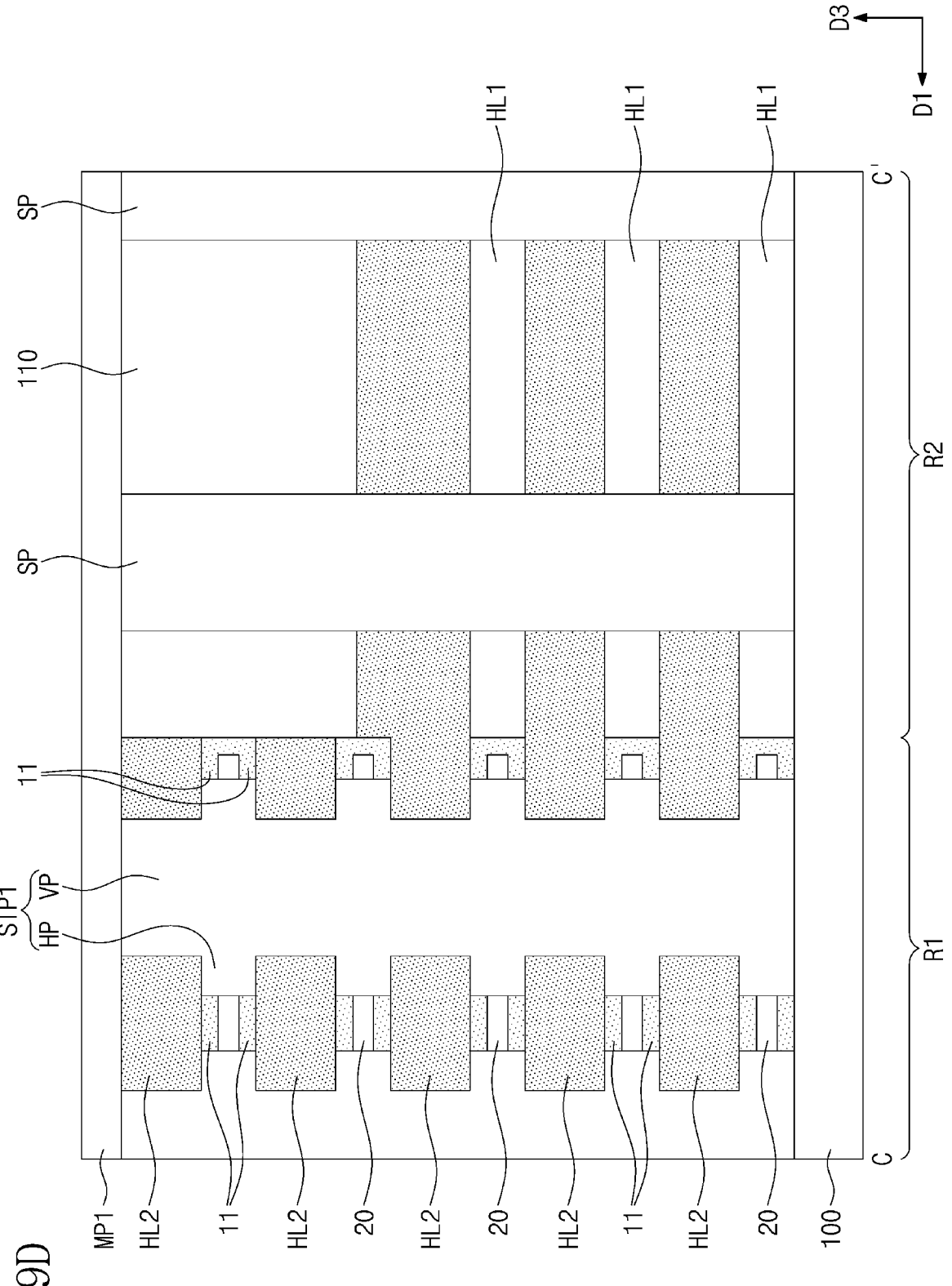
Figure 19E:
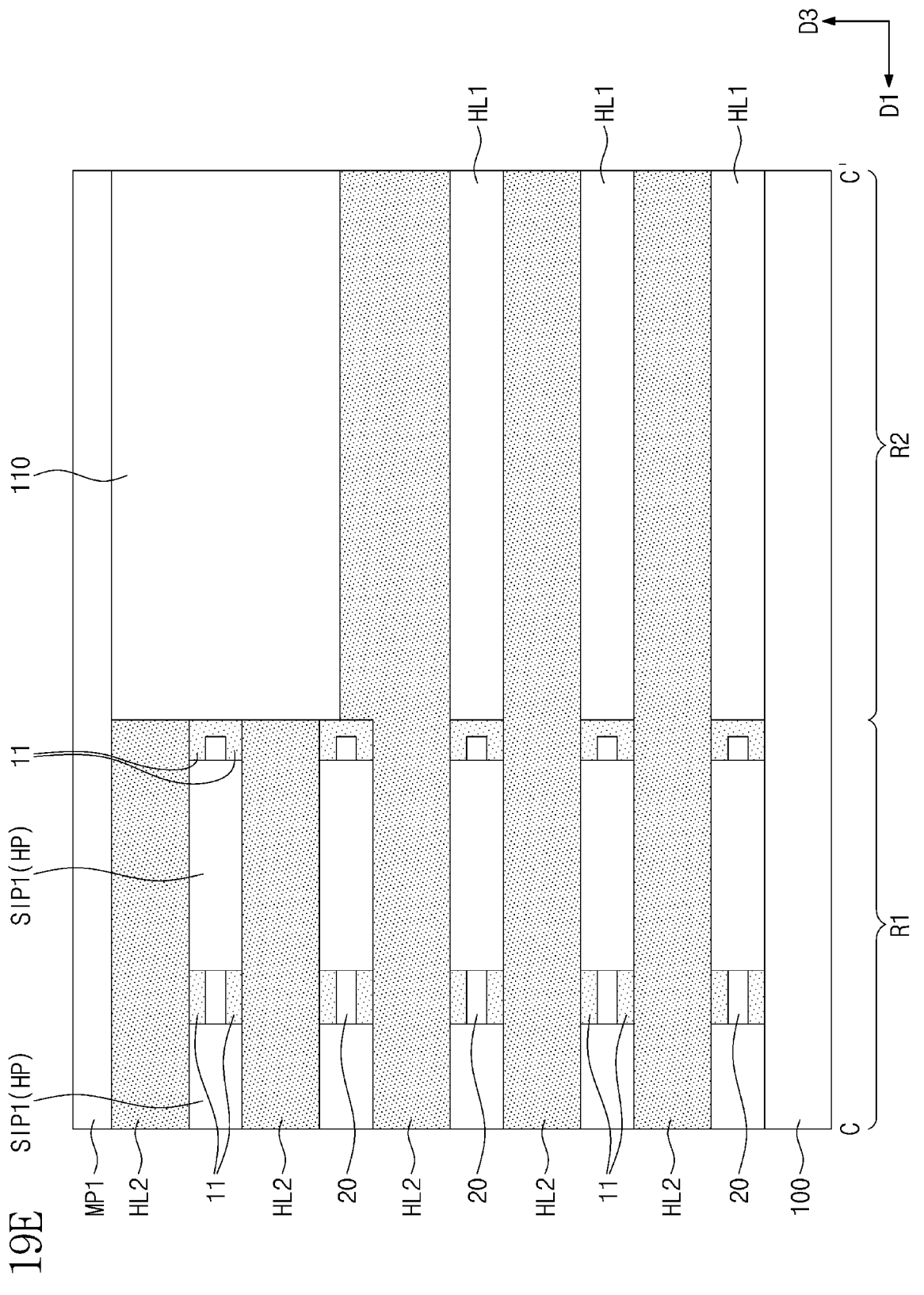
Figure 20A:
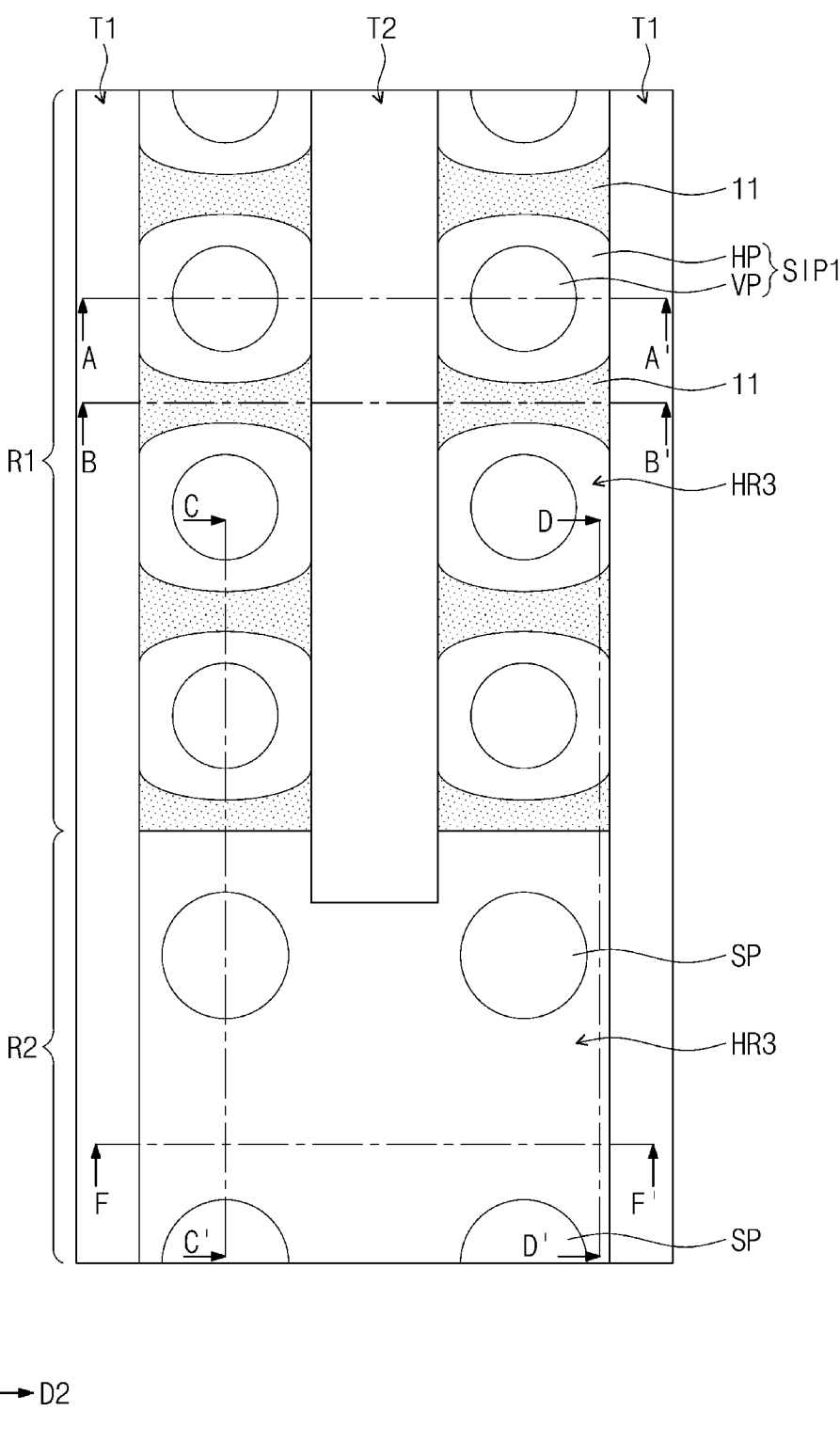
Figure 20B:
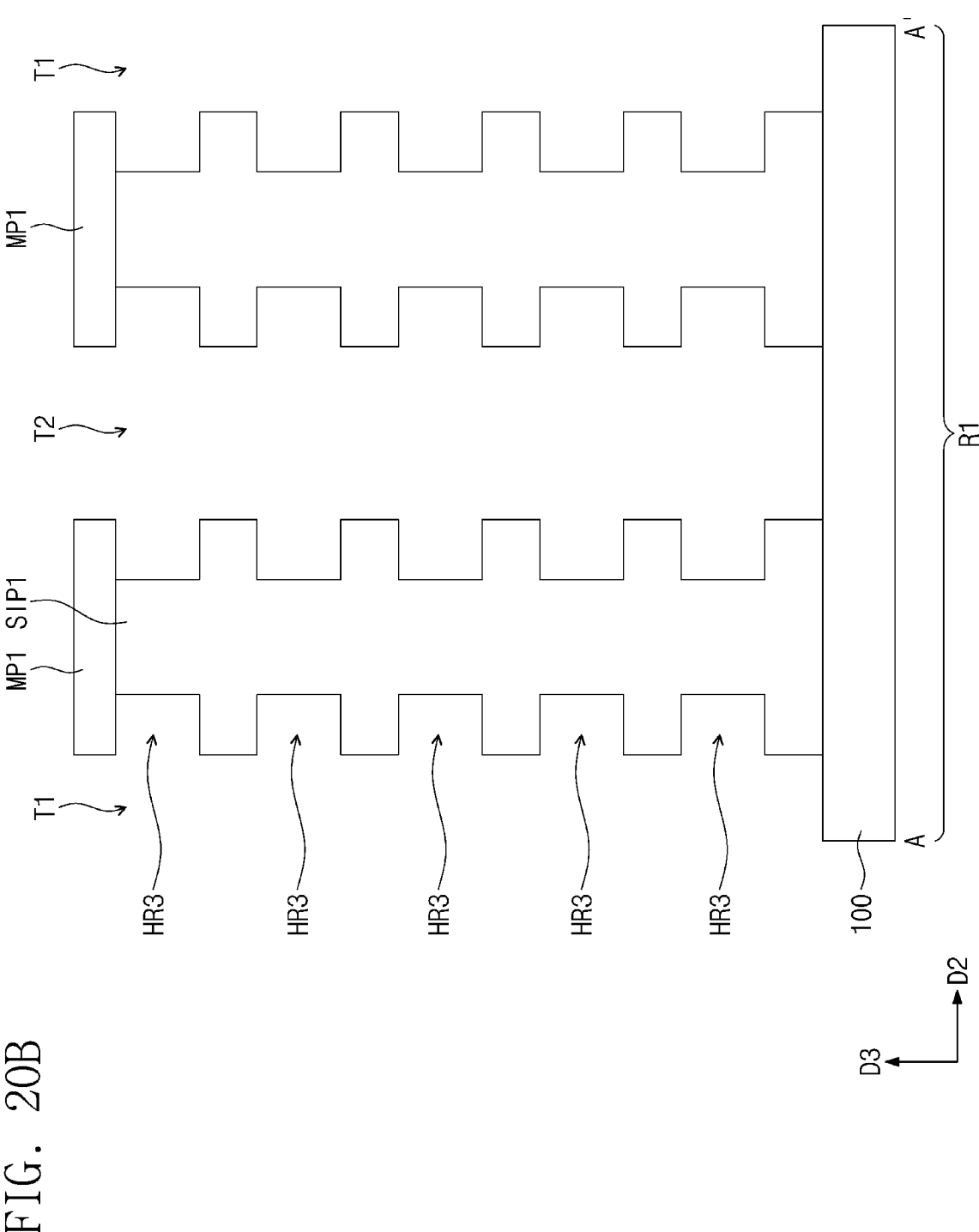
Figure 20C:
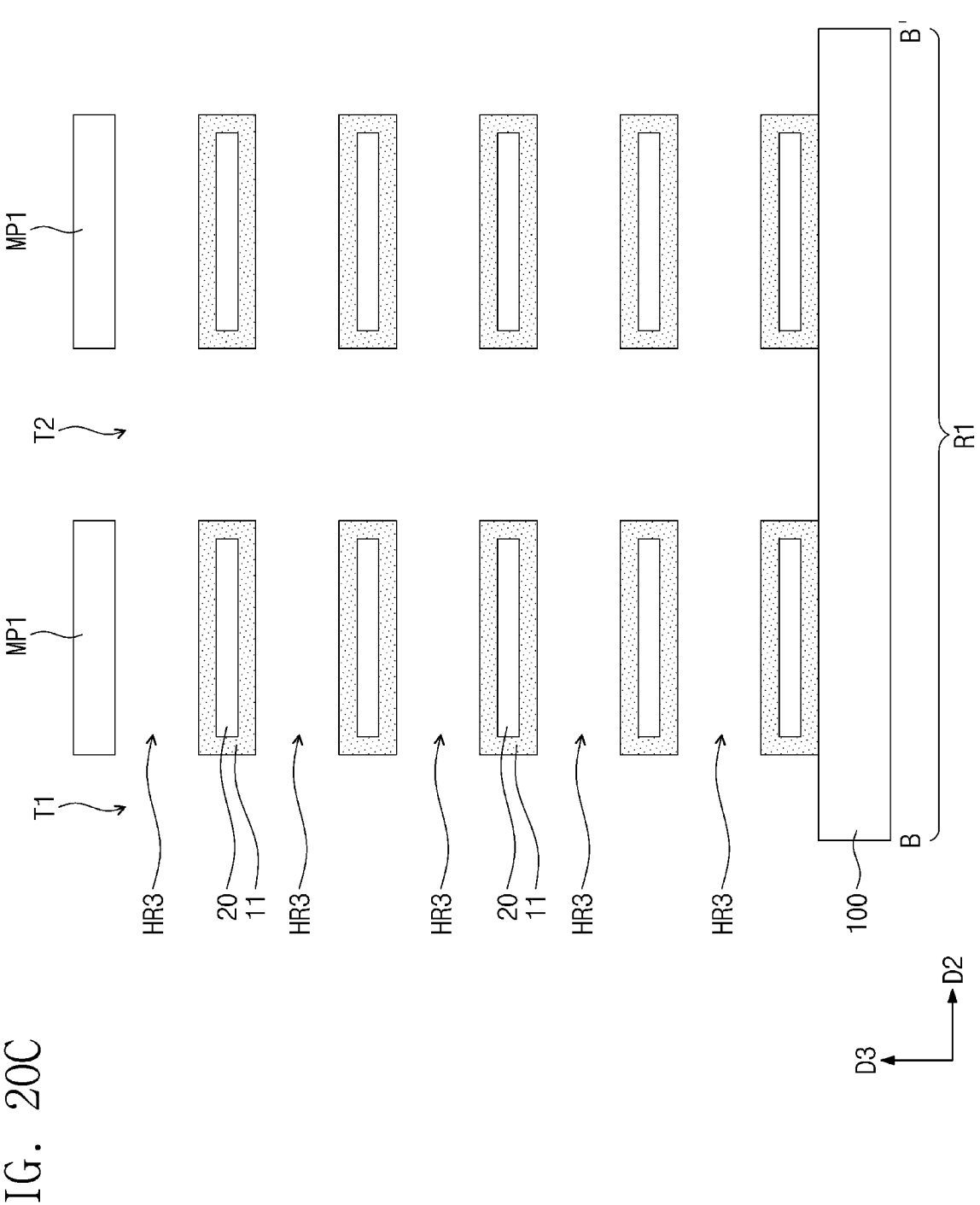
Figure 20D:
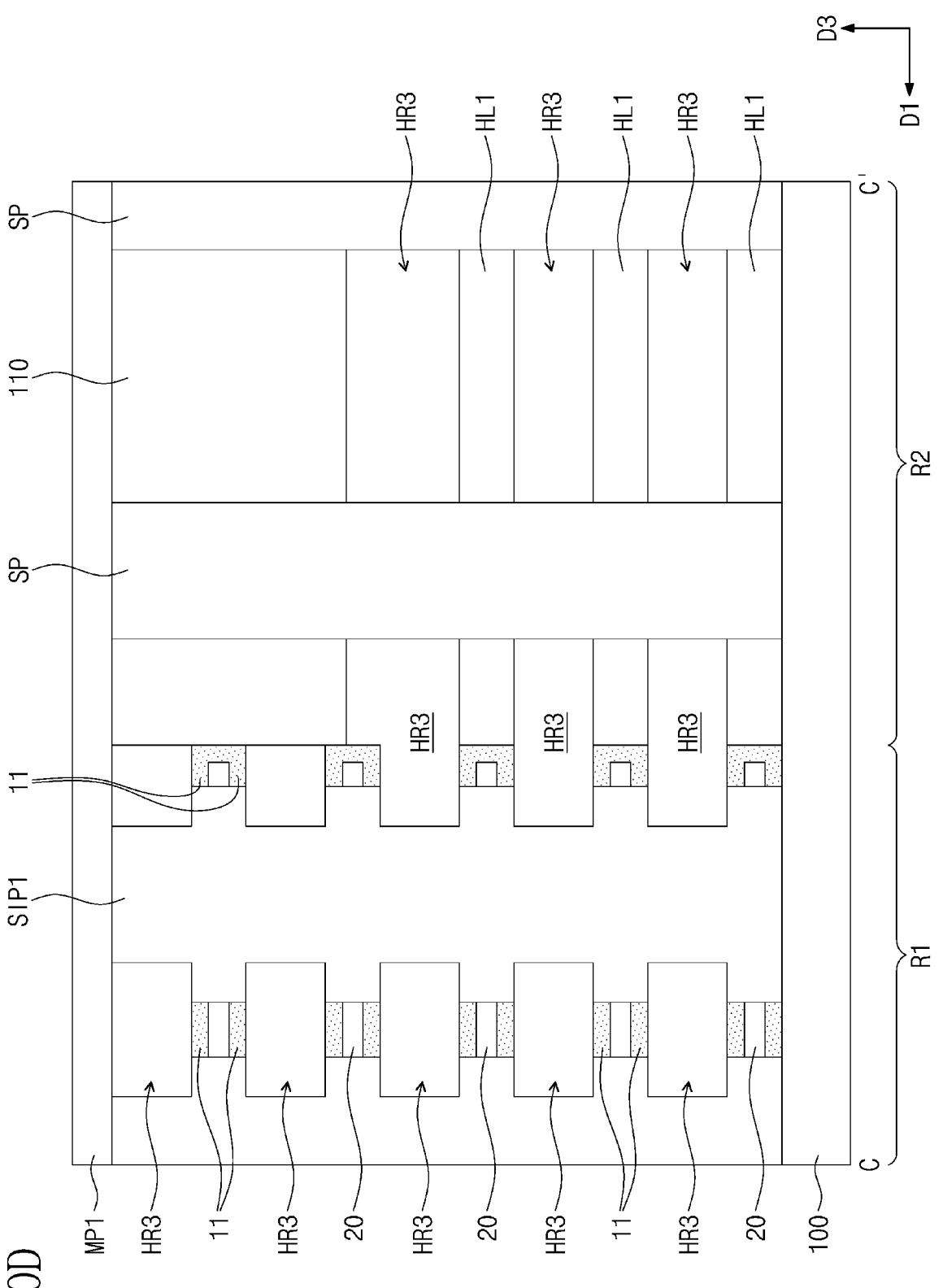
Figure 20E:
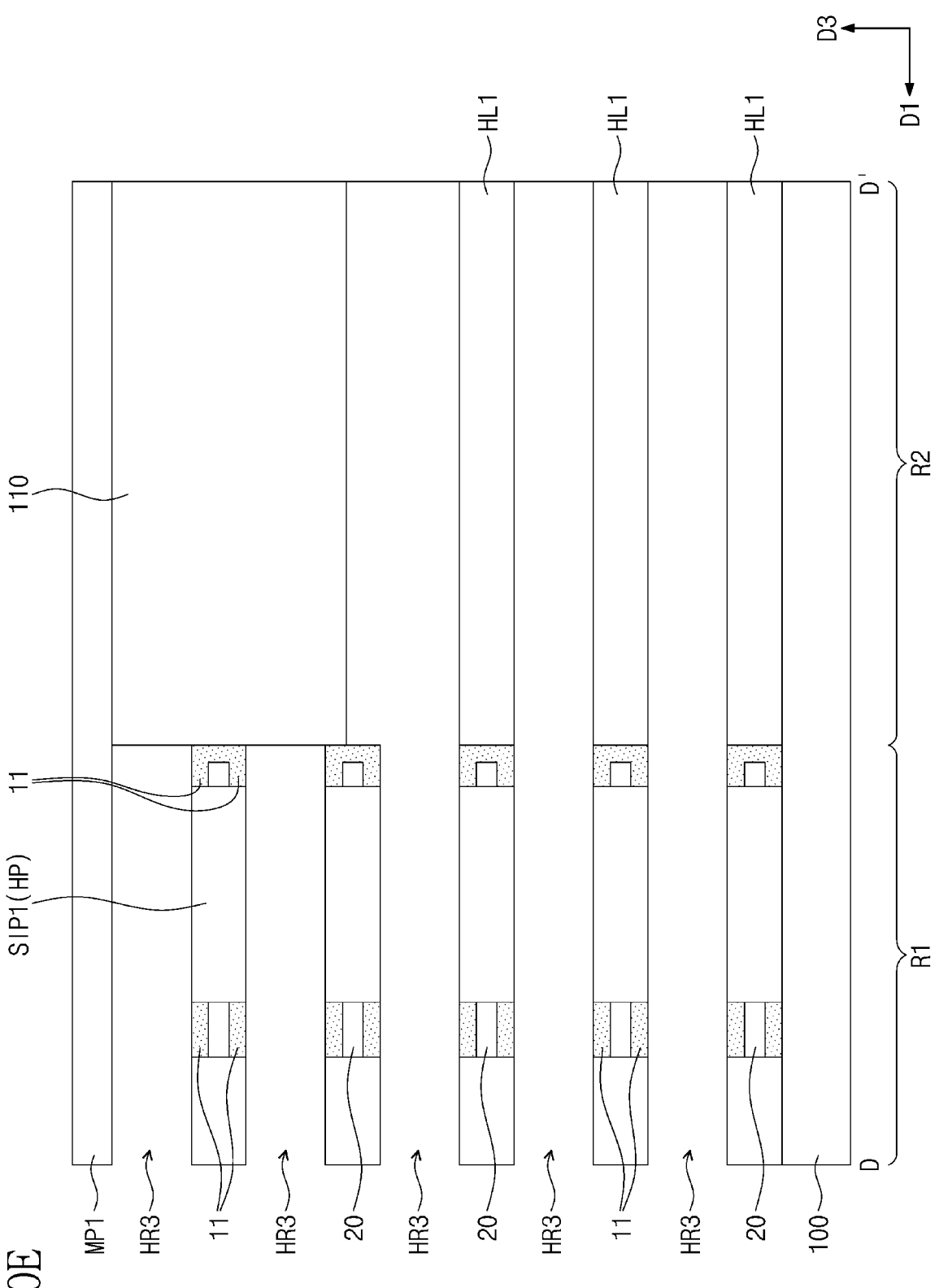
Figure 20F:
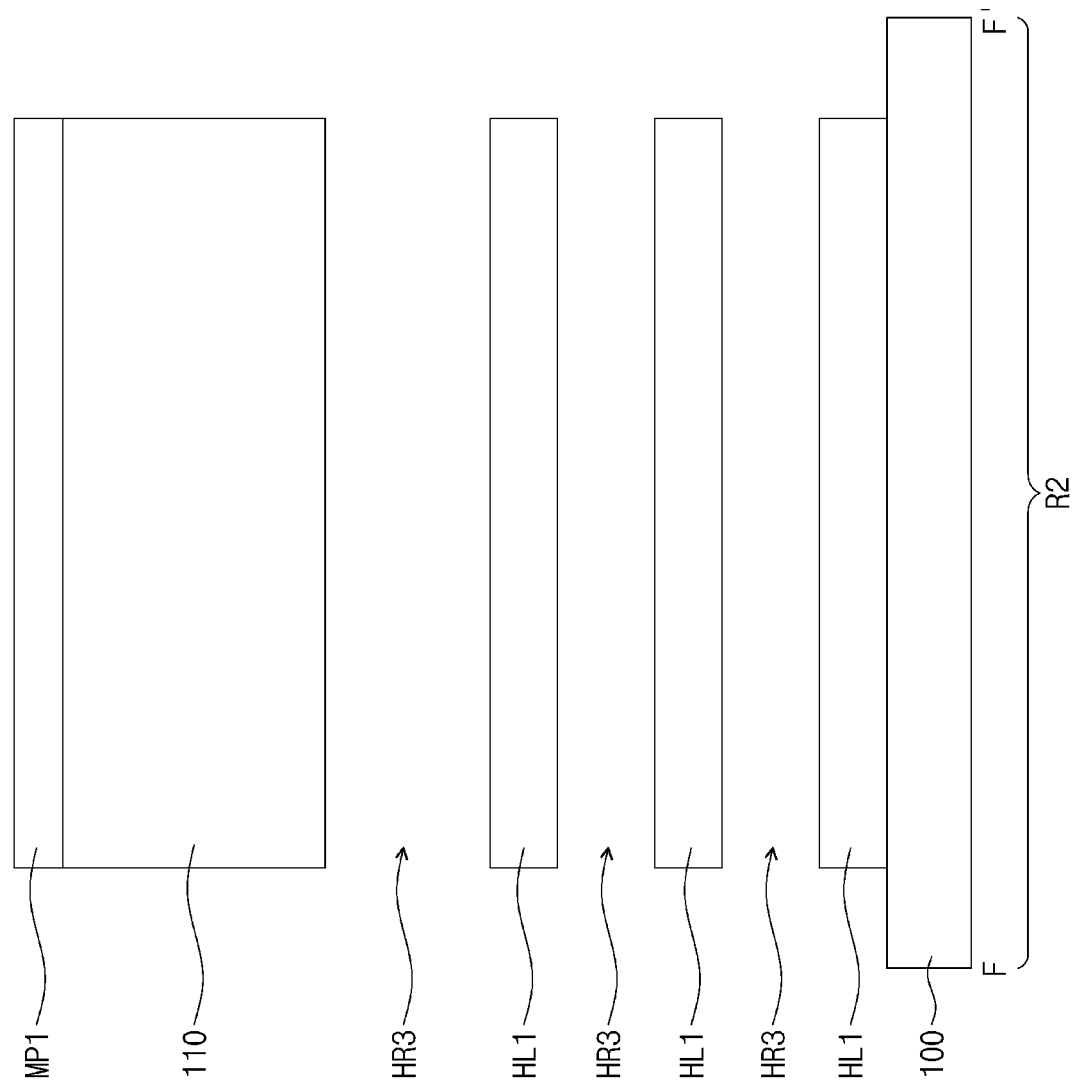
FIG. 20F is a sectional view taken along a line F-F' of FIG. 20A.
Figure 21A:
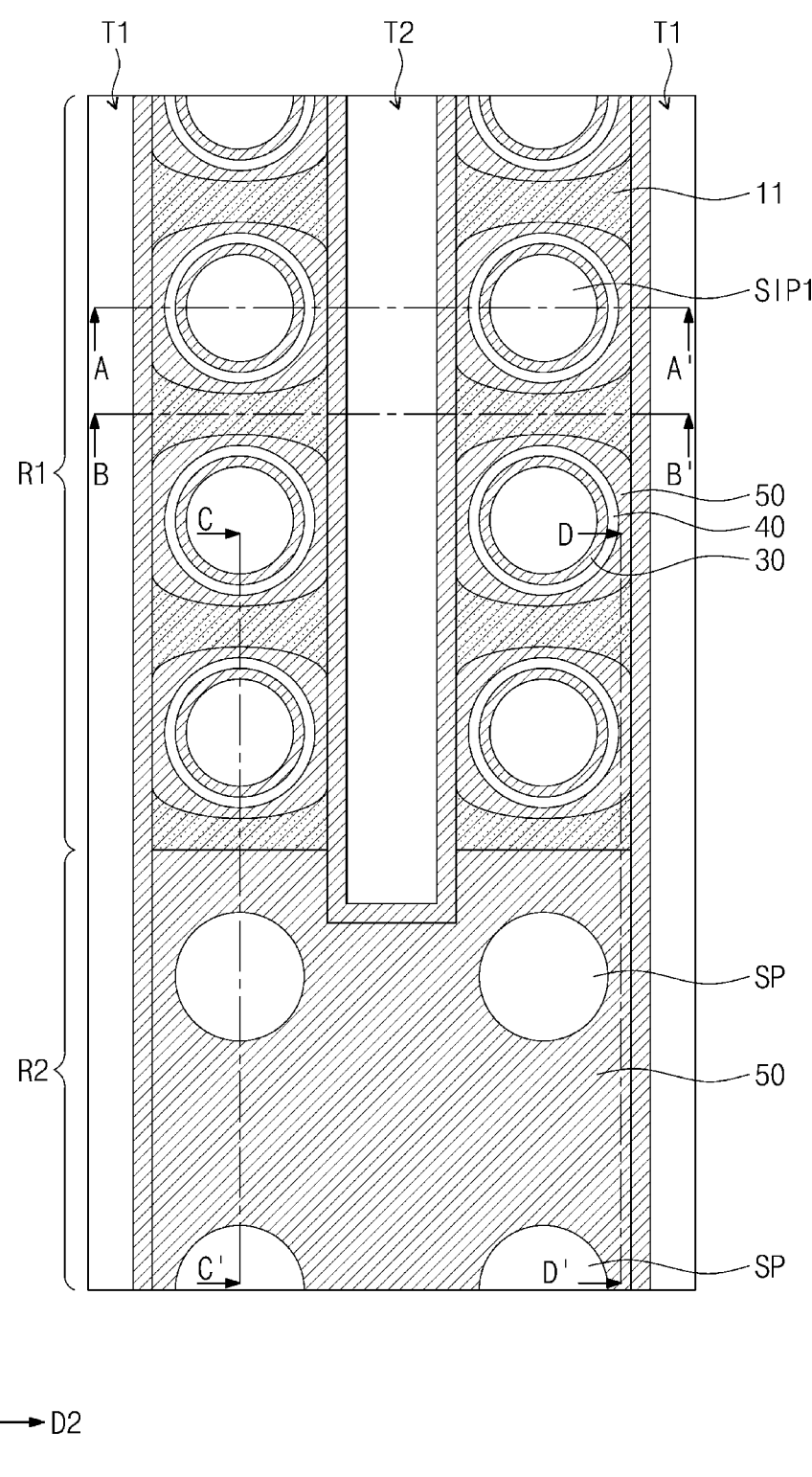
Figure 21B:
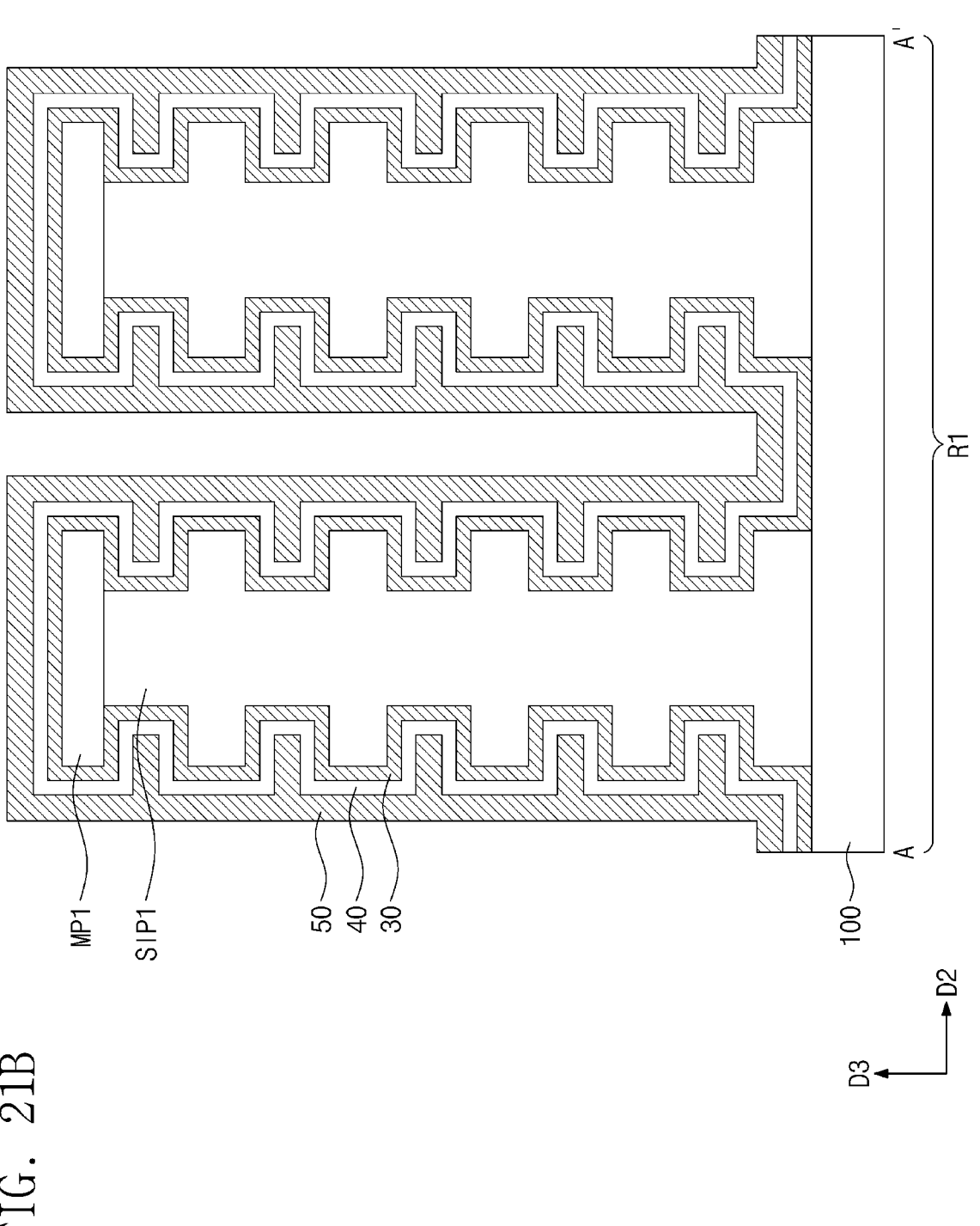
Figure 21C:
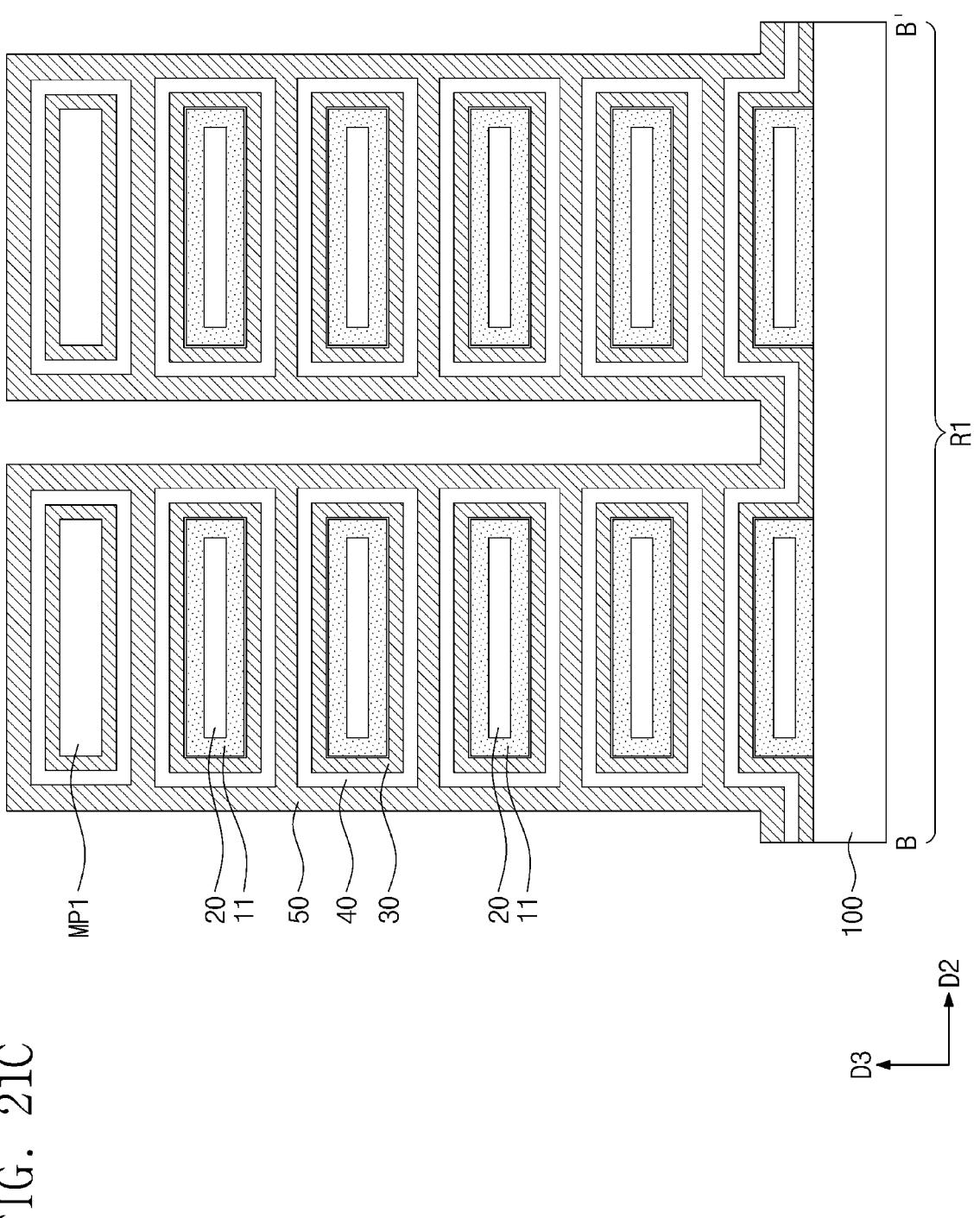
Figure 21D:
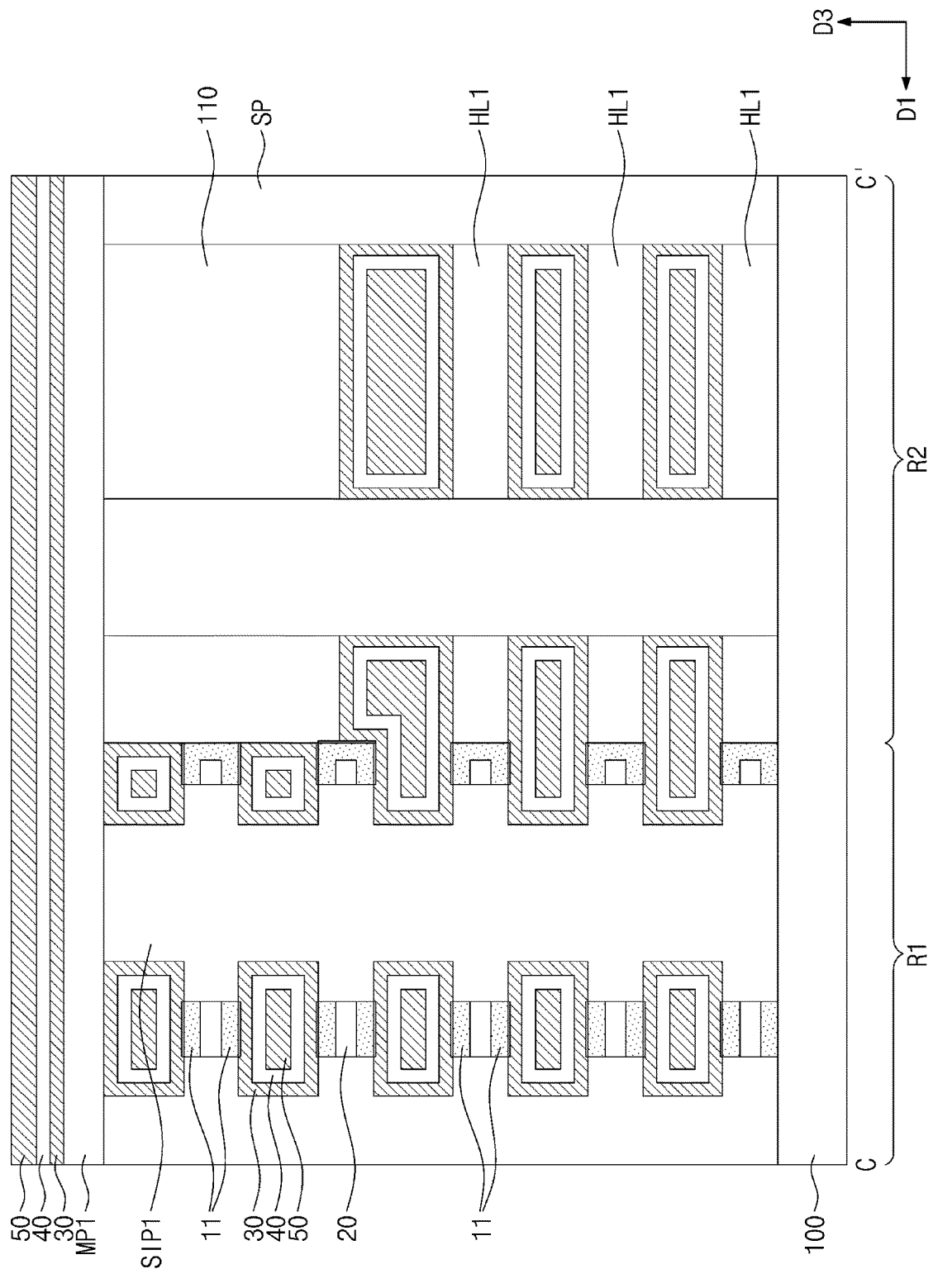
Figure 21E:
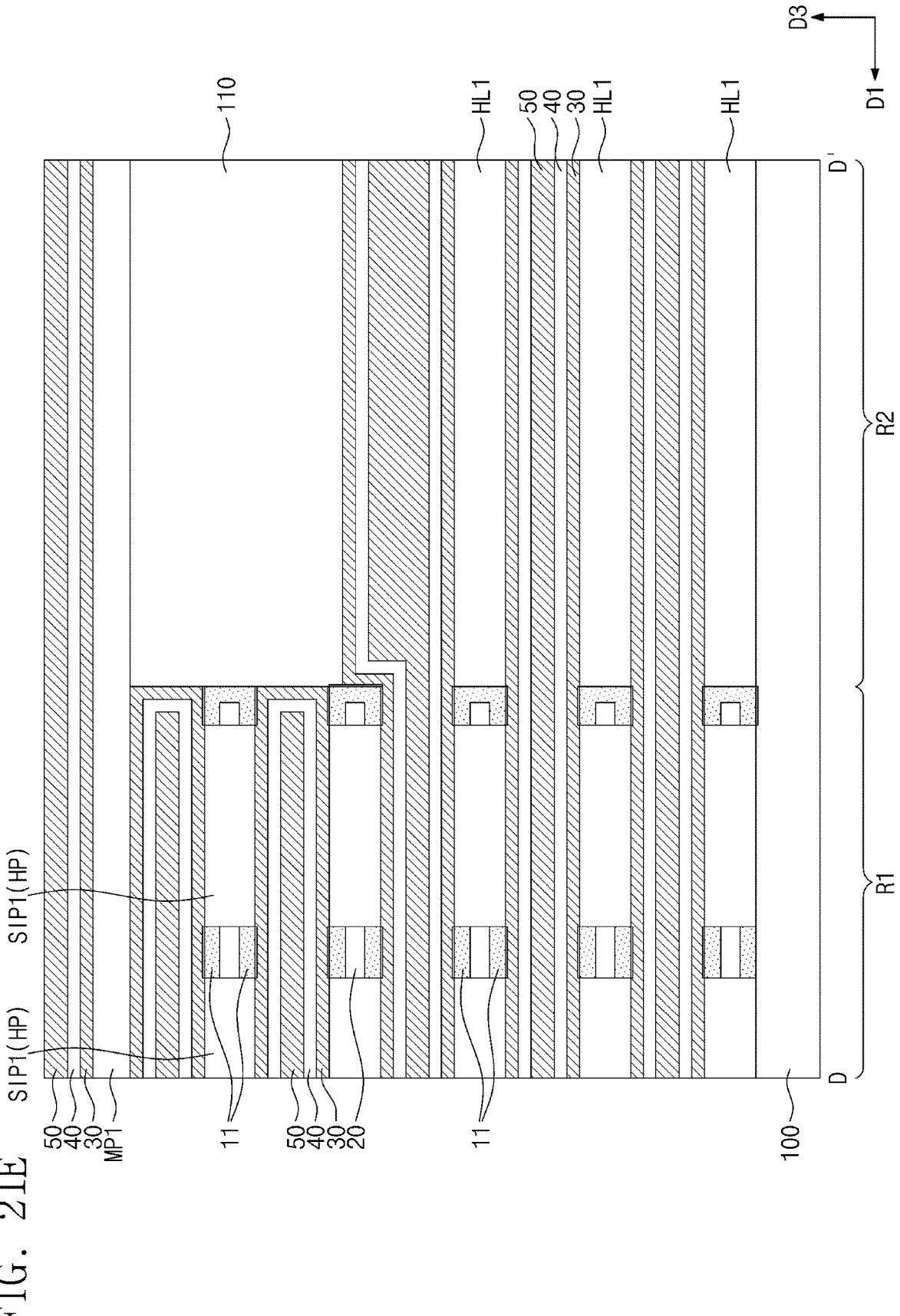
Figure 22A:
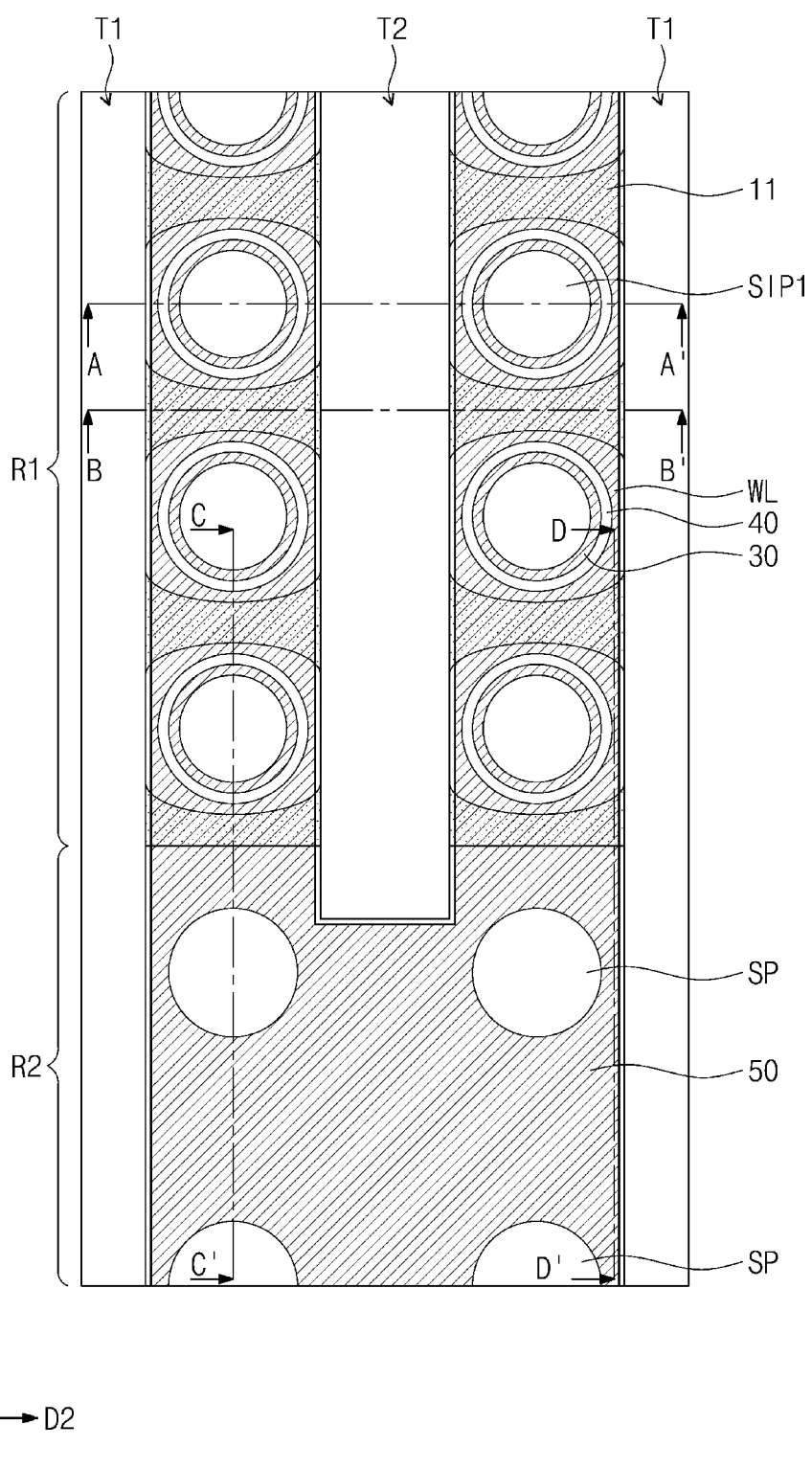
Figure 22B:
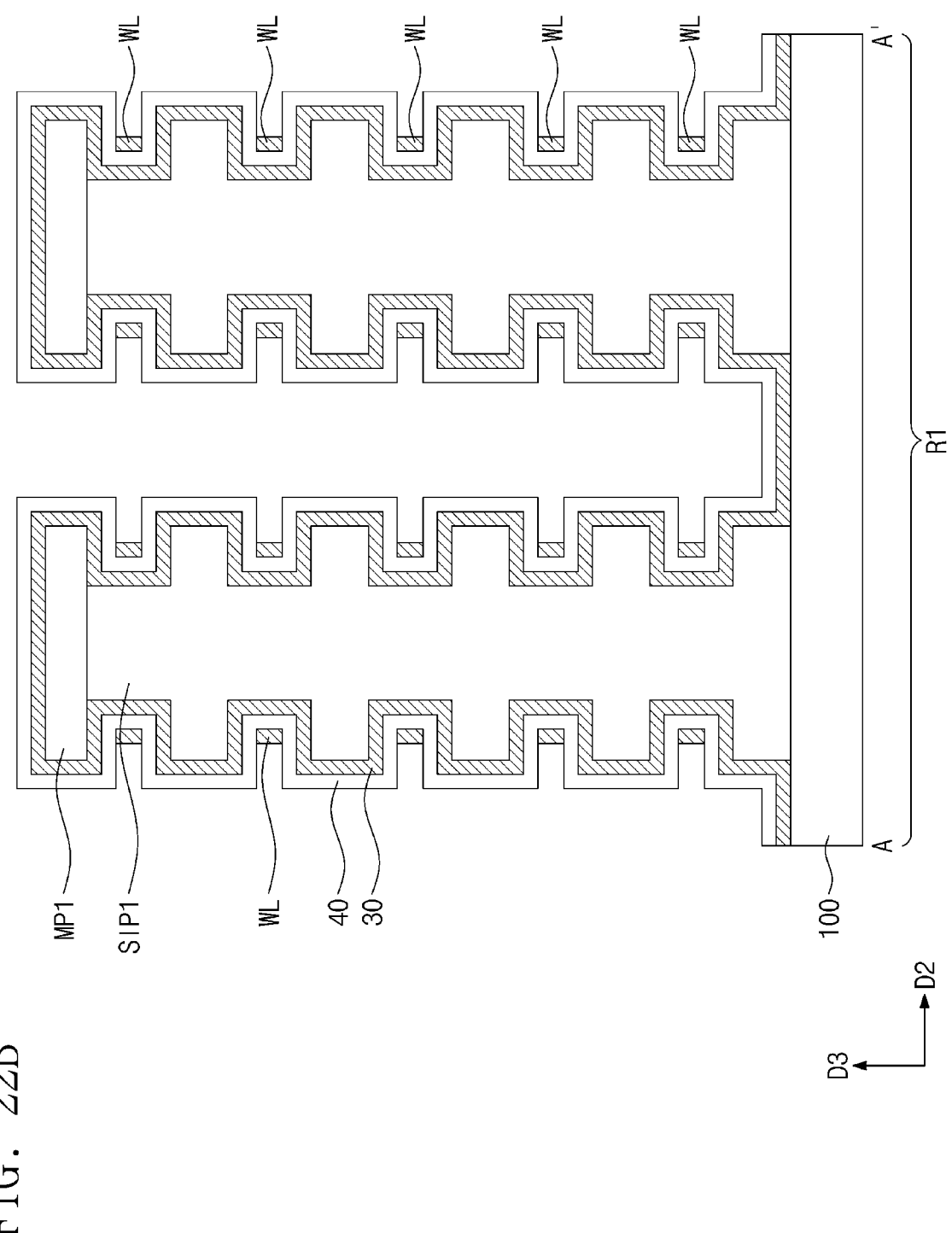
Figure 22C:
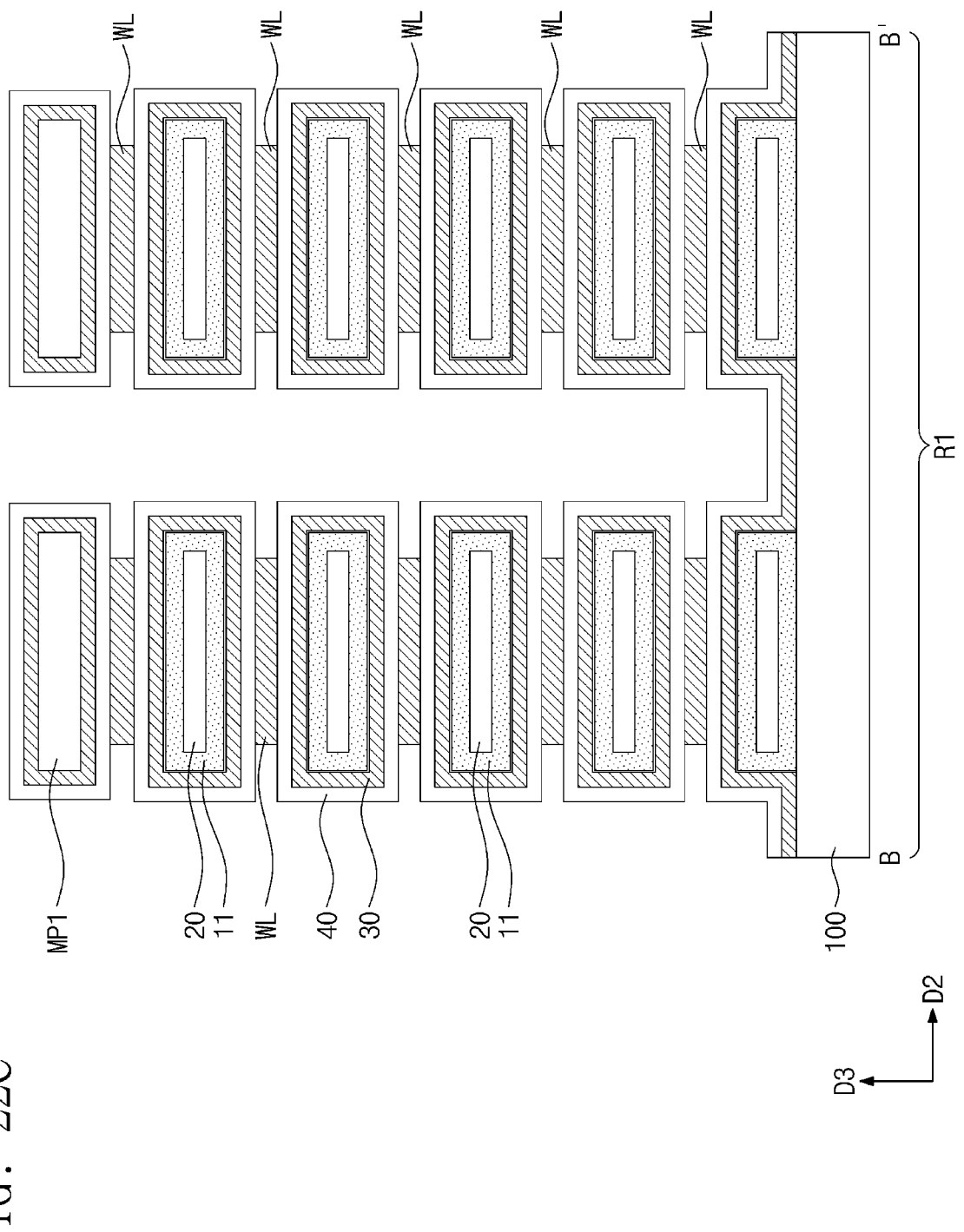
Figure 22D:
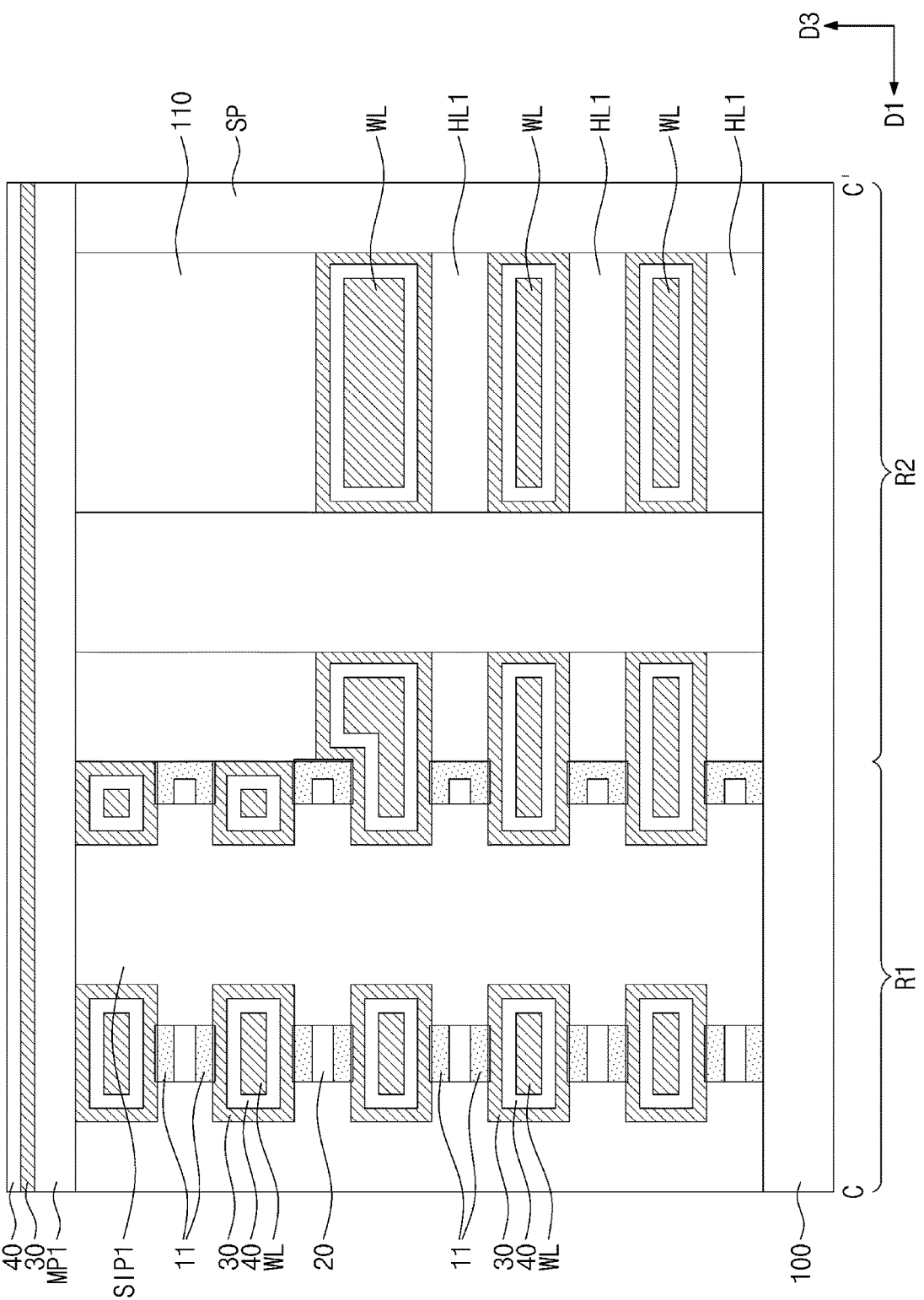
Figure 22E:
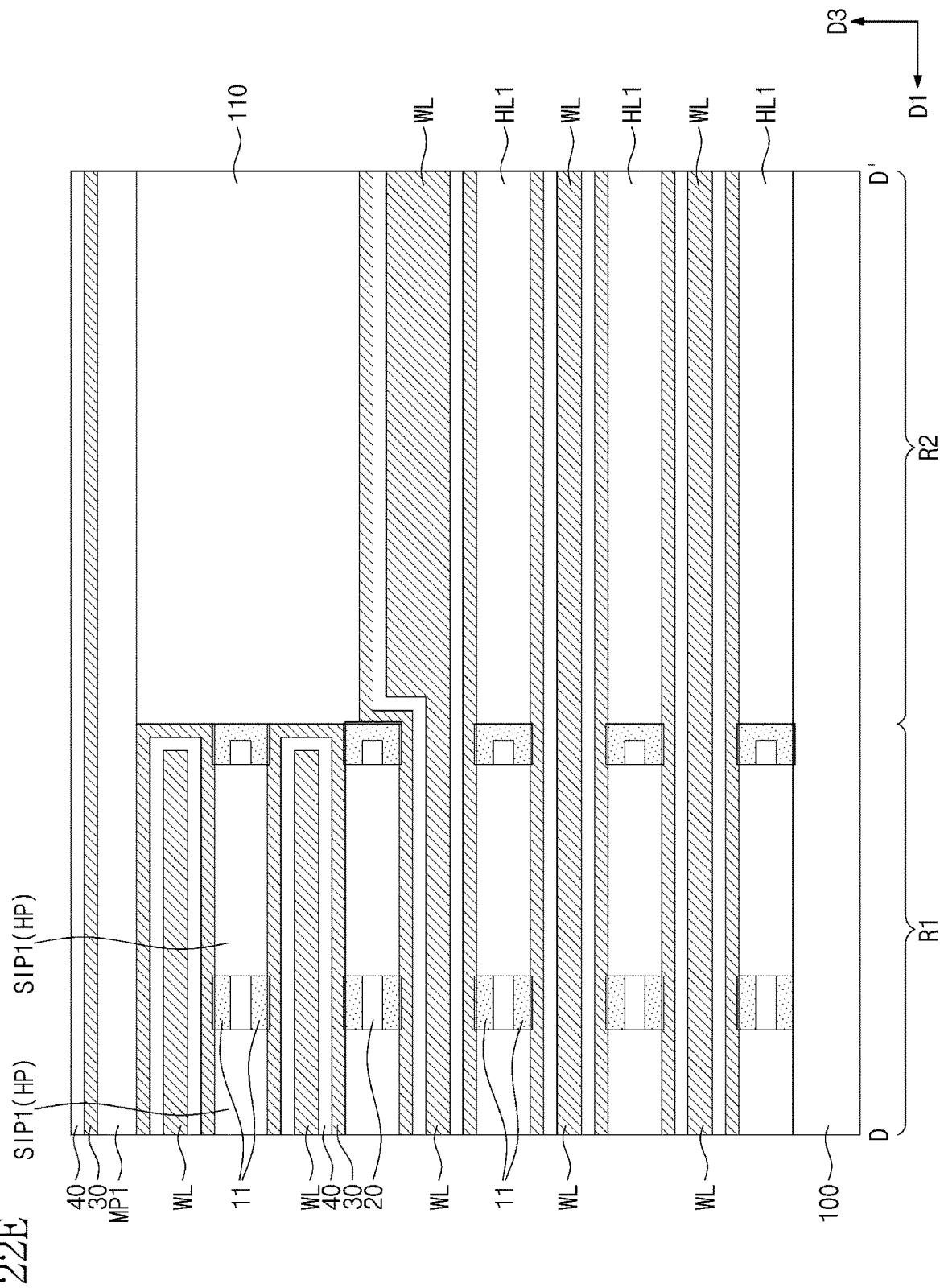
Figure 23A:
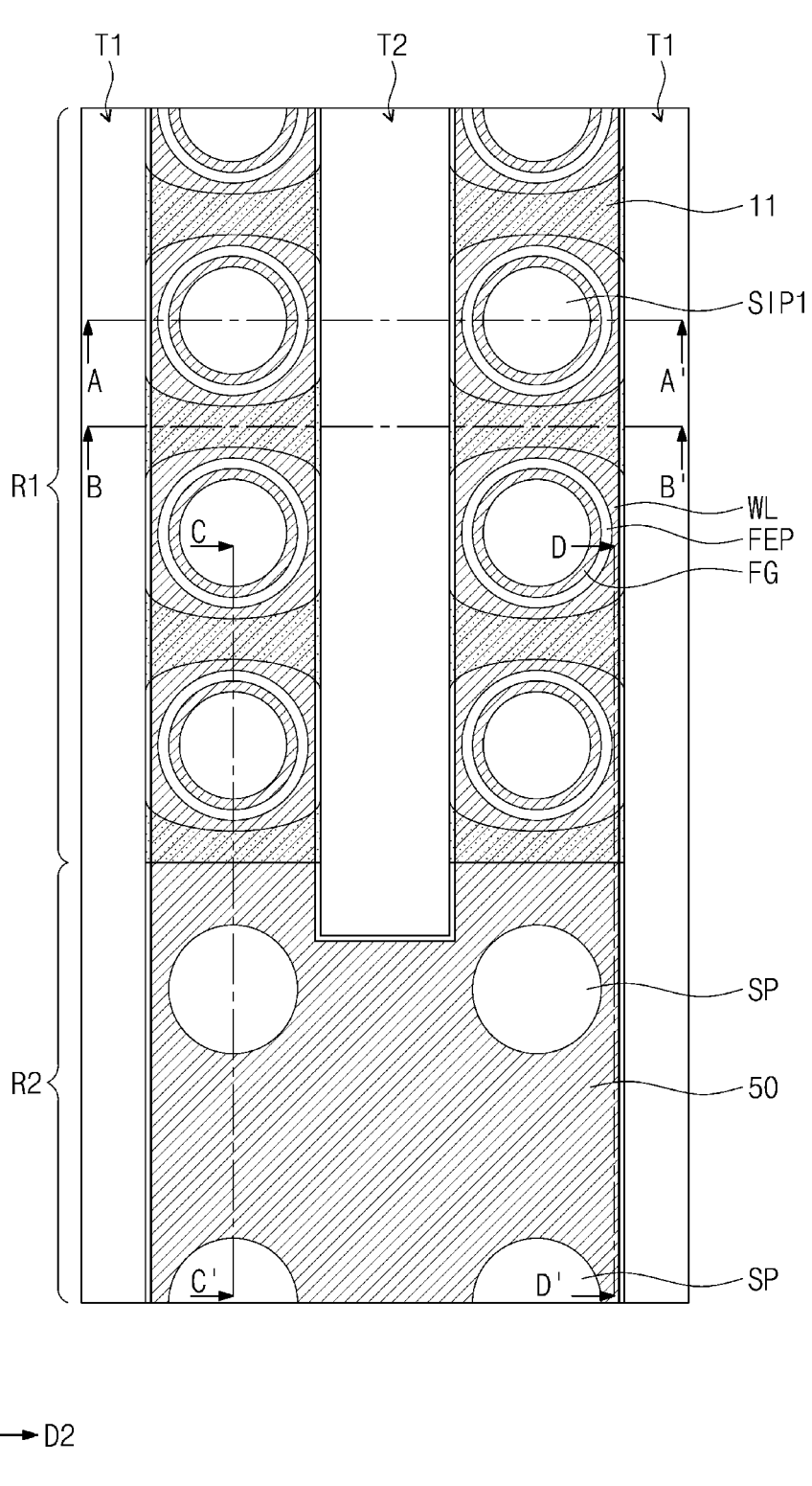
Figure 23B:
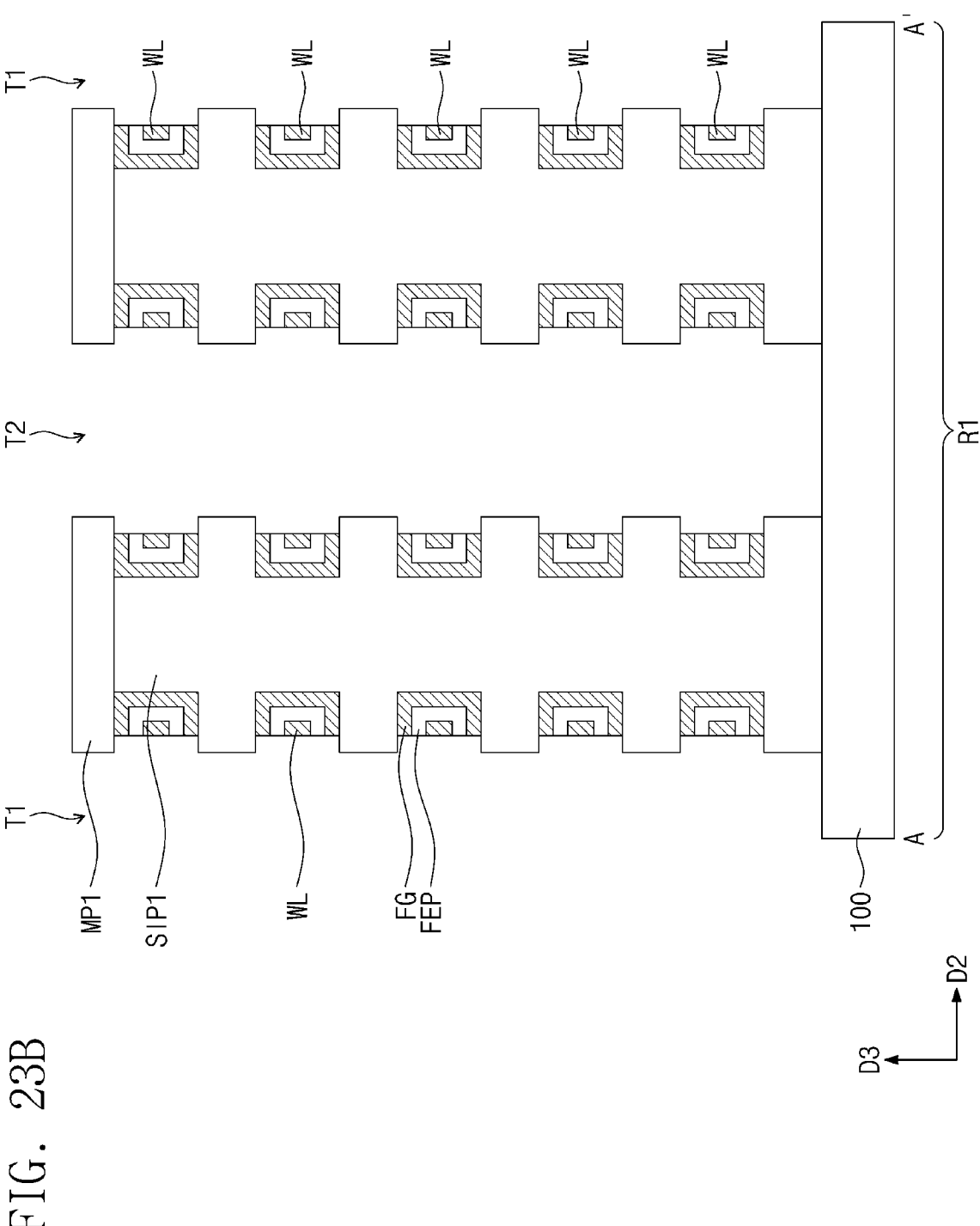
Figure 23C:
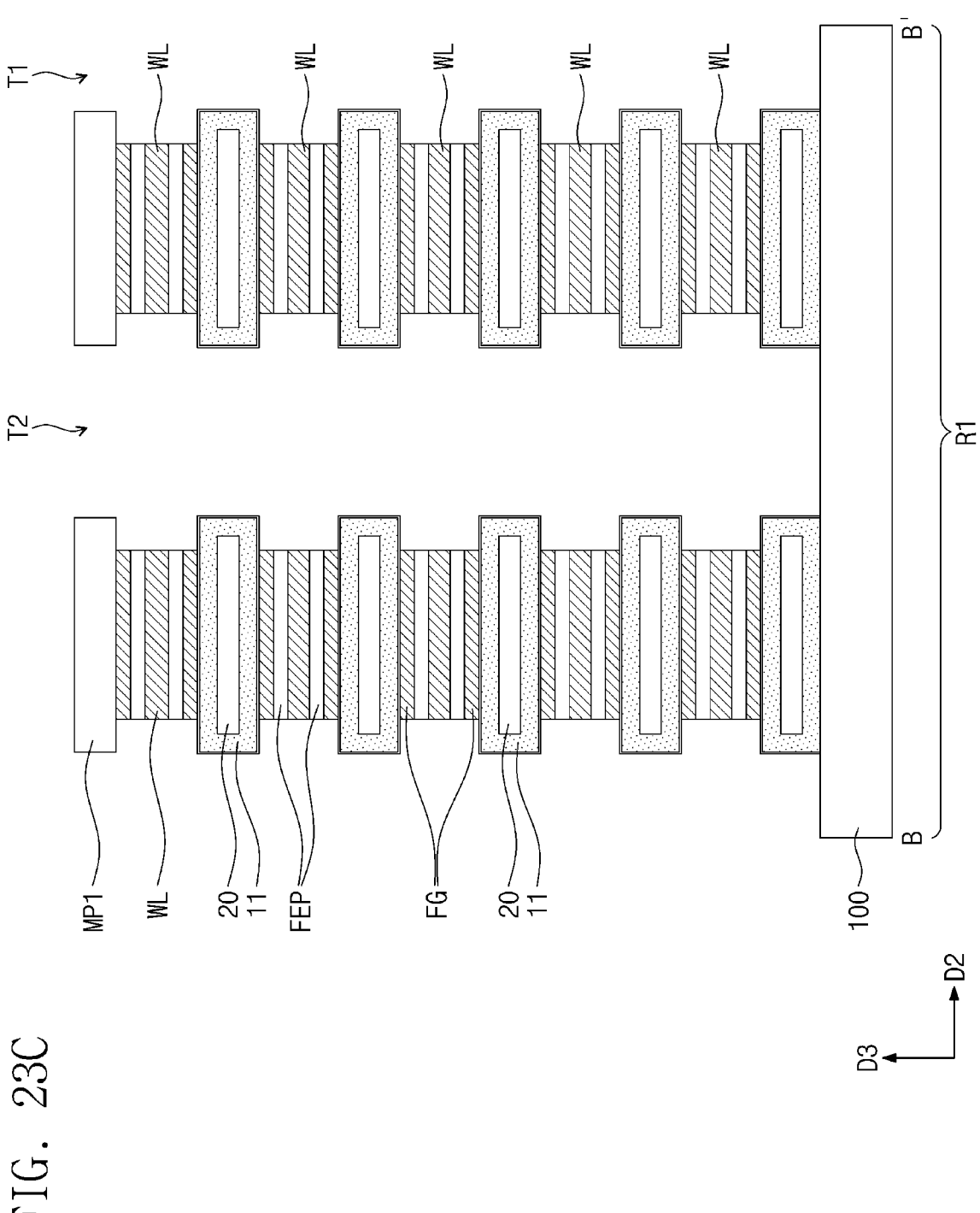
Figure 23D:
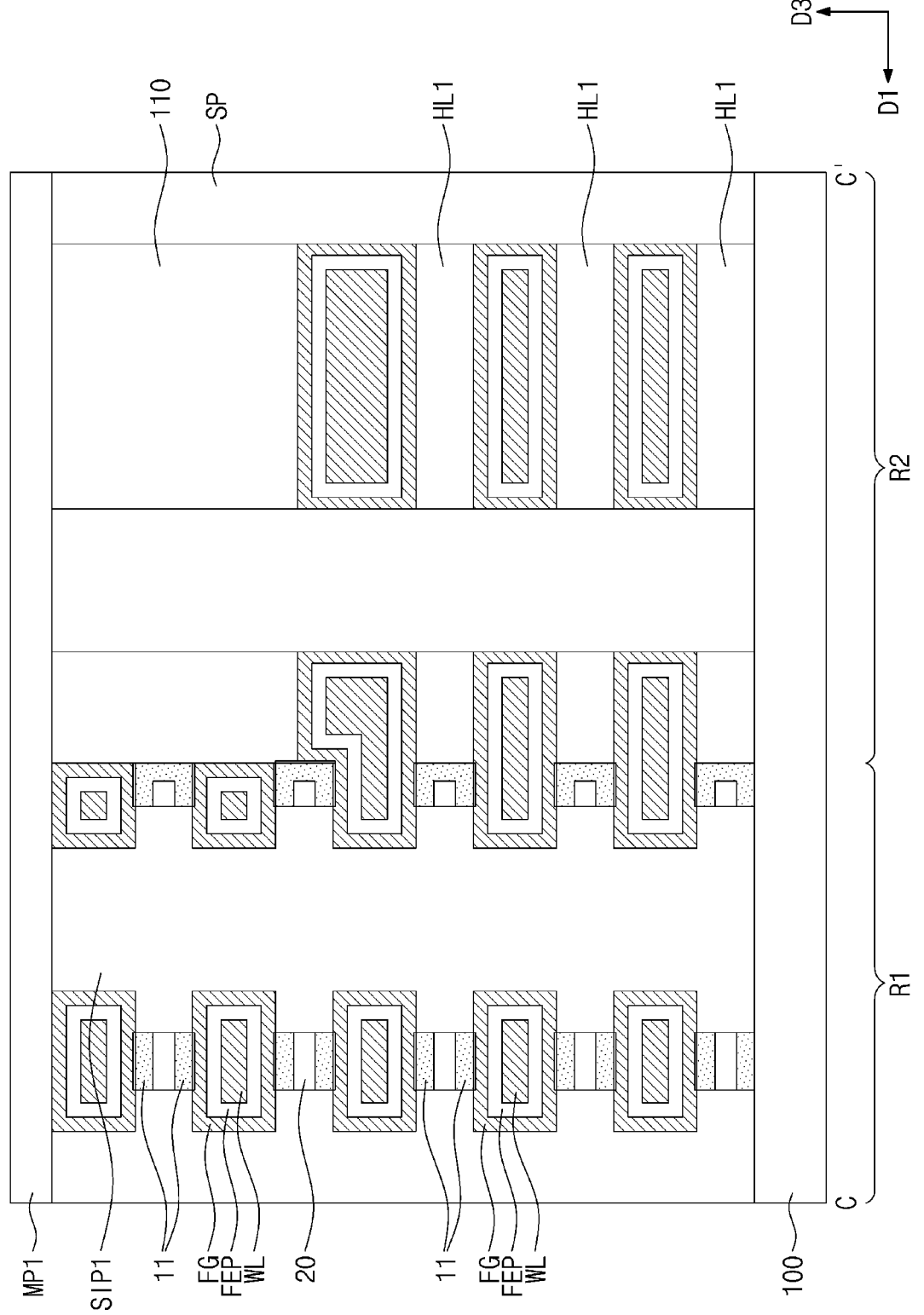
Figure 23E:
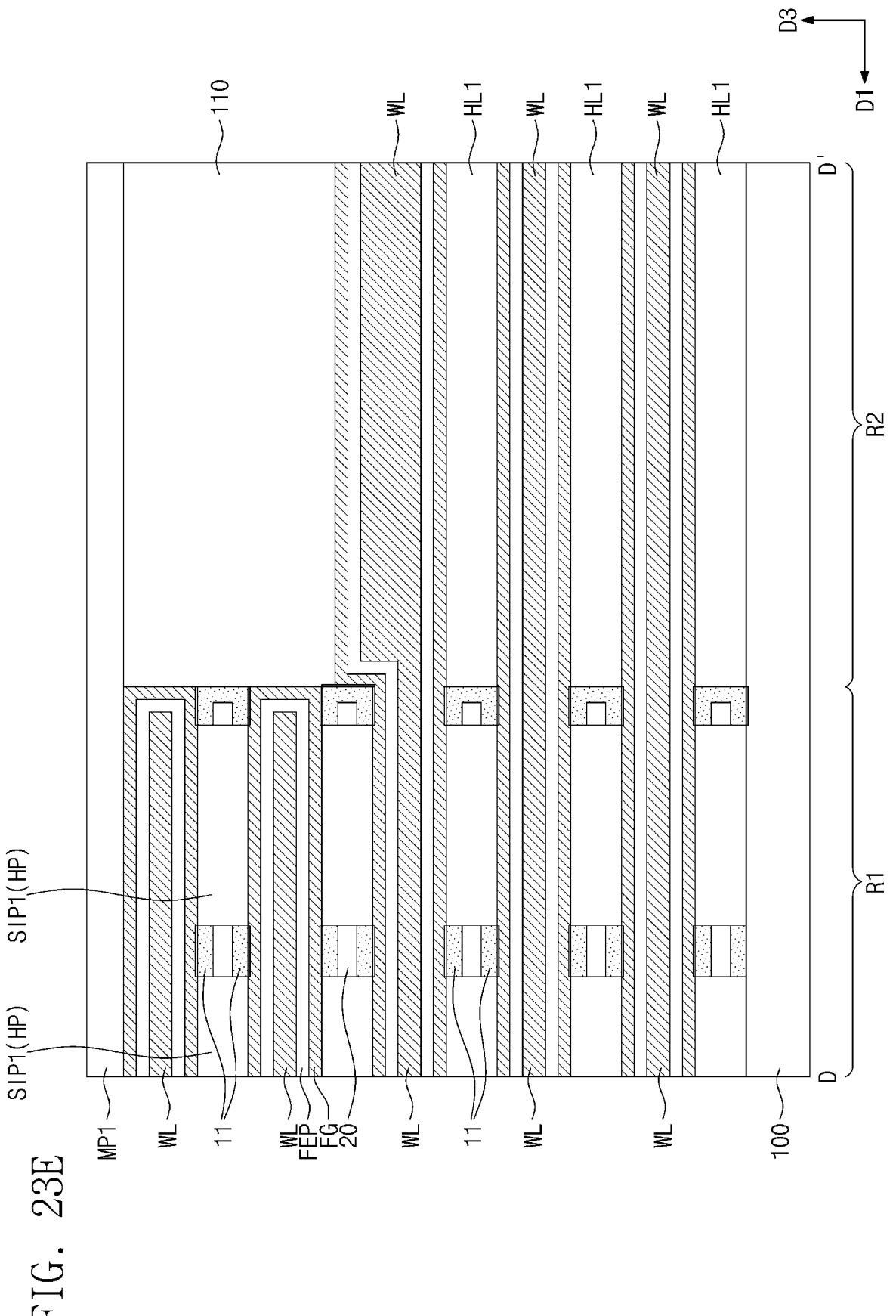
Figure 24A:
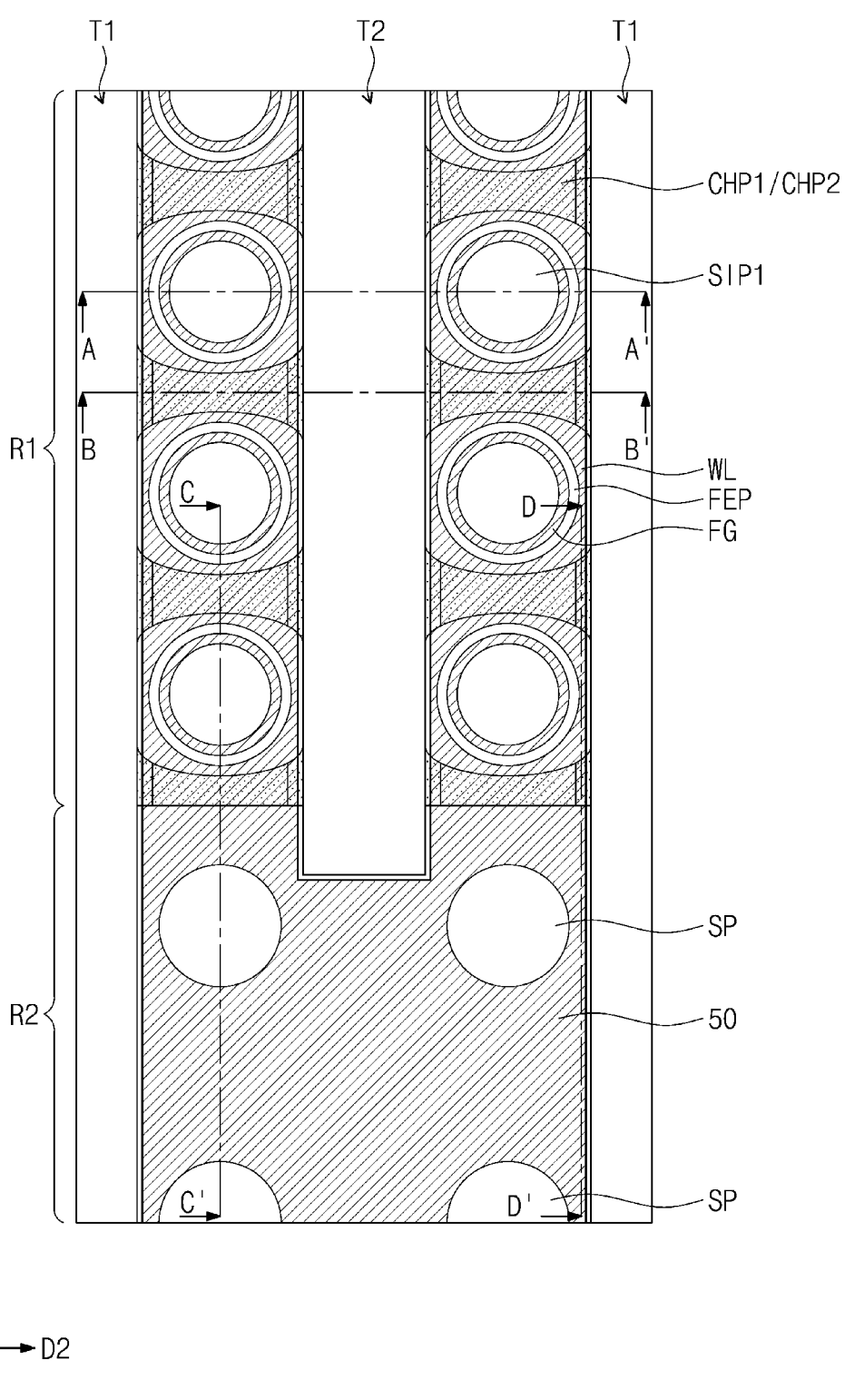
Figure 24B:
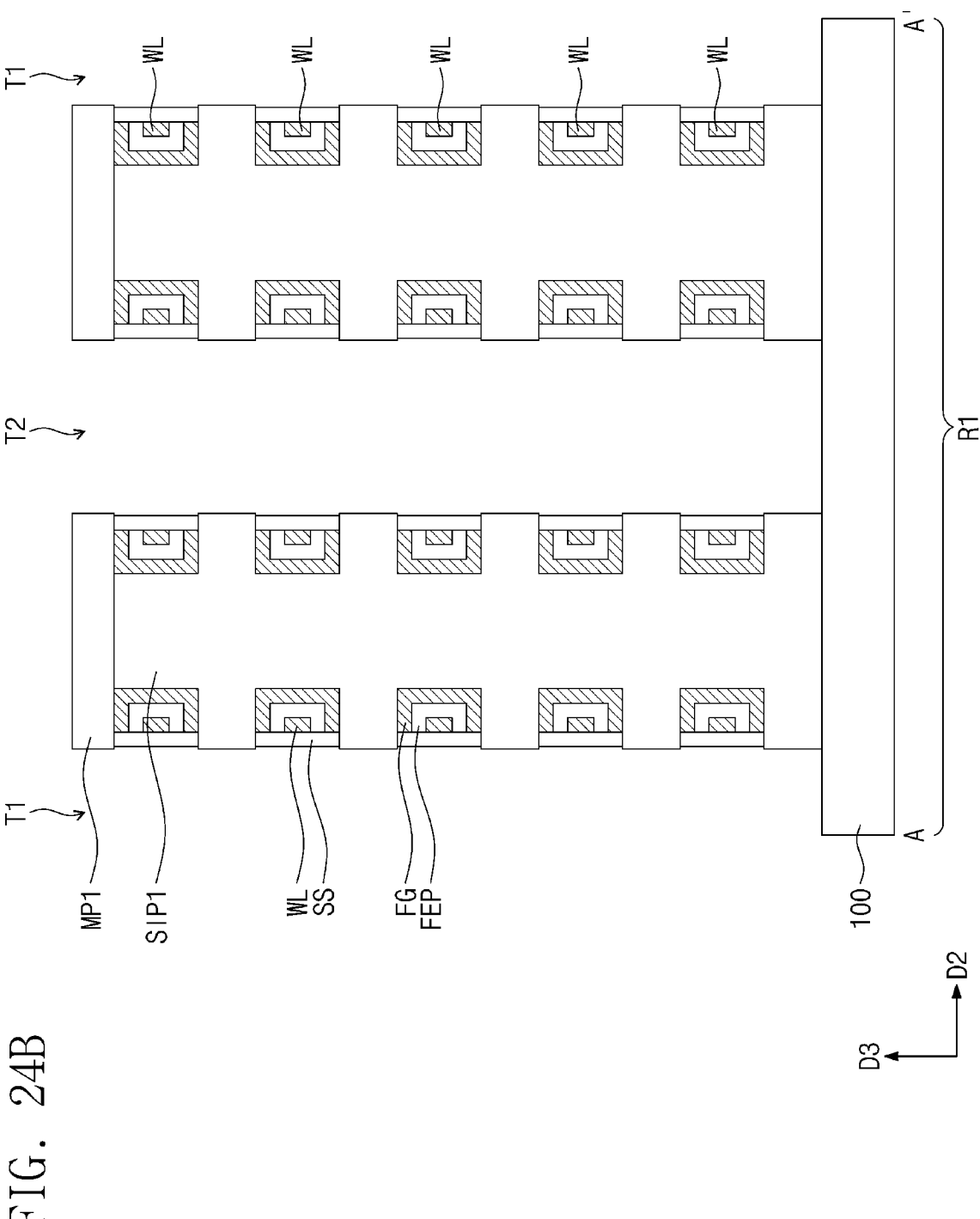
Figure 24C:
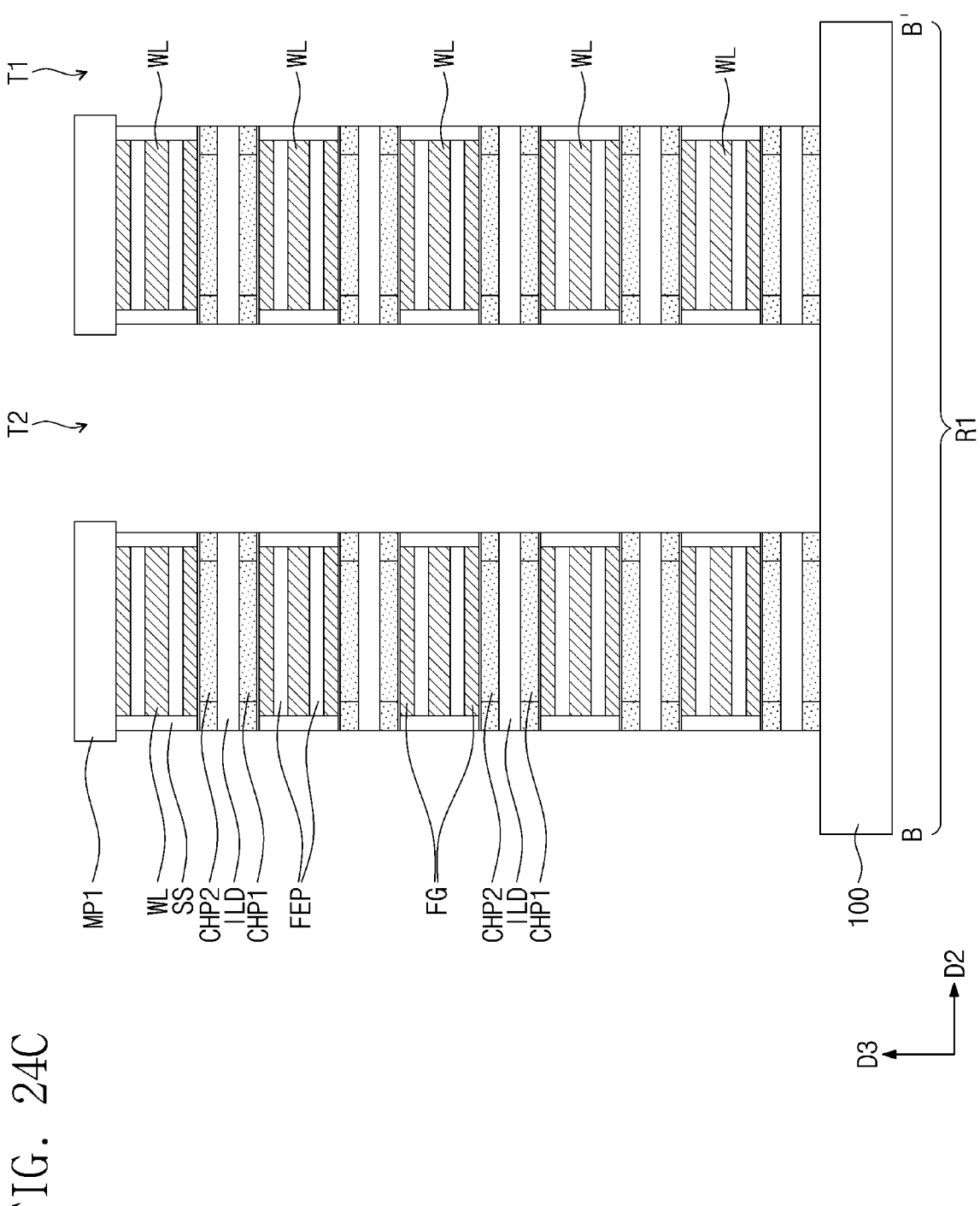
Figure 24D:
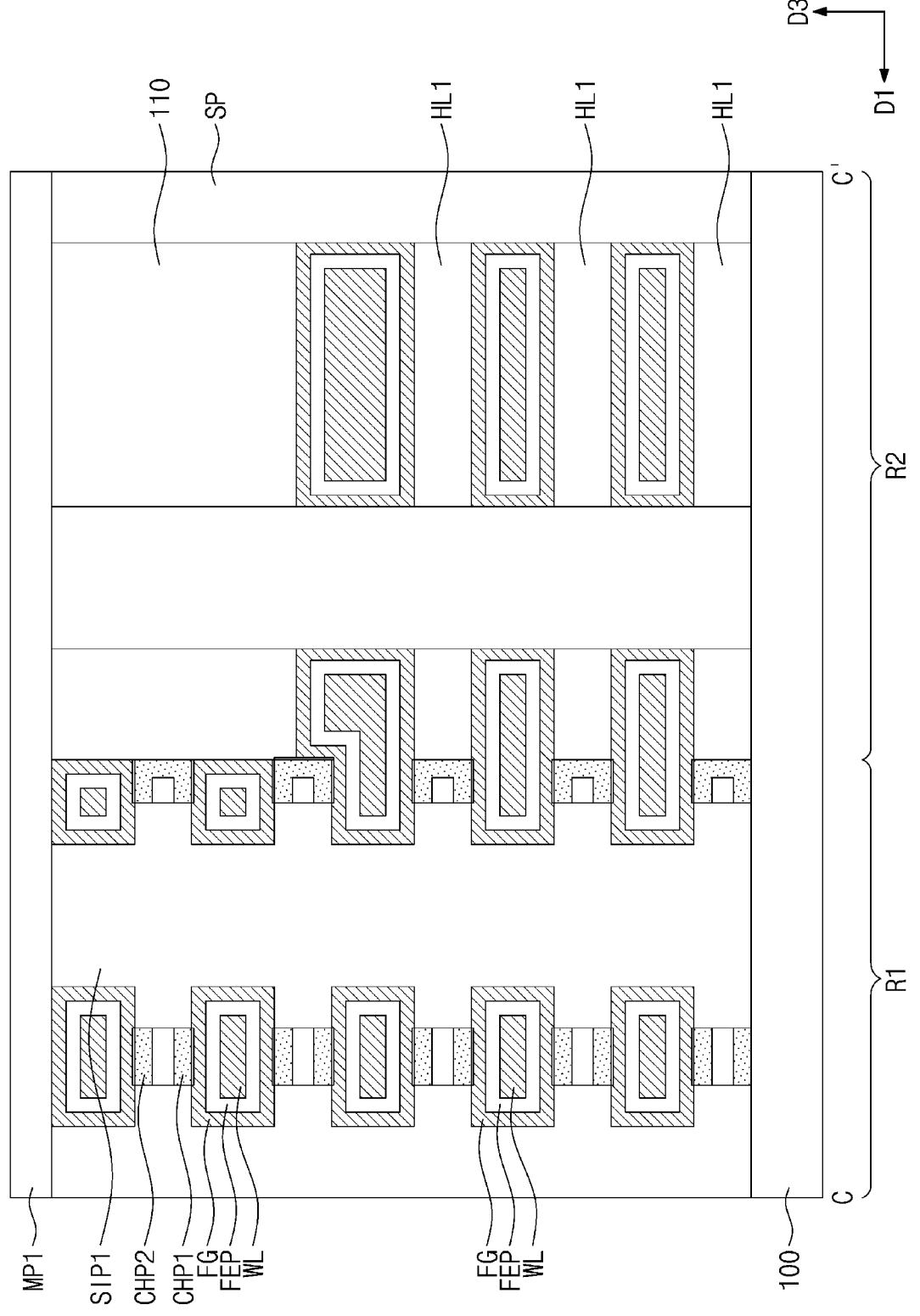
Figure 24E:
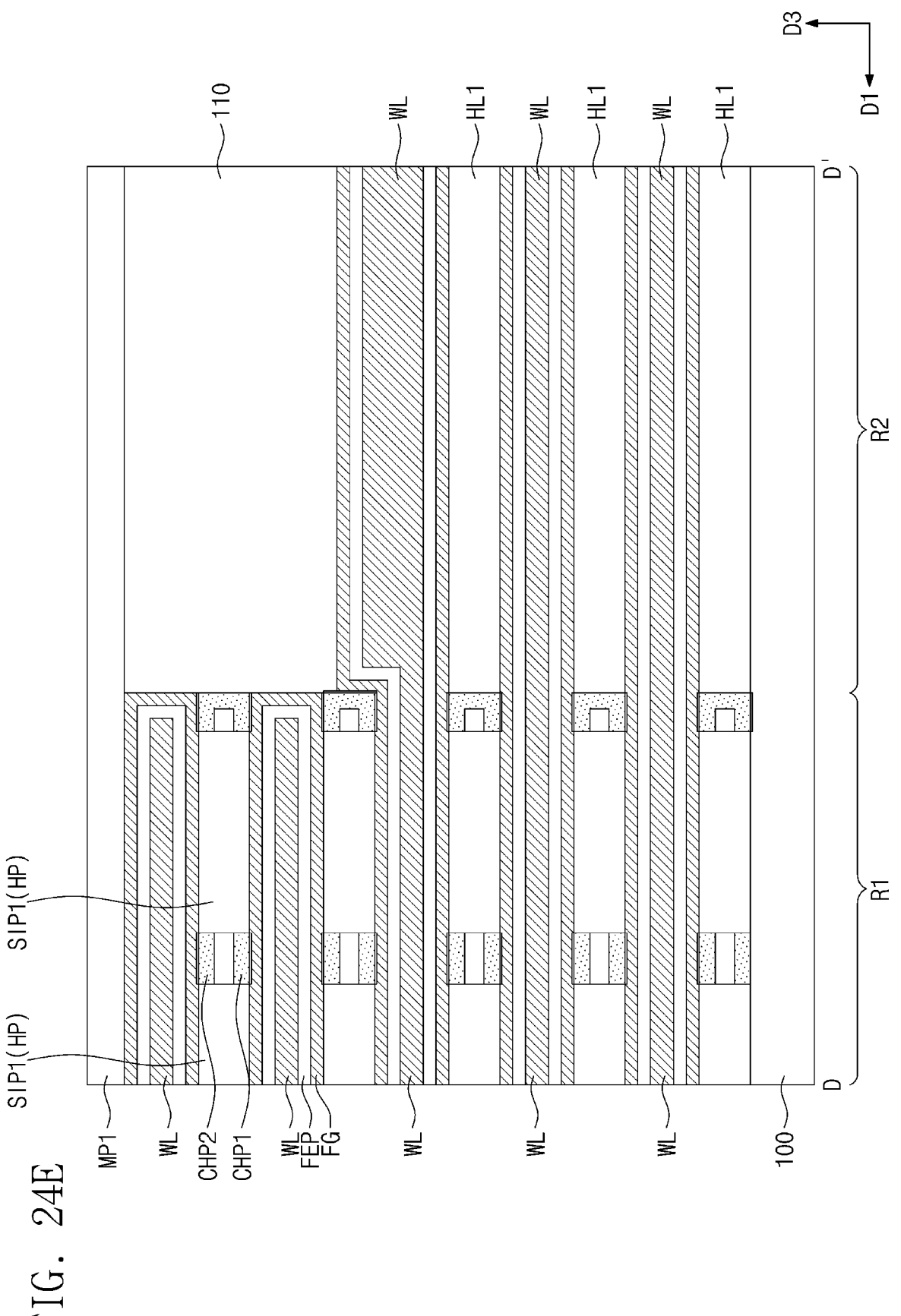

FIGS. 13A to 27A are plan views that illustrate a method of fabricating a semiconductor memory device, according to an embodiment of the inventive concept. FIGS. 13B to 27B are sectional views taken along lines A-A' of FIGS. 13A to 27A, respectively. FIGS. 13C to 27C are sectional views taken along lines B-B' of FIGS. 13A to 27A, respectively. FIGS. 13D to 24D are sectional views taken along lines C-C' of FIGS. 13A to 27A, respectively. FIGS. 13E to 24E are sectional views taken along lines D-D' of FIGS. 13A to 27A, respectively. FIG. 13F is a sectional view taken along a line F-F' of FIG. 13A. FIG. 20F is a sectional view taken along a line F-F' of FIG. 20A.

Referring to FIGS. 13A, 13B, 13C, 13D, 13E, and 13F, in an embodiment, the substrate 100 that includes the first and second regions R1 and R2 is provided. The first region R1 is a cell array region, and the second region R2 is a word line pad region or a connection region. The substrate 100 is formed of or includes at least one of a semiconductor material, such as silicon, an insulating material, such as glass, or a semiconductor or conductor material that is covered with an insulating material.

A mold structure MS is formed on the substrate 100. The formation of the mold structure MS includes vertically and alternately stacking first and second mold layers HL1 and HL2 on the substrate 100.

In the mold structure MS, the first mold layers HL1 are formed of a material that can be etched with an etch selectivity with respect to the substrate 100 and the second mold layers HL2. For example, the first mold layers HL1 are formed of silicon oxide, and the second mold layers HL2 are formed of silicon nitride.

The first and second mold layers HL1 and HL2 are deposited using one of a thermal chemical vapor deposition (thermal CVD) process, a plasma-enhanced chemical vapor deposition (PE-CVD) process, a physical chemical vapor deposition (physical CVD) process, or an atomic layer deposition (ALD) process. The first and second mold layers HL1 and HL2 are deposited in-situ.

A staircase patterning process is performed on the mold structure MS in the second region R2. The staircase patterning process includes forming a mask pattern that covers the mold structure MS in the first and second regions R1 and R2 and alternately repeating steps of etching a portion of the mold structure MS and reducing a horizontal area of the mask pattern. As a result of the staircase patterning process, the second mold layers HL2 have end portions that are sequentially exposed in the first direction D1. For example, as a result of the staircase patterning process, a staircase structure is formed in the mold structure MS in the second region R2 along the first direction D1. For example, a length of the second mold layers HL2 in the first direction D1 decreases with increasing distance from the substrate 100.

In an embodiment, after the formation of the staircase structure, a thin film that is formed of the same material as the second mold layers HL2 is deposited on top surfaces of the end portions of the second mold layers HL2, and an etch-back process is performed on the thin film that increases a thickness of an end portion of each second mold layer HL2.

After the formation of the staircase structure in the mold structure MS, the planarization insulating layer 110 is formed on the second region R2. The formation of the planarization insulating layer 110 includes forming a thick insulating layer on the first and second regions R1 and R2 that covers the mold structure MS, and planarizing the thick insulating layer and exposing a top surface of the uppermost second mold layer HL2 on the first region R1. The planarization insulating layer 110 is formed of an insulating material, such as silicon oxide, that has an etch selectivity with respect to the second mold layer HL2.

First and second preliminary line patterns 103 and 105 are formed that penetrate the mold structure MS in the third direction D3 and extend in the first direction D1.

The second preliminary line pattern 105 is formed between a pair of the first preliminary line patterns 103. When measured in the first direction D1, a length of the second preliminary line pattern 105 is less than a length of the first preliminary line pattern 103. Due to the first and second preliminary line patterns 103 and 105, the mold structure MS in the first region R1 has a line shape that extends in the first direction D1.

The formation of the first and second preliminary line patterns 103 and 105 includes forming a mask pattern that has openings that extend in the first direction D1, anisotropically etching the mold structure MS using the mask pattern as an etch mask and forming first and second trenches, and filling the first and second trenches with an insulating material. In an embodiment, before filling the first and second trenches, an etch stop layer 101 is formed that conformally covers inner surfaces of the first and second trenches. For example, the etch stop layer 101 covers a side surface of the mold structure MS. The etch stop layer 101 is formed of an insulating material that has an etch selectivity with respect to the substrate 100 and the first and second preliminary line patterns 103 and 105.

The supporter pillars SP are formed that penetrate the mold structure MS in the second region R2. The supporter pillars SP penetrate the staircase structure of the mold structure MS. For example, the supporter pillars SP penetrate the end portions of the second mold layers HL2. The supporter pillars SP are spaced apart from each other in the first and second directions D1 and D2.

The formation of the supporter pillars SP includes patterning the mold structure MS and form openings that expose the substrate 100 in the second region R2, filling the openings with an insulating material, and planarizing the insulating material. The supporter pillars SP are formed of or include an insulating material that has an etch selectivity with respect to the second mold layers HL2. Top surfaces of the supporter pillars SP are substantially coplanar with the top surface of the planarization insulating layer 110.

Referring to FIGS. 14A, 14B, 14C, 14D, and 14E, in an embodiment, openings OP are formed in the first region R1 that penetrate each line portion of the mold structure MS. The openings OP are spaced apart from each other in the first direction D1. The second preliminary line pattern 105 is disposed between openings OP that are adjacent to each other in the second direction D2.

The formation of the openings OP includes forming a hard mask pattern HP1 that has openings that correspond to the openings OP on the mold structure MS, and anisotropically etching the mold structure MS using the hard mask pattern HP1 as an etch mask. The openings OP expose the top surface of the substrate 100, and the top surface of the substrate 100 below the openings OP is recessed owing to an over-etch in the anisotropic etching process.

The openings OP have a diameter that is less than a width of each line portion of the mold structure MS. Accordingly, each opening OP is spaced apart from the first and second preliminary line patterns 103 and 105 by the mold structure MS. In the first region R1, each line portion of the mold structure MS has a first side surface SW1 and a second side surface SW1 that are opposite to each other in the second direction D2. A distance in the second direction D2 between the first side surface SW1 of the mold structure MS and the openings OP is substantially equal to a distance in the second direction D2 between the second side surface SW1 of the mold structure MS and the openings OP.

However, in some embodiments, the openings OP expose portions of the etch stop layer 101. For example, a distance in the second direction D2 between the first side surface of the mold structure MS and the openings OP differs from a distance in the second direction D2 between the second side surface of the mold structure MS and the openings OP. The vertical insulating pillars SIP1 shown in FIGS. 8A and 8B are formed in the openings OP.

For example, the openings OP expose portions of the etch stop layer 101, and openings OP that are adjacent to each other in the second direction D2 have a mirror symmetry with respect to each other. For example, the vertical insulating pillars SIP1 shown in FIGS. 9A and 9B are formed in the openings OP.

Referring to FIGS. 15A, 15B, 15C, 15D, and 15E, in an embodiment, in the first region R1, the first horizontal regions HR1 are formed between vertically-adjacent second mold layers HL2 by removing the first mold layers HL1 exposed by the openings OP. A vertical thickness of the first horizontal region HR1, such as a vertical distance between adjacent second mold layers HL2, is substantially equal to the thickness of the first mold layer HL1.

The formation of the first horizontal regions HR1 includes isotropically etching the first mold layers HL1 by an etching process that has an etch selectivity with respect to the substrate 100, the second mold layers HL2, the etch stop layer 101, and the first and second preliminary line patterns 103 and 105. Due to the first and second preliminary line patterns 103 and 105, the second mold layers HL2 are prevented from collapsing when removing the first mold layers HL1. In an embodiment, when the first horizontal regions HR1 are formed in the first region R1, portions of the first mold layers HL1 in the second region R2 are not etched and remain.

Referring to FIGS. 16A, 16B, 16C, 16D, and 16E, in an embodiment, first preliminary channel patterns 10 and interlayer insulating layers 20 are formed in the first horizontal regions HR1.

The formation of the first preliminary channel patterns 10 and the interlayer insulating layers 20 includes sequentially depositing a channel layer and an insulating layer that conformally cover inner surfaces of the first horizontal regions HR1 and the openings OP, and etching the channel layer and the insulating layer that expose the inner surfaces of the openings OP and the substrate 100.

A thickness of the channel layer is less than half of the vertical thickness of each first horizontal region HR1. The channel layer is formed by at least one of a physical vapor deposition (PVD) process, a thermal chemical vapor deposition (thermal CVD) process, a low-pressure chemical vapor deposition (LP-CVD) process, a plasma-enhanced chemical vapor deposition (PE-CVD) process, or an atomic layer deposition (ALD) process. In an embodiment, the channel layer has a thickness of several to several tens of nanometers, such as 1 nm to 30 nm, or 1 nm to 10 nm. The channel layer is formed of or includes at least one of a semiconductor, an oxide semiconductor, or a two-dimensional semiconductor. For example, the channel layer is formed of or includes at least one of silicon, germanium, silicon-germanium, or indium gallium zinc oxide (IGZO).

After depositing the channel layer, the insulating layer is formed with a uniform thickness on the channel layer. The insulating layer fills the first horizontal regions HR1 provided with the channel layer. The insulating layer is formed of an insulating material that has an etch selectivity with respect to the second mold layers HL2 and the channel layer. In an embodiment, the insulating layer is formed of or includes silicon oxide.

After depositing the insulating layer, an isotropic etching process is performed that exposes the channel layer that is formed on the inner surfaces of the openings OP. Accordingly, the interlayer insulating layers 20 are formed in the first horizontal regions HR1.

An isotropic etching process is performed on the channel layer that exposes side surfaces of the second mold layers HL2 through the openings OP again. Accordingly, the first preliminary channel patterns 10 are formed in the first horizontal regions HR1. In the first region R1, the first preliminary channel patterns 10 and the interlayer insulating layers 20 extend in the first direction D1.

Referring to FIGS. 17A, 17B, 17C, 17D, and 17E, in an embodiment, second preliminary channel patterns 11 are formed by etching portions of the first preliminary channel patterns 10 through the openings OP. In the first region R1, the second preliminary channel patterns 11 are spaced apart from each other in the first direction D1.

The first preliminary channel patterns 10 are laterally etched in the first and second directions D1 and D2 by an etchant that is supplied through the openings OP when the second preliminary channel patterns 11 are formed. Each of the first preliminary channel patterns 10 is divided into a plurality of the second preliminary channel patterns 11 that are spaced apart from each other in the first direction D1. As a result of the isotropic etching process through the openings OP, a width of each of the second preliminary channel patterns 11 in the first direction D1 is less at a center portion thereof than near a side surface thereof. A width of each of the second preliminary channel patterns 11 in the first direction D1 is less than a distance between adjacent openings OP.

Since the second preliminary channel patterns 11 are formed by the afore-described method, second horizontal regions HR2 are formed between the second mold layers HL2 that expose the second preliminary channel patterns 11. The second horizontal regions HR2 are formed by etching the first preliminary channel patterns 10.

Alternatively, in an embodiment, when the first preliminary channel patterns 10 are formed of an oxide semiconductor material, the step of etching portions of the first preliminary channel patterns 10 to form the second horizontal regions HR2 is omitted.

Referring to FIGS. 18A, 18B, 18C, 18D, and 18E, in an embodiment, the first vertical insulating pillars SIP1 are formed by filling the second horizontal regions HR2 and the openings OP with an insulating material. The first vertical insulating pillars SIP1 are formed by depositing a vertical insulating layer that fills the openings OP and planarizing the vertical insulating layer and exposing the top surface of the mold structure MS.

Each of the first vertical insulating pillars SIP1 includes the horizontal portions HP that fill spaces between vertically-adjacent second mold layers HL2, and a vertical portion that fills the openings OP. The horizontal portions HP cover side surfaces of the second preliminary channel patterns 11 in the first direction D1.

Referring to FIGS. 19A, 19B, 19C, 19D, and 19E, in an embodiment, a first hard mask pattern MP1 is formed on the uppermost second mold layer HL2 after the formation of the first vertical insulating pillars SIP1. In the first region R1, the first hard mask pattern MP1 covers the top surfaces of the first vertical insulating pillars SIP1 and has line-shaped openings. In the second region R2, the first hard mask pattern MP1 covers the top surfaces of the supporter pillars SP and the top surface of the planarization insulating layer 110.

The first and second preliminary line patterns 103 and 105 are etched using the first hard mask pattern MP1 as an etch mask. Accordingly, first and second trenches T1 and T2 that expose the etch stop layer 101 are formed. The first trenches T1 extend in the first direction D1 from the first region R1 to the second region R2, and the second trench T2 is disposed between the first trenches T1 in the first region R1.

Referring to FIGS. 20A, 20B, 20C, 20D, 20E, and 20F, in an embodiment, the etch stop layer 101 that is exposed by the first and second trenches T1 and T2 is removed. The second mold layers HL2 that are exposed through the first trenches T1 are isotropically etched to form third horizontal regions HR3. The third horizontal regions HR3 are formed between the horizontal portions HP of the first vertical insulating pillars SIP1 and between vertically-adjacent second preliminary channel patterns 11. For example, the third horizontal regions HR3 expose top and bottom surfaces of the second preliminary channel patterns 11. In addition, each of the third horizontal regions HR3 extends in the first direction D1 from the first region R1 to the second region R2. Each of the third horizontal regions HR3 exposes portions of side surfaces of the supporter pillars SP in the second region R2.

Referring to FIGS. 21A, 21B, 21C, 21D, and 21E, in an embodiment, a gate insulating layer, a floating gate layer 30, a data storing layer 40, and a gate conductive layer 50 are sequentially deposited in the third horizontal regions HR3.

The gate insulating layer conformally covers inner surfaces of the third horizontal regions HR3 and is directly formed on surfaces of the second preliminary channel patterns 11. The gate insulating layer may be formed by a thermal oxidation process or a deposition process.

A total thickness in the third direction D3 of the floating gate layer 30 and the data storing layer 40 is less than half of a distance between the horizontal portions HP of the first vertical insulating pillars SIP1, such as a vertical thickness of the third horizontal region HR3. The gate conductive layer 50 is formed that fills the third horizontal regions HR3 in which the gate insulating layer, the floating gate layer 30, and the data storing layer 40 are formed.

The gate insulating layer is formed of or includes silicon oxide or a high-k dielectric material, and the data storing layer 40 is formed of a ferroelectric material. In an embodiment, the floating gate layer 30 and the data storing layer 40 are formed of or include at least one conductive material.

In an embodiment, the step of forming the floating gate layer 30 in the third horizontal regions HR3 is omitted.

Referring to FIGS. 22A, 22B, 22C, 22D, and 22E, in an embodiment, the word lines WL, which are vertically separated from each other, are formed by performing an isotropic etching process on the gate conductive layer 50. The word lines WL are locally formed in the third horizontal regions HR3. For example, the side surfaces of the word lines WL are recessed relative to the side surfaces of the second preliminary channel patterns 11.

Referring to FIGS. 23A, 23B, 23C, 23D, and 23E, in an embodiment, the data storage patterns FEP and the floating gates FG, which are vertically separated from each other, are formed by sequentially performing an isotropic etching process on the floating gate layer 30 and the data storing layer 40. For example, the floating gate layer 30 and the data storing layer 40 are removed from the side surfaces of the horizontal portions HP of the first vertical insulating pillars SIP1, and the data storage patterns FEP and the floating gates FG are formed with side surfaces that are aligned with side surfaces of the word lines WL. Accordingly, one word line WL, a pair of data storage patterns FEP, and a pair of floating gates FG are formed in each of the third horizontal regions HR3.

Referring to FIGS. 24A, 24B, 24C, 24D, and 24E, in an embodiment, the spacer insulating patterns SS are formed in the third horizontal regions HR3, which are provided with the word lines WL, the data storage patterns FEP, and the floating gates FG. The spacer insulating patterns SS are formed of an insulating material that has an etch selectivity with respect to the interlayer insulating layers ILD and the second preliminary channel patterns 11.

The formation of the spacer insulating patterns SS includes forming a capping insulating layer on inner surfaces of the first and second trenches Ti and T2 that fills the third horizontal regions HR3 and removing the capping insulating layer from the first and second trenches T1 and T2 and exposing the side surfaces of the interlayer insulating layers ILD. The capping insulating layer is etched by an isotropic etching process that has an etch selectivity with respect to the interlayer insulating layers ILD and the second preliminary channel patterns 11. The gate insulating layer on the side surfaces of the interlayer insulating layers ILD is partially etched during the formation of the spacer insulating patterns SS.

After forming the spacer insulating patterns SS, an isotropic etching process is performed on the second preliminary channel patterns 11 exposed by the first and second trenches T1 and T2. Accordingly, vertically-separated first and second channel patterns CHP1 and CHP2 are formed in each of the third horizontal regions HR3.

After the formation of the first and second channel patterns CHP1 and CHP2, a gas-phase doping (GPD) process or a plasma doping (PLAD) process is performed through the first and second trenches Ti and T2 that dopes portions of the first and second channel patterns CHP1 and CHP2 with impurities. Accordingly, the first and second source and drain regions (SR1, SR2, DR1, and DR2 shown in FIG. 4) are formed in opposite end portions of the first and second channel patterns CHP1 and CHP2.

Figure 25A:
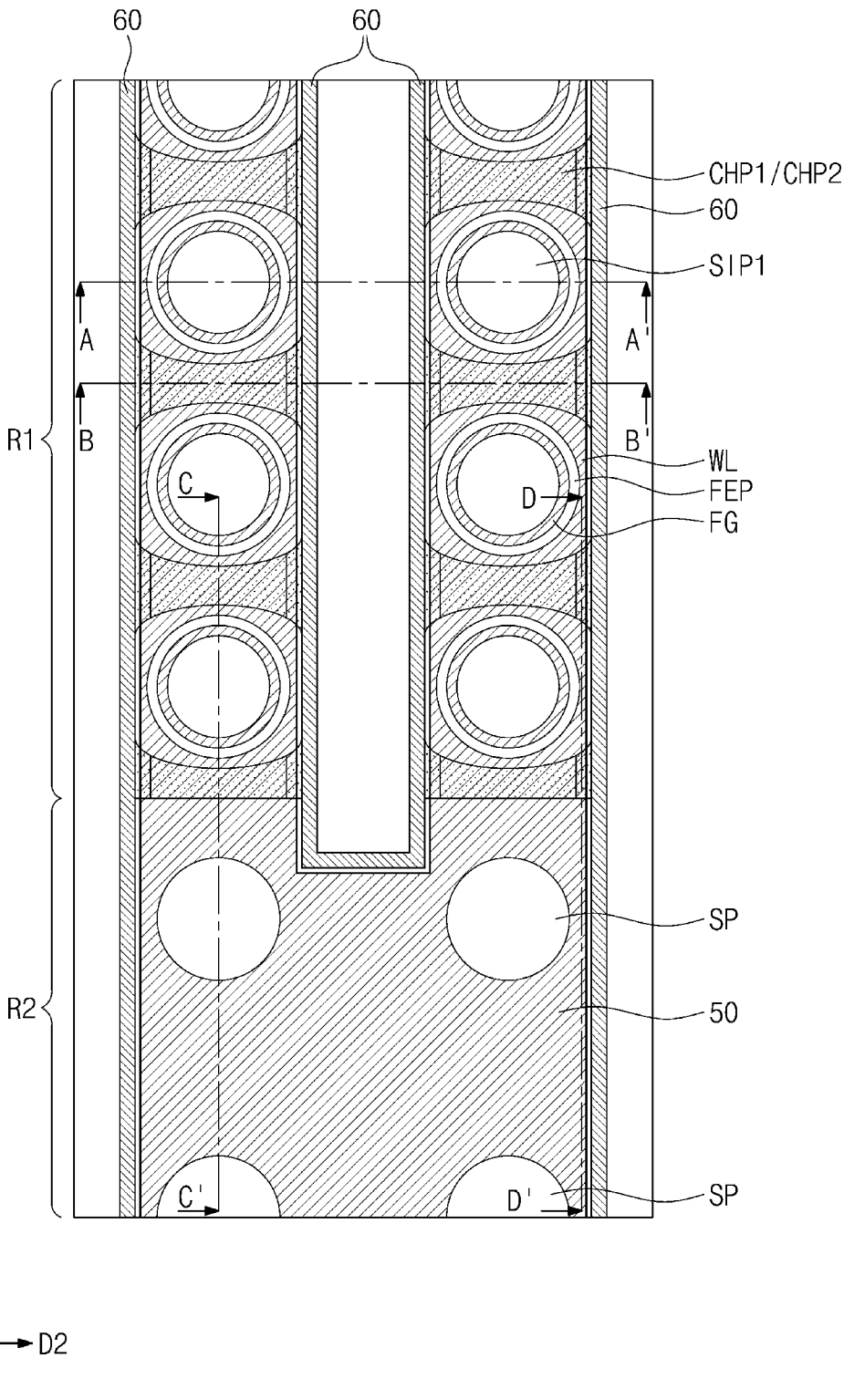
Figure 25B:
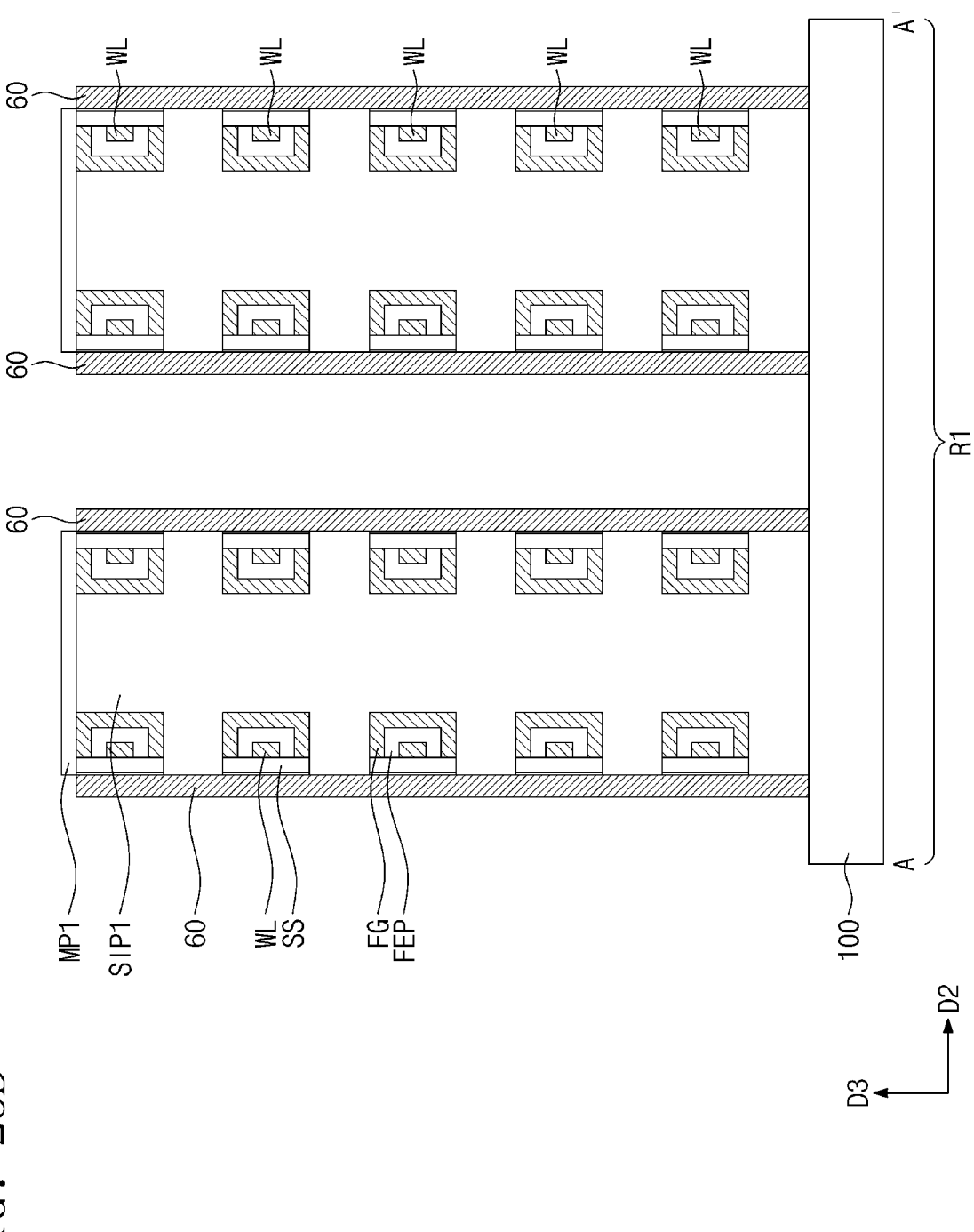
Figure 25C:
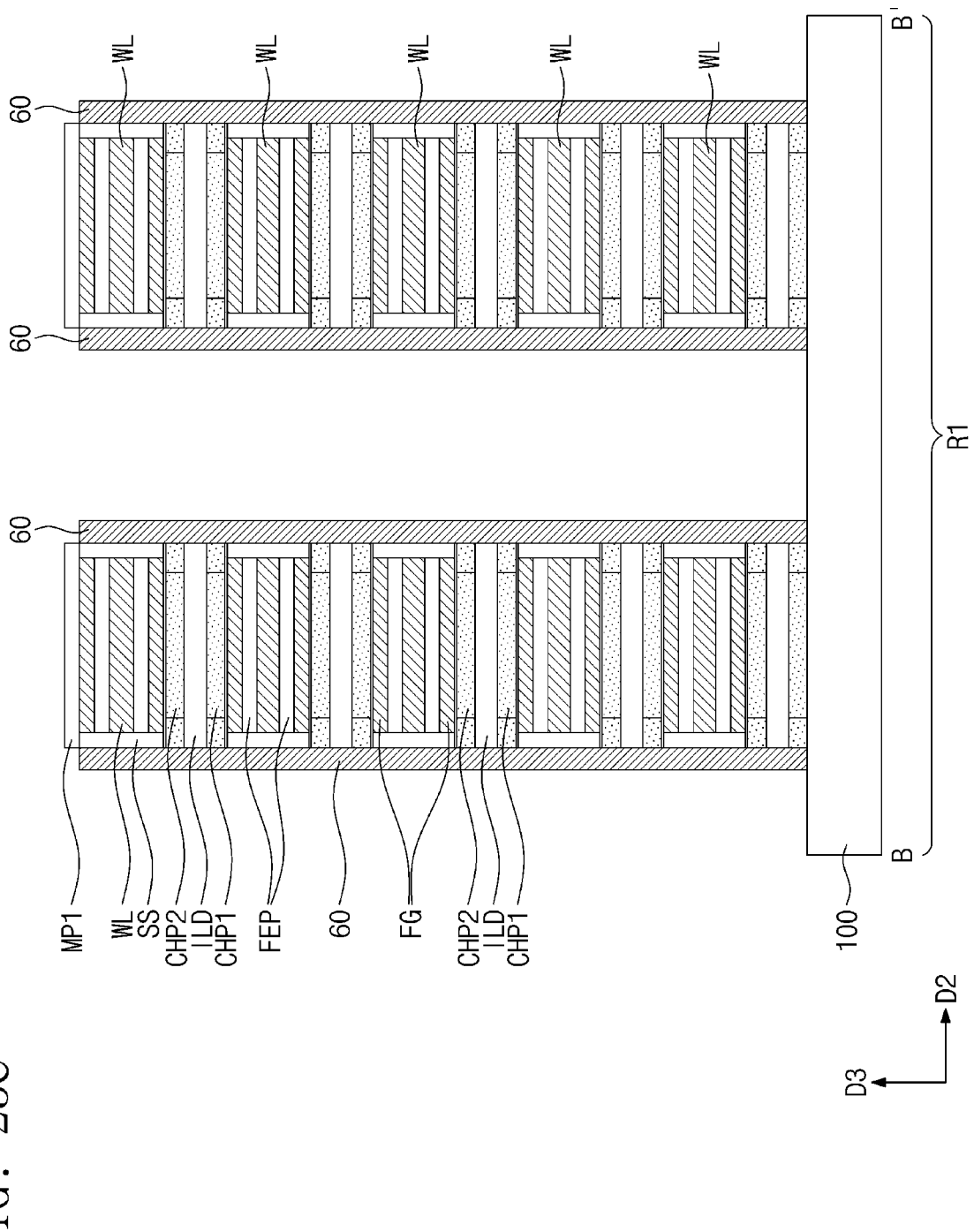

Referring to FIGS. 25A, 25B, and 25C, in an embodiment, line conductive patterns 60 are formed on opposite side surfaces of the first and second trenches T1 and T2. The line conductive patterns 60 are formed by depositing a line conductive layer that conformally covers inner surfaces of the first and second trenches T1 and T2 and performing an etch-back process.

The line conductive patterns 60 extend in the first direction D1 and cover side surfaces of the first and second channel patterns CHP1 and CHP2 and side surfaces of the spacer insulating patterns SS. The line conductive patterns 60 are formed of or include at least one of doped silicon, a metal, a metal nitride, or a metal silicide.

Figure 26A:
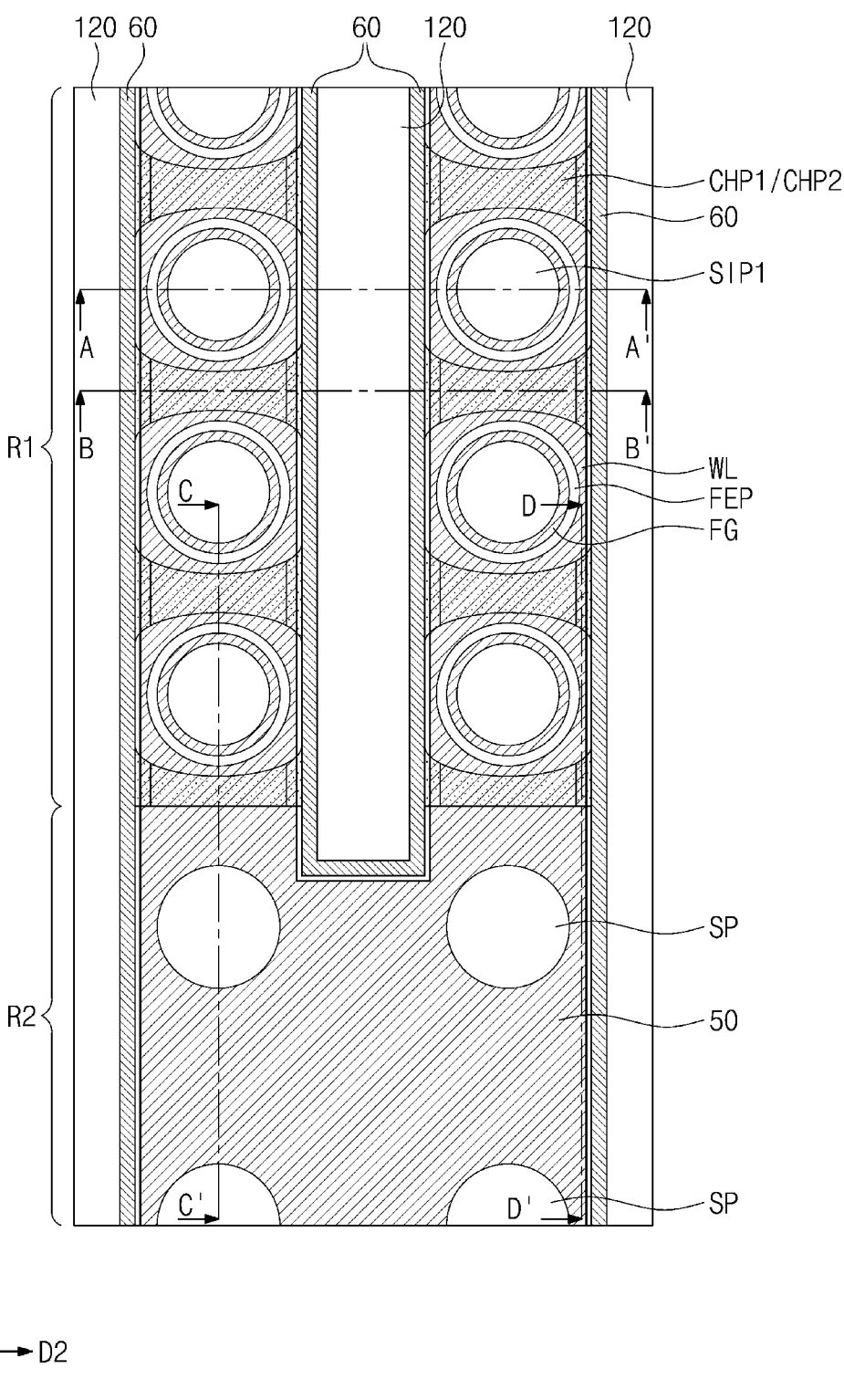
Figure 26B:
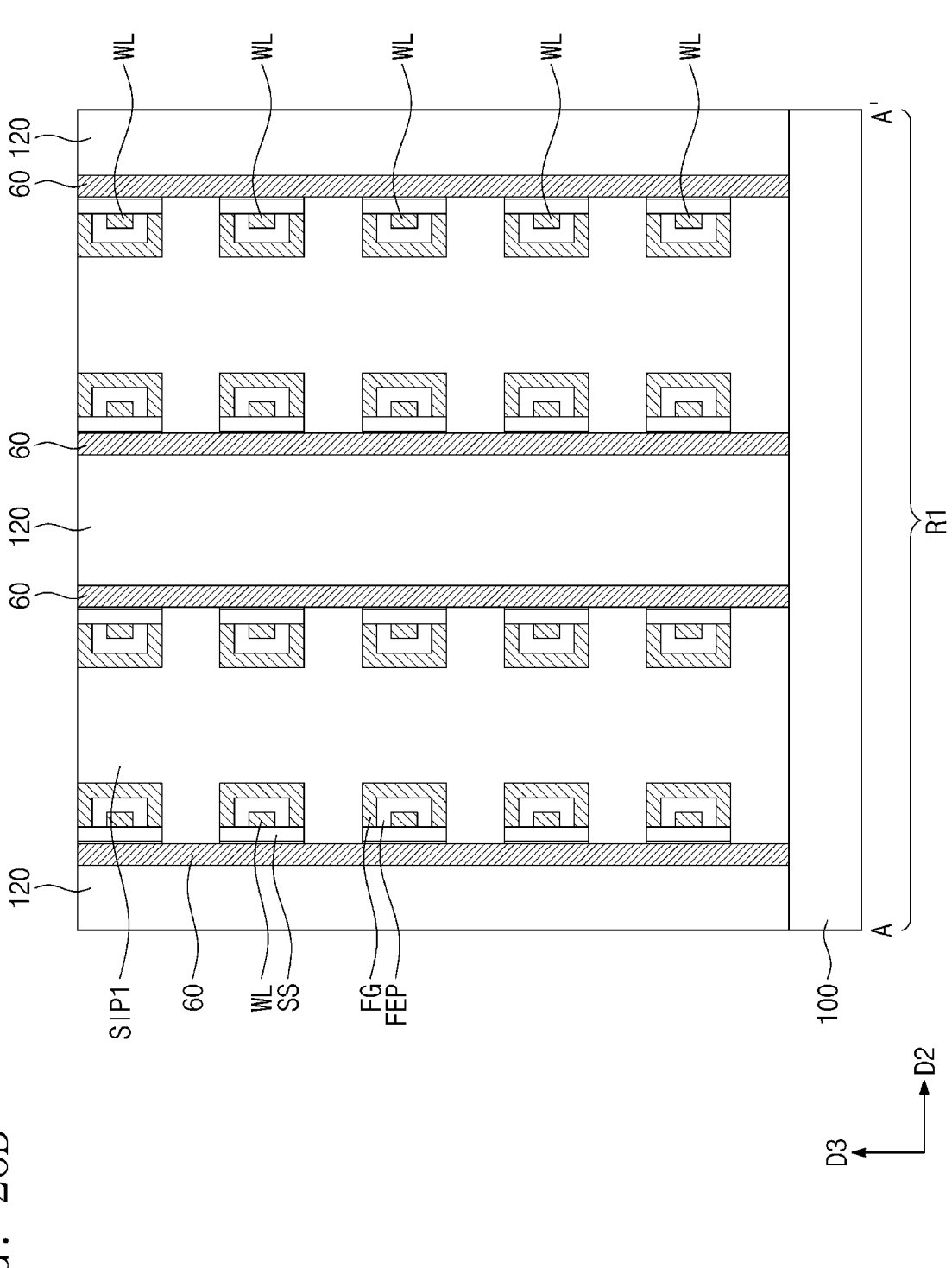
Figure 26C:
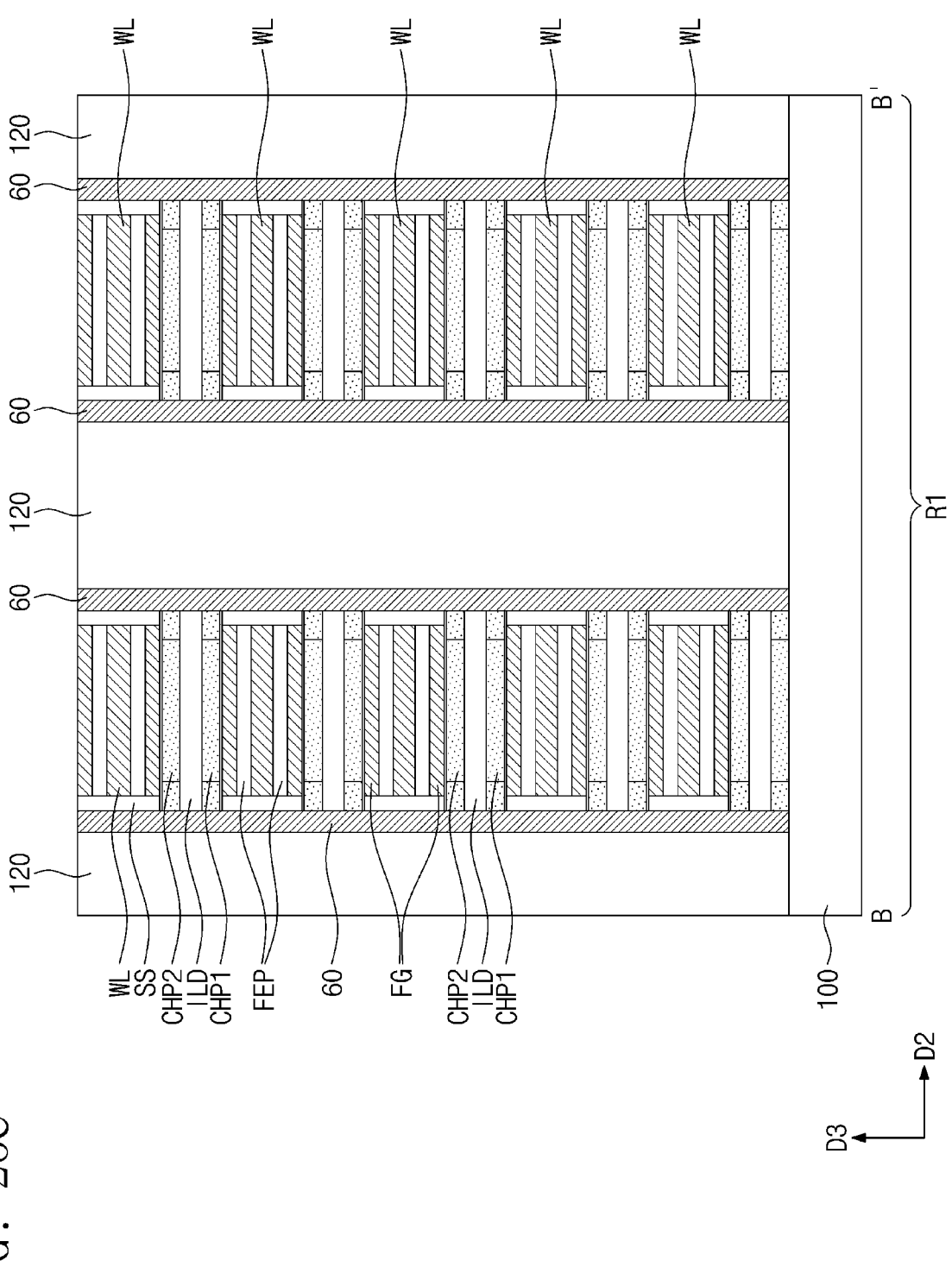

Referring to FIGS. 26A, 26B, and 26C, in an embodiment, the separation insulating patterns 120 is formed in the first and second trenches Ti and T2. The separation insulating patterns 120 are formed by depositing an insulating material that fills the first and second trenches Ti and T2 and performing a planarization process that exposes top surfaces of the line conductive patterns 60.

The separation insulating patterns 120 extend in the first direction D1 on the substrate 100. The separation insulating patterns 120 are formed of or include at least one of an insulating material that is formed by a spin-on-glass (SOG) technique, a silicon oxide, or a silicon oxynitride.

Figure 27A:
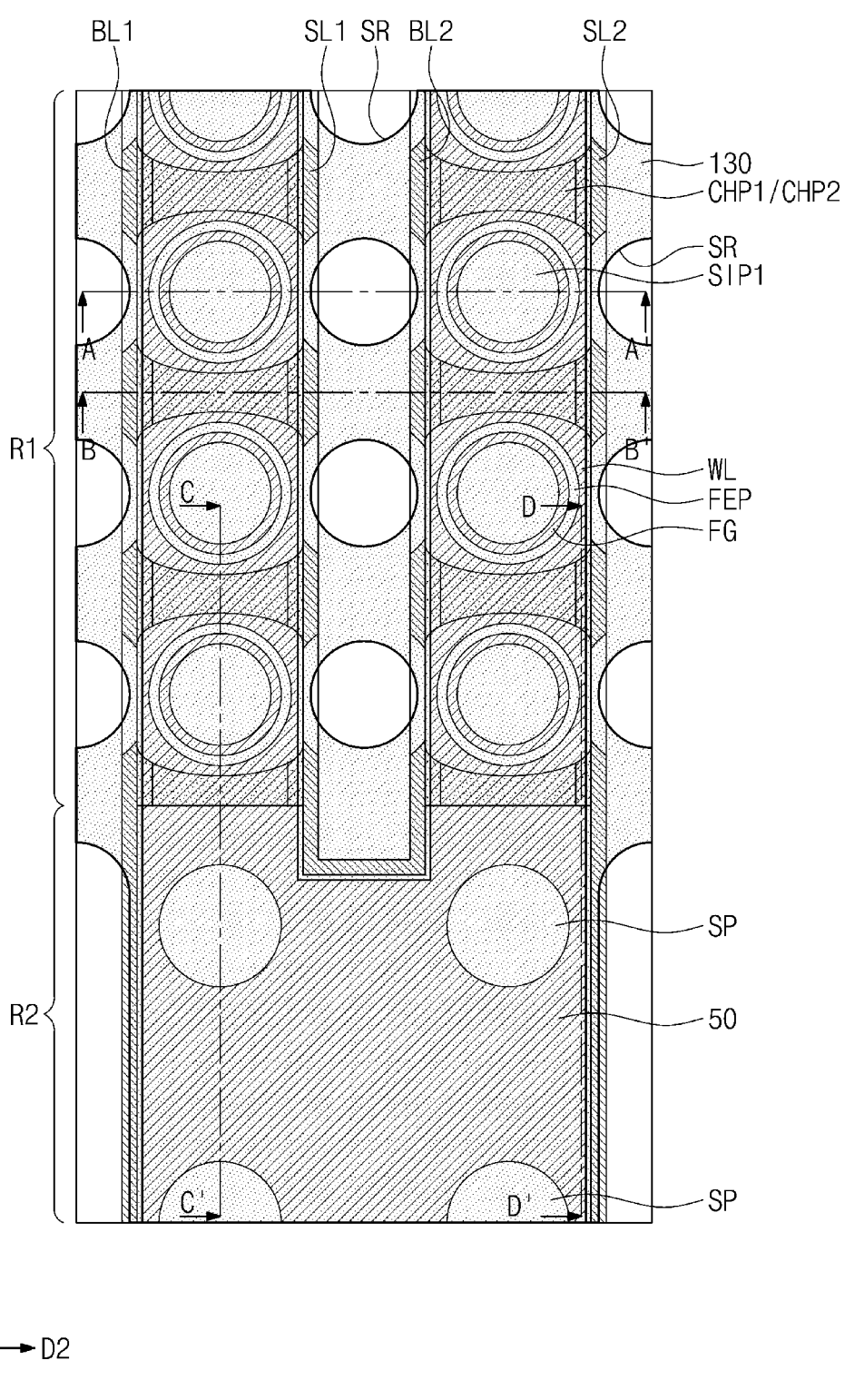
Figure 27B:
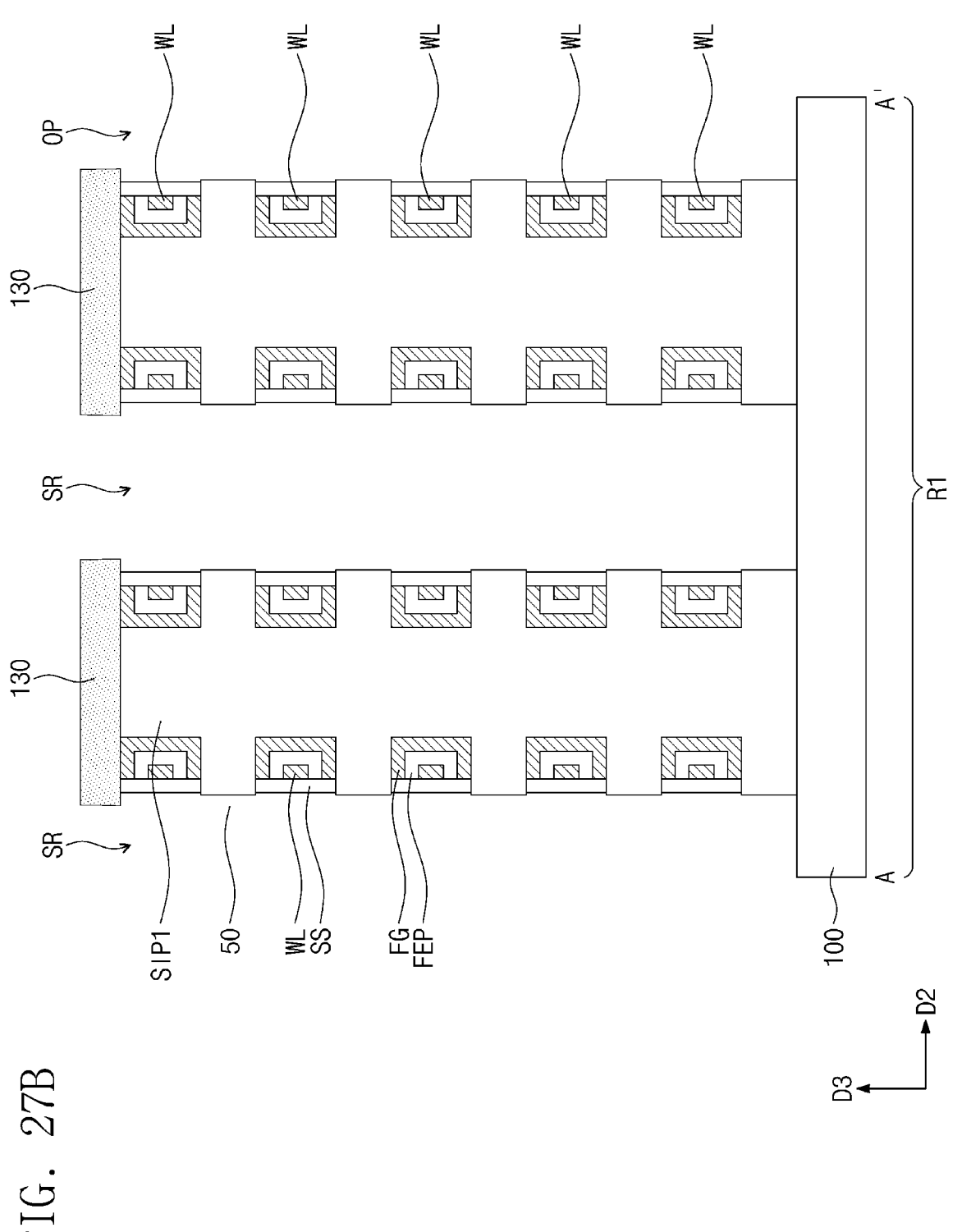
Figure 27C:
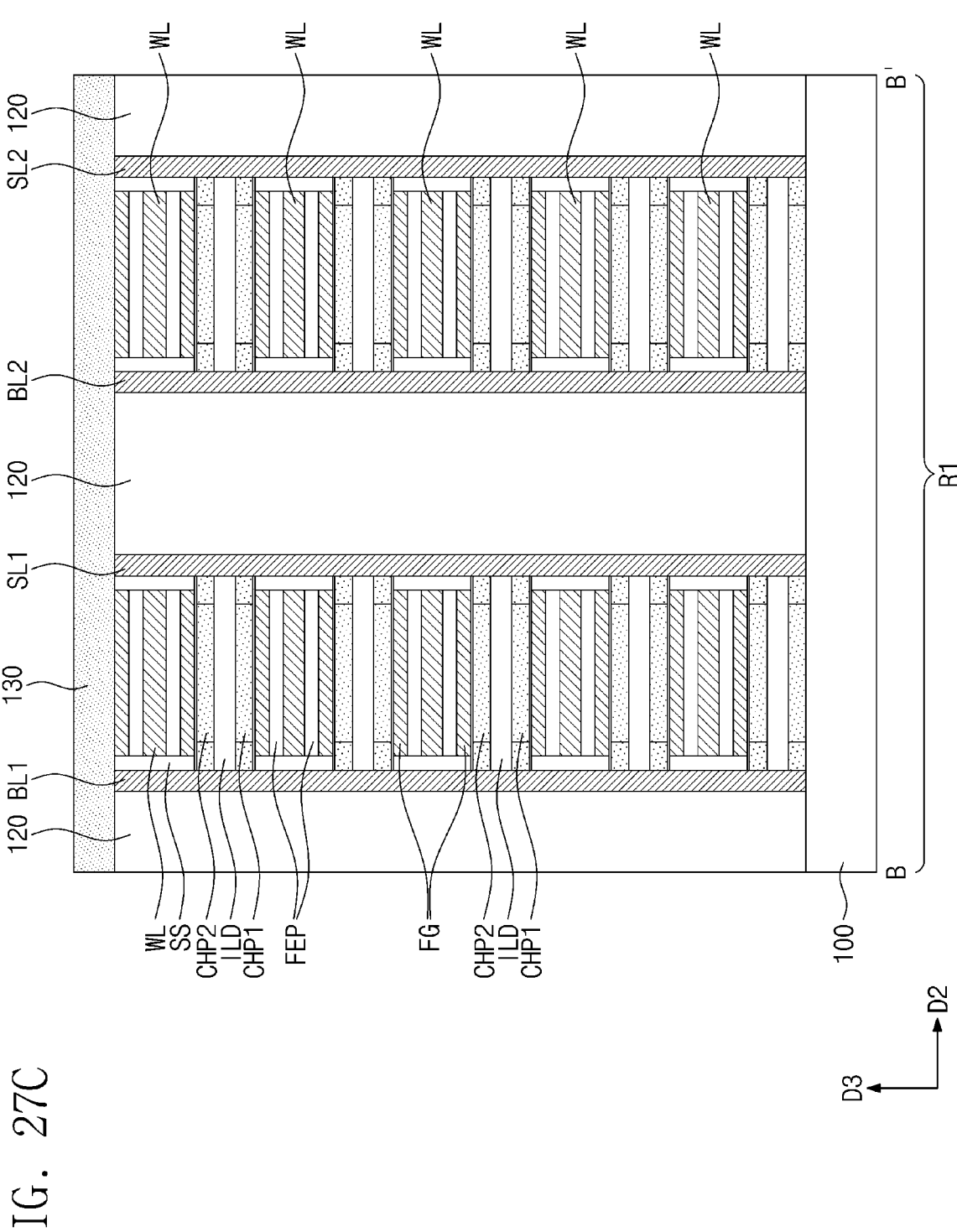

Referring to FIGS. 27A, 27B, and 27C, in an embodiment, the hard mask layer 130 is formed on the separation insulating patterns 120 and the line conductive patterns 60. The hard mask layer 130 is formed of an insulating material that has an etch selectivity with respect to the separation insulating patterns 120.

The hard mask layer 130 and the separation insulating patterns 120 are patterned to form separation regions SR that expose the substrate 100. The separation regions SR are spaced apart from each other in the first direction D1 and are formed between first vertical insulating pillars SIP1 that are adjacent in the second direction D2. The separation regions SR expose portions of a side surface of each line conductive pattern 60.

The bit lines BL and the source lines SL are formed by etching the line conductive patterns 60 exposed by the separation regions SR.

Referring to FIGS. 3A, 3B, 3C, 3D, and 3E, in an embodiment, the second separation insulating pillars SIP2 are respectively formed in the separation regions SR. The second separation insulating pillars SIP2 are formed by forming an insulating layer that fills the separation regions SR and planarizing the insulating layer and exposing the top surface of the hard mask layer 130.

According to an embodiment of the inventive concept, unit memory cells that are composed of ferroelectric field effect transistor are three-dimensionally arranged to realize a three-dimensional semiconductor memory device with nonvolatile characteristics and fast operation. Accordingly, a semiconductor memory device with a high integration density and improved electric characteristics is provided.

Each of the unit memory cells includes first and second channel patterns disposed on top and bottom surfaces of a word line. Thus, coupling noise between vertically-adjacent ones of the word lines, which occurs when the unit memory cells are vertically stacked on a substrate, can be reduced.

Furthermore, a process of fabricating a semiconductor memory device uses two different mold layers that have an etch selectivity with respect to each other to form the channel patterns and the word lines, which reduces a height or vertical thickness of a mold structure. Accordingly, technical challenges in a process of fabricating the semiconductor memory device can be mitigated and to a height or vertical thickness of the semiconductor memory device can be reduced.

While embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
   a first channel pattern and a second channel pattern stacked on a substrate;
   a word line disposed between the first and second channel patterns and that extends in a first direction parallel to a top surface of the substrate;
   a data storage pattern disposed between a top surface of the word line and the first channel pattern and between a bottom surface of the word line and the second channel pattern;

a bit line that extends in a second direction perpendicular to the top surface of the substrate and that is connected to first end portions of the first and second channel patterns; and
   a source line that extends in the second direction and is connected to second end portions of the first and second channel patterns.

2. The semiconductor memory device of claim 1, wherein the data storage pattern comprises a ferroelectric material.

3. The semiconductor memory device of claim 1, further comprising:
   a floating gate pattern disposed between the data storage pattern and a bottom surface of the first channel pattern and between the data storage pattern and a top surface of the second channel pattern; and
   a gate insulating layer disposed between the floating gate pattern and the bottom surface of the first channel pattern and between the floating gate pattern and the top surface of the second channel pattern.

4. The semiconductor memory device of claim 1, wherein each of the first and second channel patterns has a long axis in a third direction that is parallel to the top surface of the substrate and crosses the first direction, and
   a width in the third direction of the word line is less than a length in the third direction of the first and second channel patterns.

5. The semiconductor memory device of claim 1, wherein the first and second channel patterns comprise at least one of a polycrystalline semiconductor material, an oxide semiconductor material, or a 2D material.

6. The semiconductor memory device of claim 1, further comprising a first vertical insulating pillar that is spaced apart from the first and second channel patterns in the first direction and extends in the second direction,
   wherein the word line encloses the first vertical insulating pillar.

7. The semiconductor memory device of claim 6, wherein the first vertical insulating pillar comprises a vertical portion that extends in the second direction, and horizontal portions that laterally protrude from the vertical portion, and
   the word line is located between vertically adjacent horizontal portions and encloses the vertical portion.

8. The semiconductor memory device of claim 1, further comprising interlayer insulating patterns stacked on the substrate, wherein
   a first interlayer insulating pattern covers a top surface of the first channel pattern, and
   a second interlayer insulating pattern covers a bottom surface of the second channel pattern.

9. A semiconductor memory device, comprising:
   electrode structures that extend in a first direction parallel to a top surface of a substrate and are that spaced apart from each other in a second direction that crosses the first direction, wherein each of the electrode structures includes word lines that are vertically stacked on the substrate;
   interlayer insulating patterns that are spaced apart from each other in the first direction and that are disposed in regions between vertically-adjacent word lines;
   first channel patterns that are respectively disposed between the interlayer insulating patterns and top surfaces of the word lines;
   second channel patterns that are respectively disposed between the interlayer insulating patterns and bottom surfaces of the word lines;
   data storage patterns disposed between the first and second channel patterns and the word lines;

bit lines disposed at a first side of each of the electrode structures and that are spaced apart from each other in the first direction, wherein each bit line is connected to first end portions of the first and second channel patterns; and source lines disposed at a second side of each of the electrode structures and that are spaced apart from each other in the first direction, wherein each source line is connected to second end portions of the first and second channel patterns.

10. The semiconductor memory device of claim 9, wherein the data storage patterns extend in the first direction and cover the top and bottom surfaces of the word lines.

11. The semiconductor memory device of claim 9, further comprising:

first vertical insulating pillars that are spaced apart from the first and second channel patterns in the first direction and that penetrate each of the electrode structures; and second vertical insulating pillars that are disposed at each side of the word lines, wherein the second vertical insulating pillars are spaced apart from each other in the first direction and extend in the second direction.

12. The semiconductor memory device of claim 11, wherein each of the first vertical insulating pillars comprises a vertical portion perpendicular to the top surface of the substrate and horizontal portions that laterally protrude from the vertical portion, and each of the horizontal portions is disposed between first and second channel patterns that are adjacent to each other in the first direction.

13. The semiconductor memory device of claim 12, wherein each of the word lines encloses the first vertical insulating pillars.

14. The semiconductor memory device of claim 12, wherein each of the data storage patterns comprises line portions that cover the top and bottom surfaces of each word line, and a sidewall portion disposed between a side surface of each word line and the vertical portion of the first vertical insulating pillar, wherein the sidewall portion connects the line portions to each other.

15. The semiconductor memory device of claim 9, further comprising:

floating gate patterns disposed between the data storage patterns and bottom surfaces of the first channel patterns and between the data storage patterns and top surfaces of the second channel patterns; and a gate insulating layer disposed between the floating gate patterns and the bottom surfaces of the first channel patterns and between the floating gate patterns and the top surface of the second channel patterns.

16. The semiconductor memory device of claim 15, wherein the floating gate patterns extend in the first direction.

17. A semiconductor memory device, comprising:

a substrate that includes a first region and a second region;

first and second channel patterns that are vertically and alternately stacked on the first region of the substrate, wherein the first channel patterns are spaced apart from each other in a first direction parallel to a top surface of the substrate and the second channel patterns are spaced apart from each other in the first direction;

word lines disposed between adjacent first and second channel patterns and that extend in the first direction;

data storage patterns disposed between the word lines and bottom surfaces of the first channel patterns and between the word lines and top surfaces of the second channel patterns;

first vertical insulating pillars that are spaced apart from the first and second channel patterns in the first direction and that penetrate the word lines;

bit lines that are spaced apart from each other in the first direction and are connected to first end portions of the first and second channel patterns;

source lines that are spaced apart from each other in the first direction and are connected to second end portions of the first and second channel patterns; and second vertical insulating pillars disposed at each side of the word lines, wherein the second vertical insulating pillars are spaced apart from each other in the first direction and extend in the second direction, wherein each of the word lines comprises a pad portion in the second region, and the pad portions of the word lines are stacked and form a staircase structure in the second region.

18. The semiconductor memory device of claim 17, wherein the data storage pattern comprises a ferroelectric material.

19. The semiconductor memory device of claim 17, further comprising:

a floating gate pattern disposed between the data storage pattern and the bottom surface of the first channel pattern and between the data storage pattern and the top surface of the second channel pattern; and a gate insulating layer disposed between the floating gate pattern and the bottom surface of the first channel pattern and between the floating gate pattern and the top surface of the second channel pattern.

20. The semiconductor memory device of claim 17, wherein, between the first vertical insulating pillars that are adjacent to each other in the first direction, each of the data storage patterns encloses a portion of each of the word lines.

* * * * *